(12) United States Patent
Itagaki et al.

(10) Patent No.: US 9,548,606 B2
(45) Date of Patent: Jan. 17, 2017

(54) CONTROL SYSTEM, TRANSFORMER, PROTECTION CONTROL APPARATUS, AND BIT STREAM STORAGE UNIT

(75) Inventors: Daiju Itagaki, Tokorozawa (JP); Shogo Miura, Tokyo (JP); Katsuhiko Sekiguchi, Tama (JP); Satoshi Hirano, Nagoya (JP)

(73) Assignees: KABUSHIKI KAISHA TOSHIBA, Tokyo (JP); NATIONAL UNIVERSITY CORPORATION NAGOYA INSTITUTE OF TECHNOLOGY, Nagoya-Shi, Aichi (JP)

( * ) Notice: Subject to any disclaimer, the term of this patent is extended or adjusted under 35 U.S.C. 154(b) by 1073 days.

(21) Appl. No.: 13/610,447

(22) Filed: Sep. 11, 2012

(65) Prior Publication Data
US 2013/0006433 A1 Jan. 3, 2013

Related U.S. Application Data

(63) Continuation of application No. PCT/JP2011/055818, filed on Mar. 11, 2011.

(30) Foreign Application Priority Data

Mar. 12, 2010 (JP) ................................. 2010-055376

(51) Int. Cl.
G06F 1/28 (2006.01)
H02H 7/26 (2006.01)
H02H 3/02 (2006.01)
H02H 1/00 (2006.01)
H03M 3/00 (2006.01)

(52) U.S. Cl.
CPC ............... *H02H 7/26* (2013.01); *H02H 3/02* (2013.01); *H02H 1/0092* (2013.01); *H03M 3/43* (2013.01); *H03M 3/462* (2013.01)

(58) Field of Classification Search
None
See application file for complete search history.

(56) References Cited

U.S. PATENT DOCUMENTS

| 5,345,409 A * | 9/1994 | McGrath ............. G01R 21/133 |
| | | 702/190 |
| 5,930,745 A | 7/1999 | Swift |
| 2008/0256157 A1 | 10/2008 | Bostaman et al. |

FOREIGN PATENT DOCUMENTS

| CN | 1140001 A | 1/1997 |
| CN | 101197800 A | 6/2008 |

(Continued)

OTHER PUBLICATIONS

Japanese Office Action dated Dec. 17, 2013 (and English translation thereof) in counterpart Japanese Application No. 2012-504545.

(Continued)

*Primary Examiner* — Carlos Ortiz Rodriguez
(74) *Attorney, Agent, or Firm* — Holtz, Holtz & Volek PC

(57) ABSTRACT

According to one embodiment, the A/D conversion unit includes a ΔΣ modulating device which samples the analog electric quantity provided by the electric power system with a predetermined modulation frequency and outputs a bit stream changing over time of single bit obtained by performing ΔΣ modulation, and the digital operation processing unit includes one or more digital filters which inputs the bit stream from the ΔΣ modulating device and of which frequency characteristics differ according to a type of protection control operation, and one or more operation processing elements which perform different kinds of protection control operation processing, based on the bit stream provided by the digital filter.

26 Claims, 38 Drawing Sheets

(56) References Cited

FOREIGN PATENT DOCUMENTS

| | | |
|---|---|---|
| EP | 1099951 A2 | 5/2001 |
| JP | 4-197019 A | 7/1992 |
| JP | 2000-307384 A | 11/2000 |
| JP | 2001-223589 A | 8/2001 |
| JP | 2002-345172 A | 11/2002 |
| JP | 2005-109599 A | 4/2005 |
| JP | 4110747 B2 | 7/2008 |

OTHER PUBLICATIONS

Chinese Office Action (and English translation thereof) dated Jan. 12, 2016, issued in counterpart Chinese Application No. 201180005086.1.

Partial Supplementary European Search Report dated Jan. 29, 2016, issued in counterpart European Application No. 11753491.7.

International Preliminary Report on Patentability (IPRP) dated Nov. 1, 2012 (in English) issued in International Application No. PCT/JP2011/055818.

Akira Yukawa: "Oversampling A-D Henkan Gijutsu", Nikkei Business Publications, Inc., Dec. 1990: pp. 33, 101 to 104, 108.

International Search Report (ISR) dated Jun. 7, 2011 (and English translation thereof) issued in parent International Application No. PCT/JP2011/055818.

"Chinese Office Action dated Mar. 3, 2014 in counterpart Chinese Application No. 201180005086.1".

Extended European Search Report dated May 18, 2016, issued in counterpart European Application No. 11753491.7.

Chinese Office Action (and English translation thereof) dated Sep. 21, 2016, issued in counterpart Chinese Application No. 2011800050861.

* cited by examiner

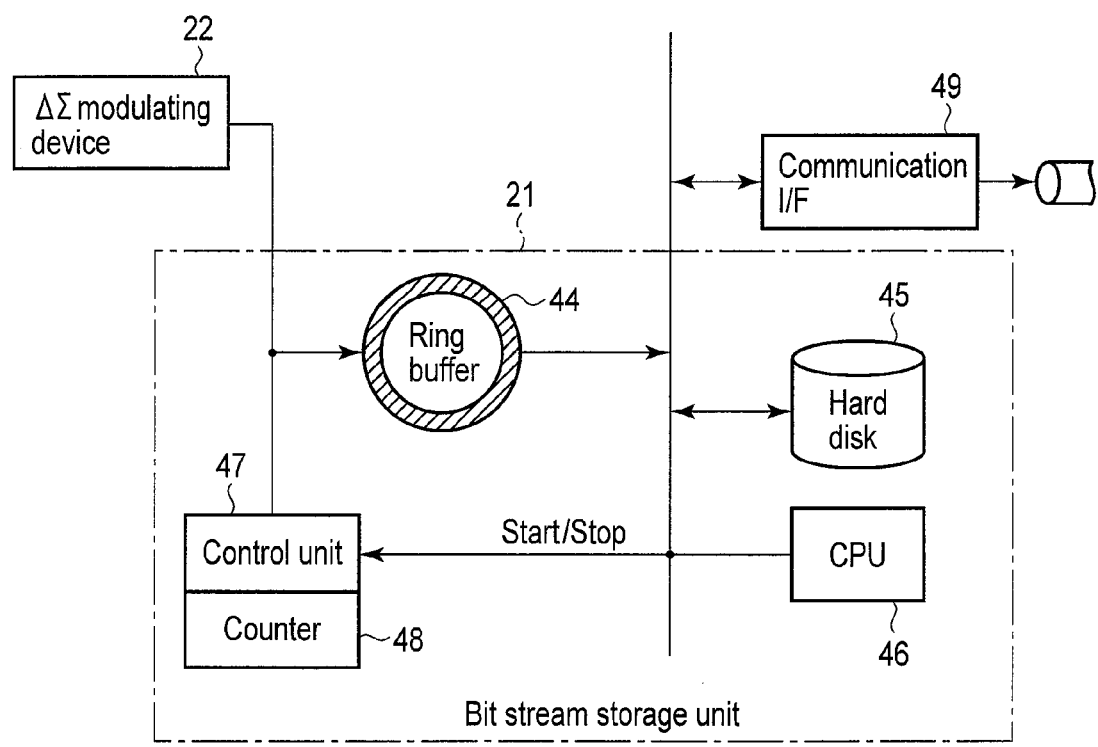
F I G. 2

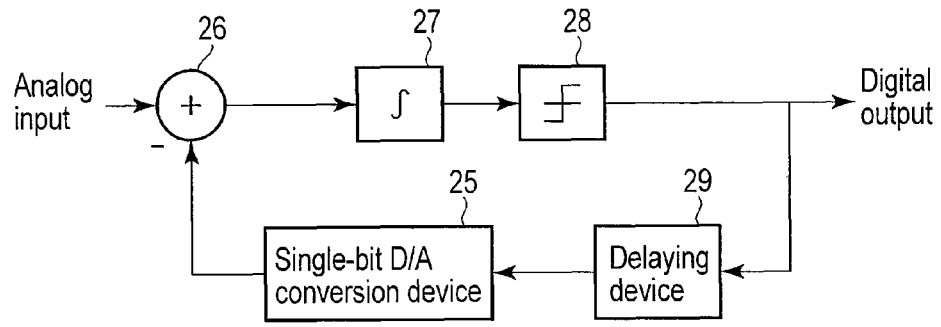
F I G. 4 A
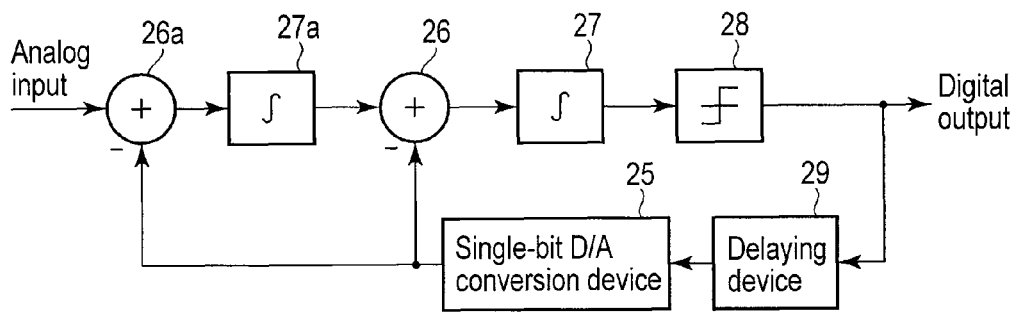
F I G. 4 B
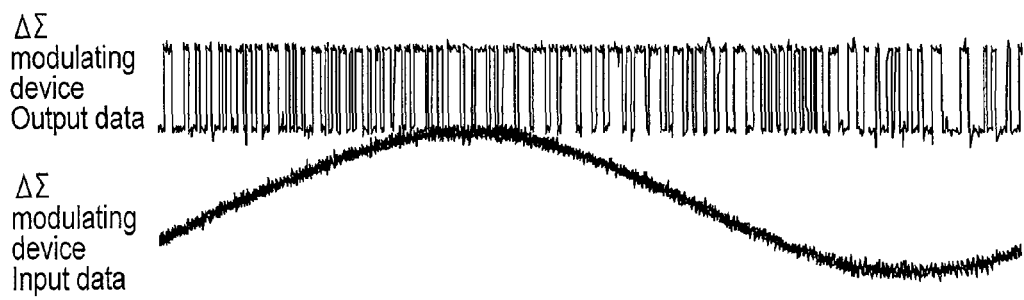
F I G. 5

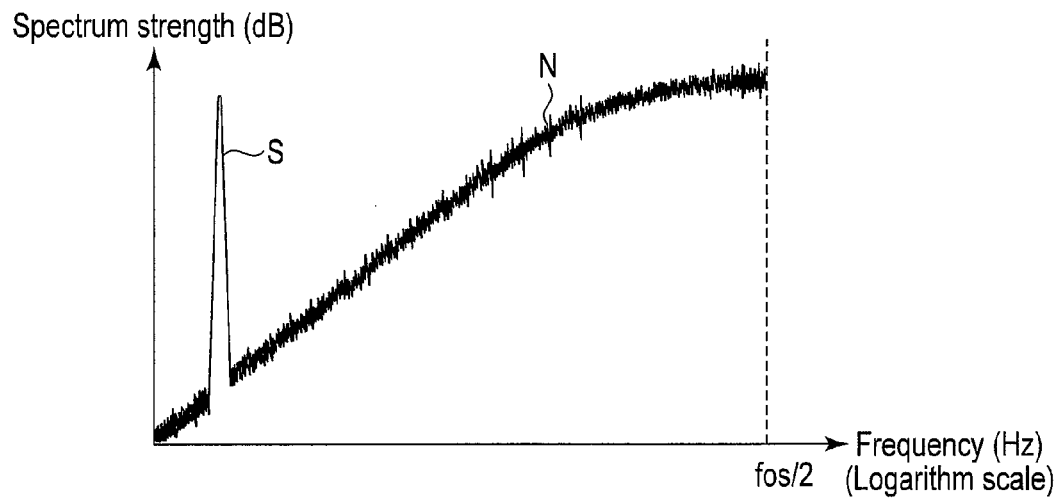
F I G. 6
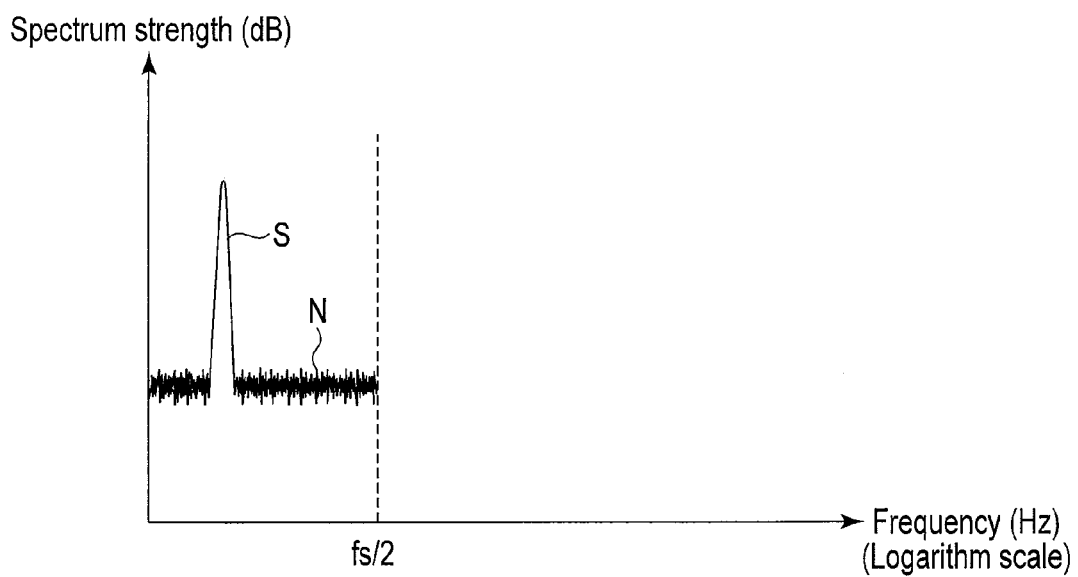
F I G. 7

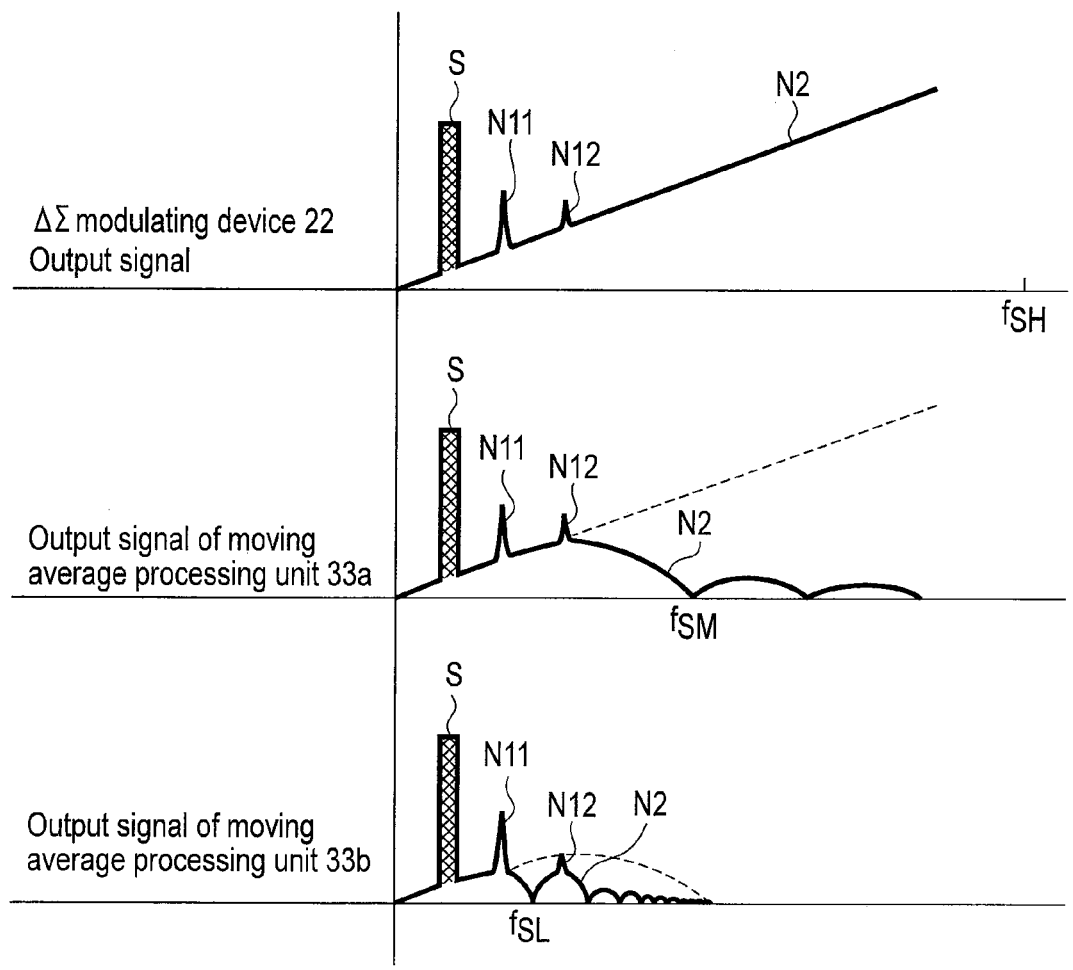
F I G. 14

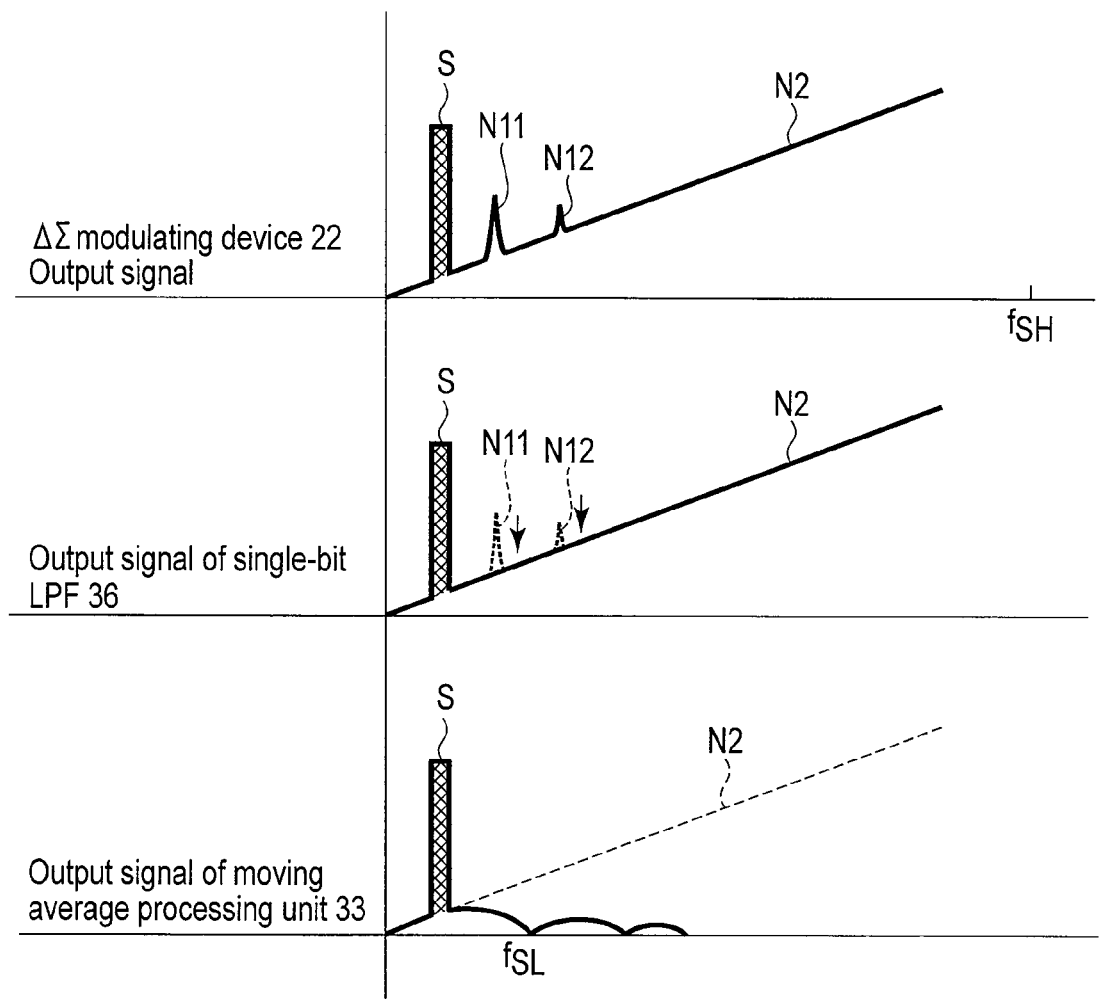
F I G. 2 1

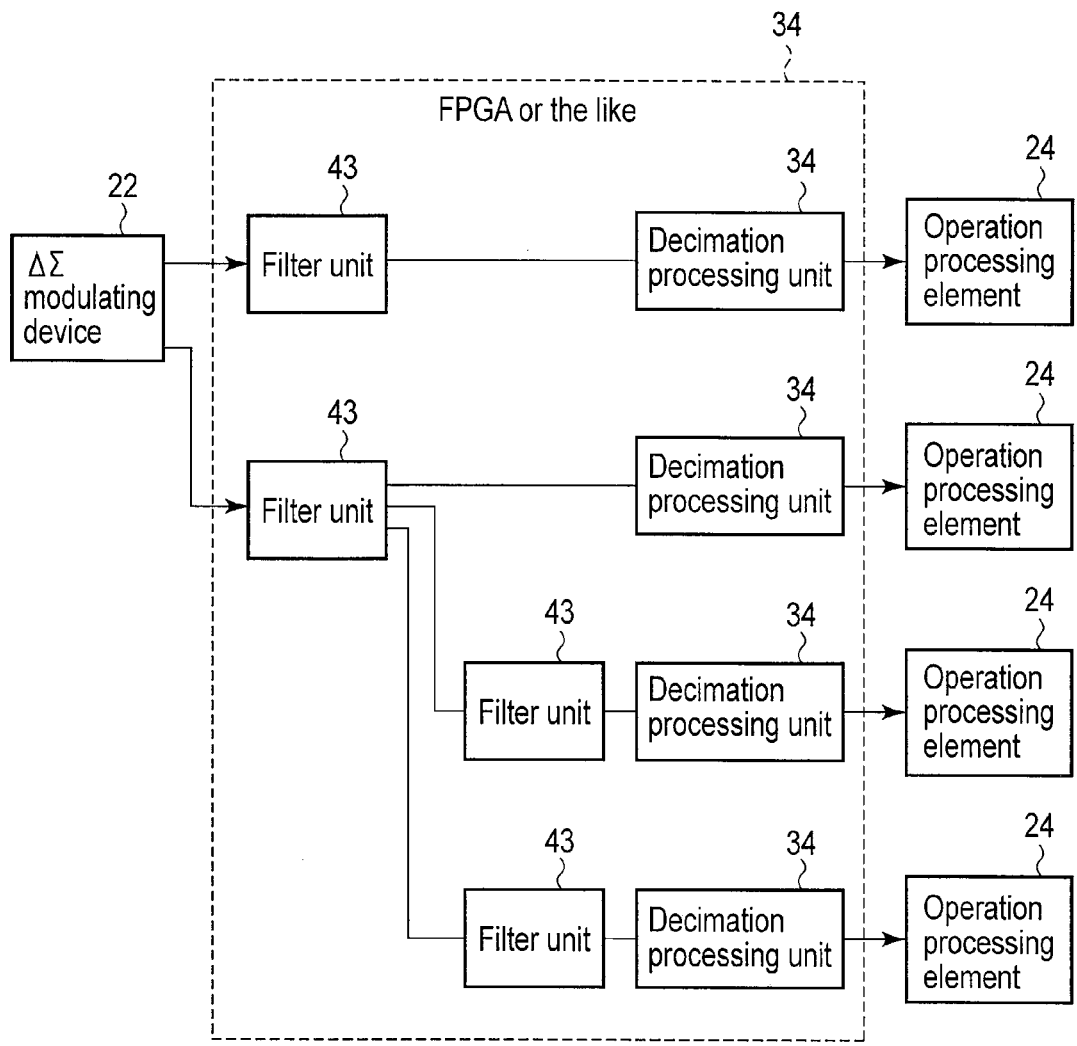
F I G. 2 2

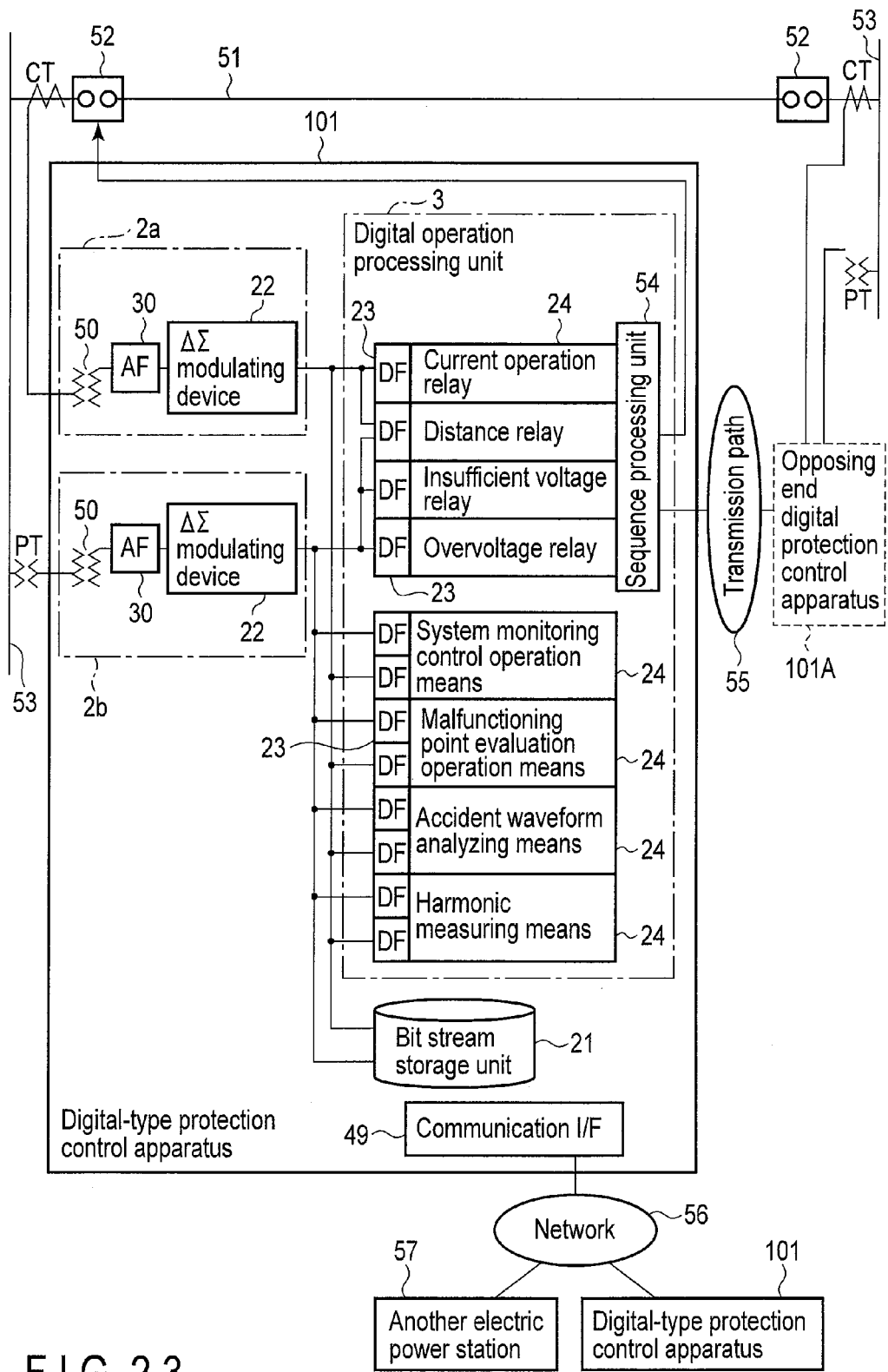
F I G. 23

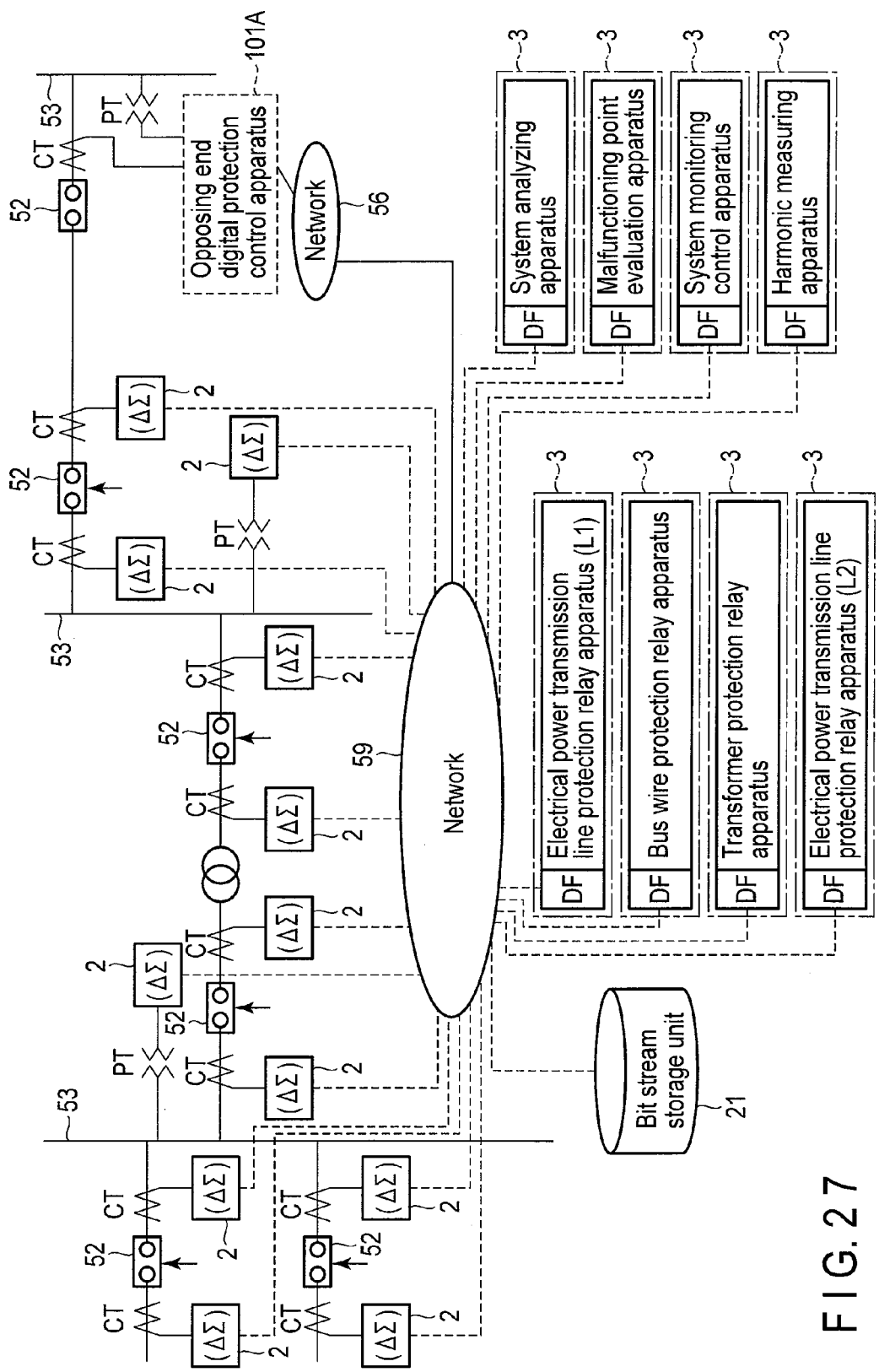
F I G. 27

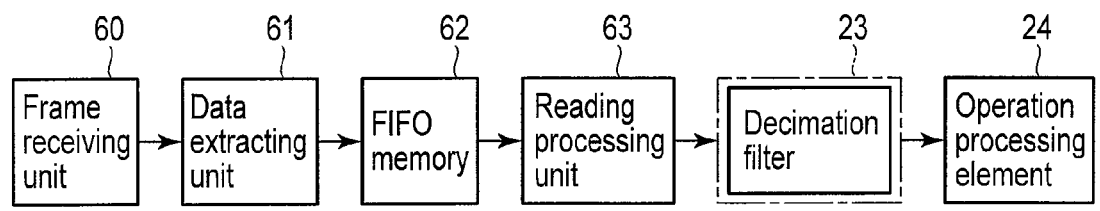
F I G. 31
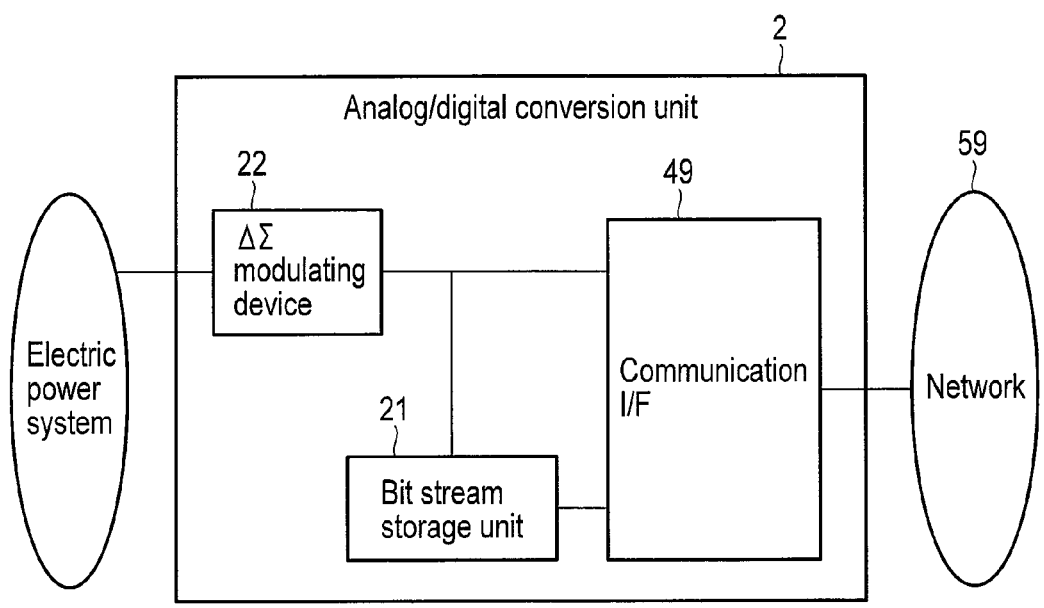
F I G. 32

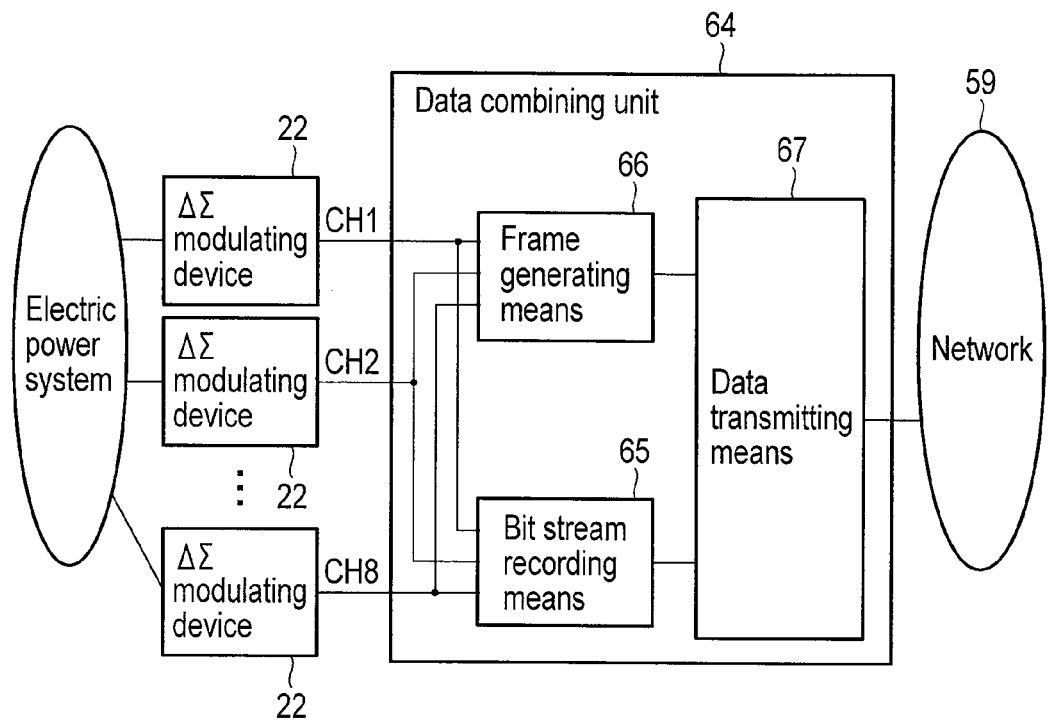
F I G. 3 4
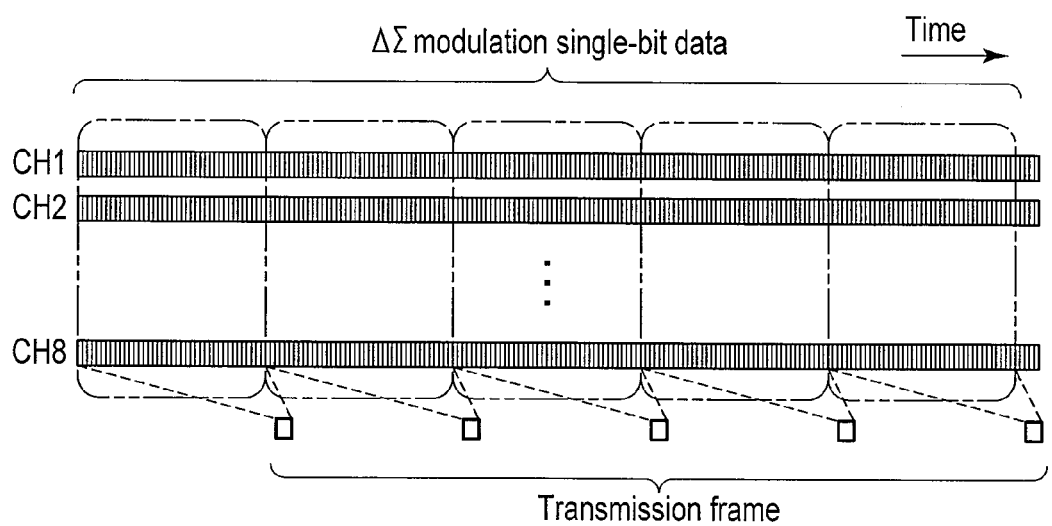
F I G. 3 5

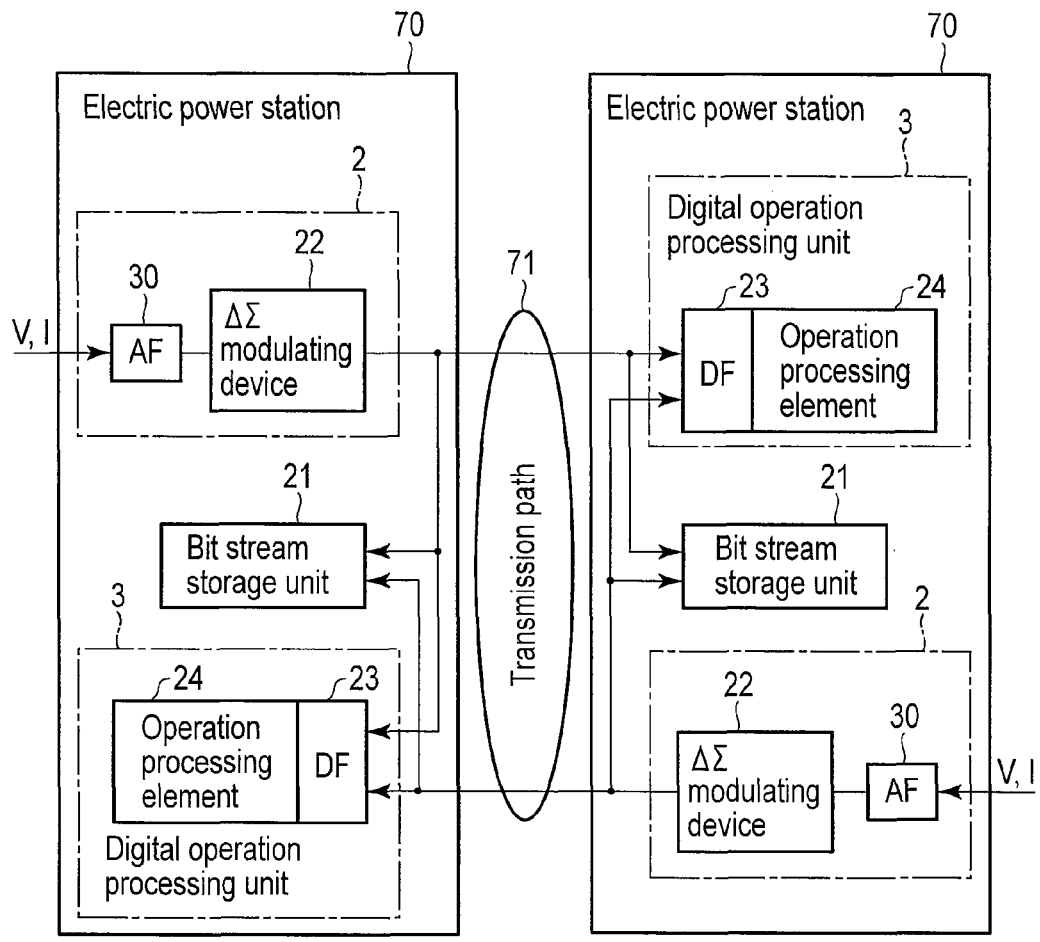
F I G. 39
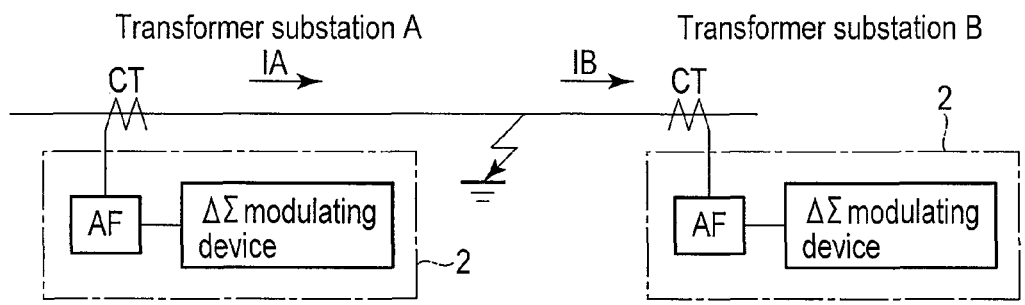
F I G. 40

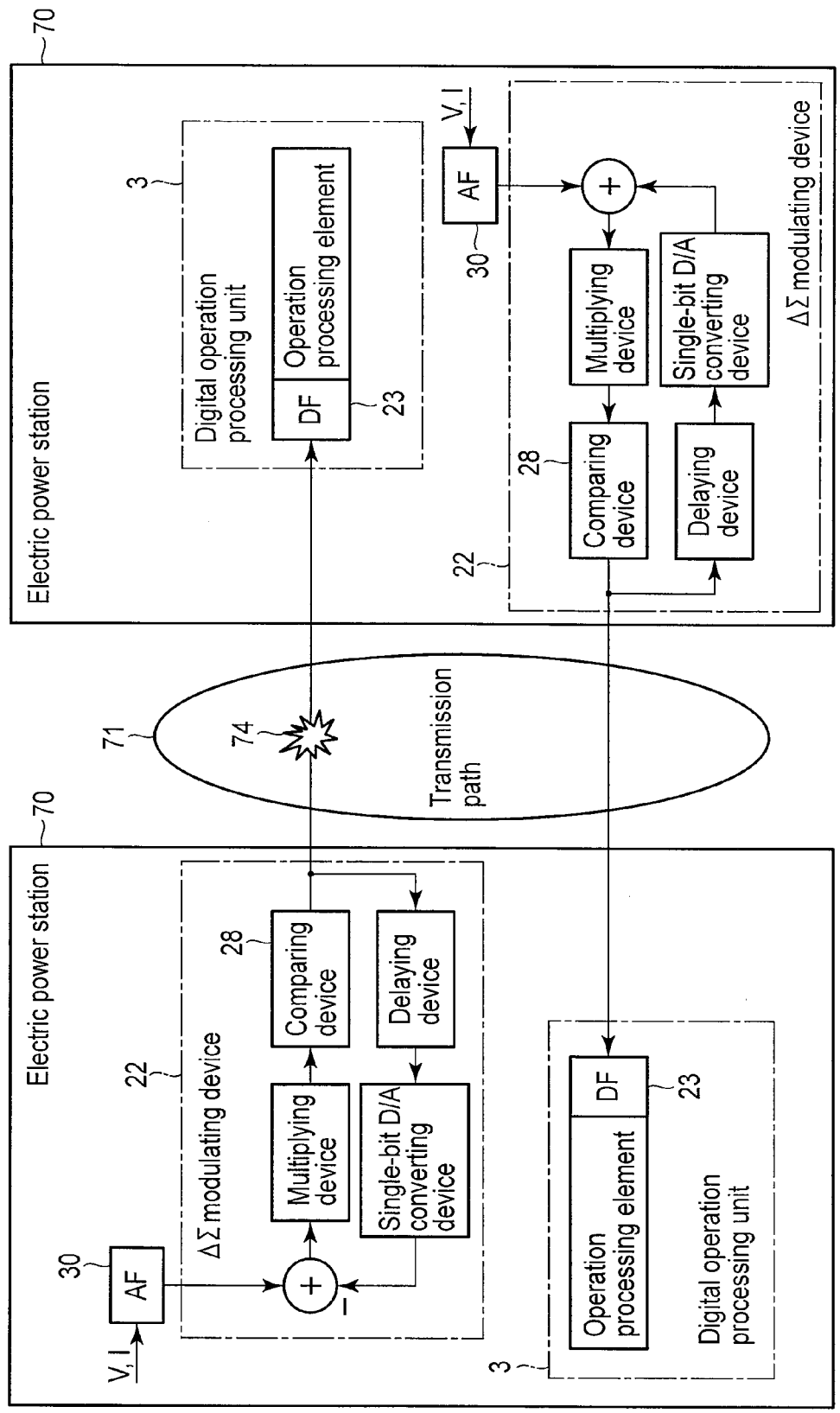
F I G. 44

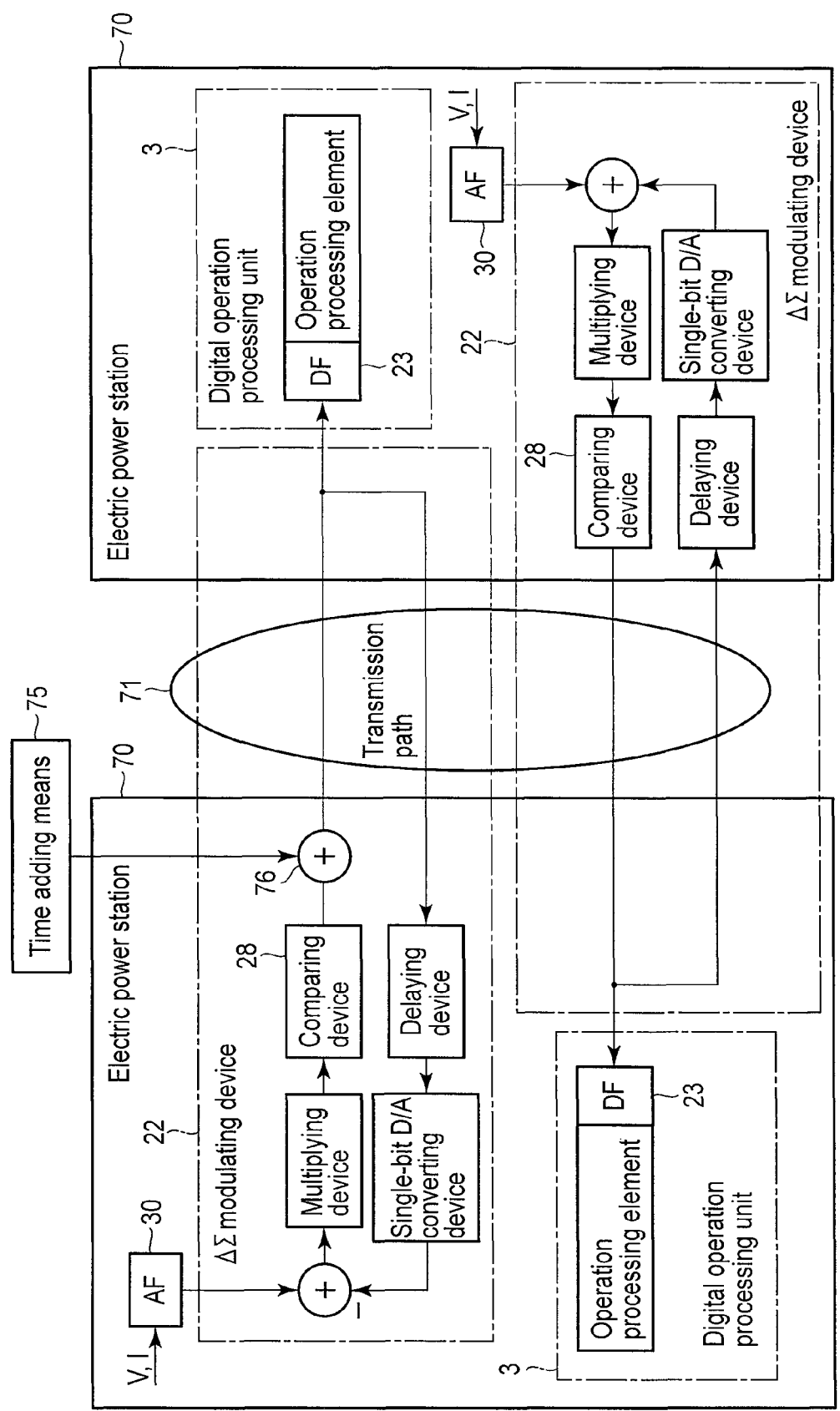
F I G. 48

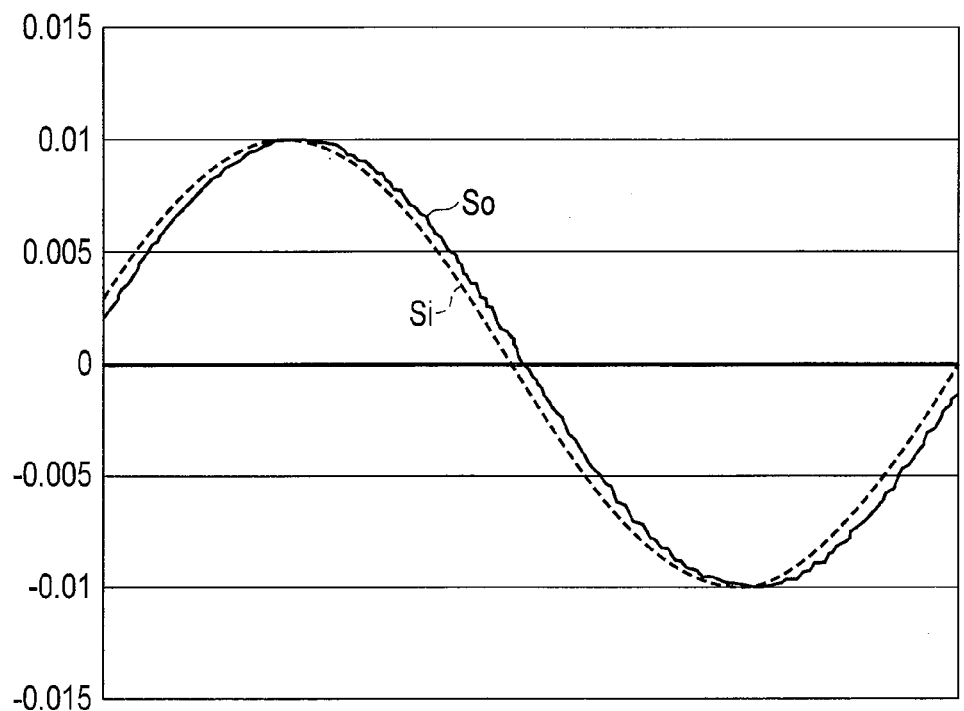
F I G. 5 1 A
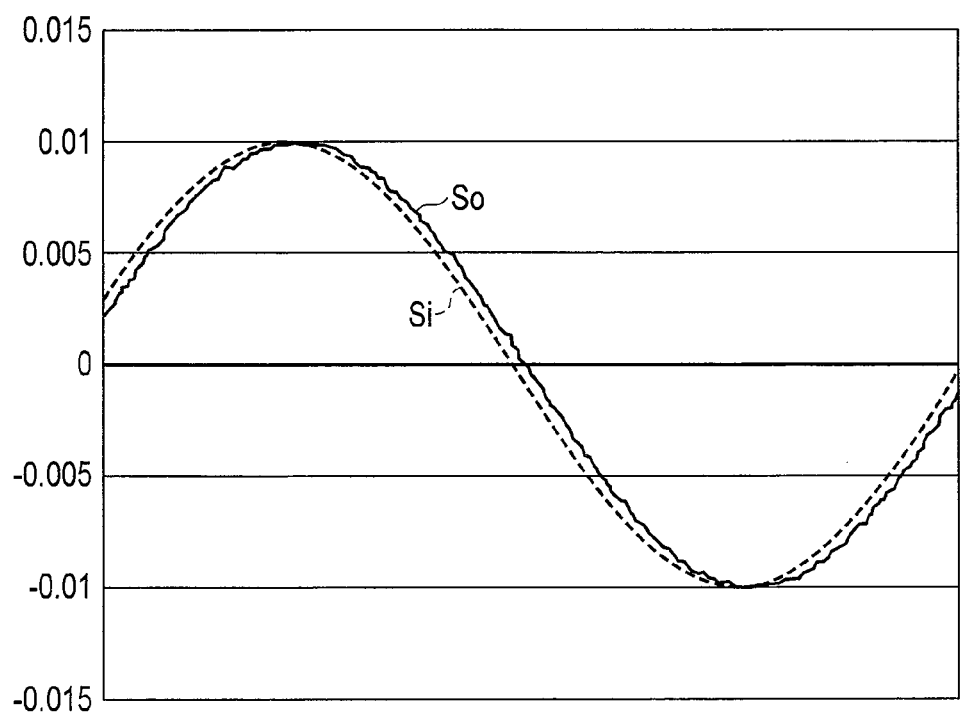
F I G. 5 1 B

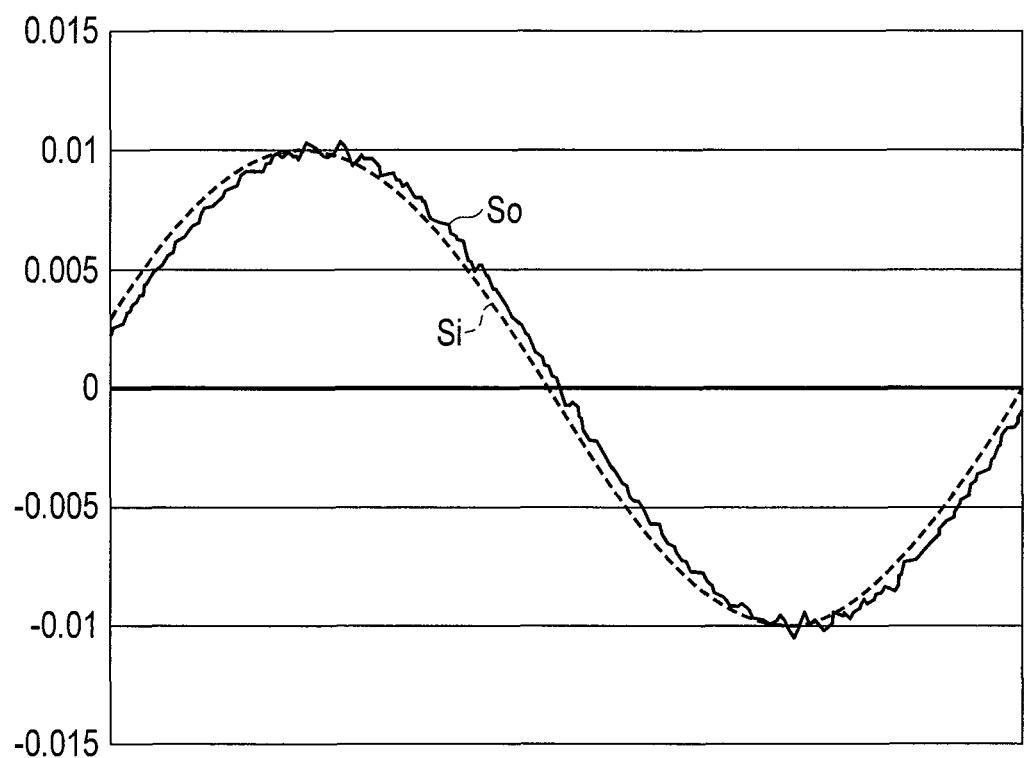
F I G. 5 1 C

{ ΔΣ modulation single-bit data

Transmission data  1 0 0 1 1 1 0 1 0 0 1 0 0 1 0 1 1 0 0 0 1 0 1 1 0 0 1 0 1 0 0 1 ···

⇩

Reception data    1 0 0 1 1 1 0 1 0 0 1 1 0 1 0 1 1 0 0 0 1 0 1 1 0 0 1 0 1 0 0 1 ···

{ Multi-bit A/D conversion data

Transmission data   1 1 0 0 1 1 0 1    In case of decimal number   2 0 5

⇩

Reception data      0 1 0 0 1 1 0 1    In case of decimal number   7 7

CONTROL SYSTEM, TRANSFORMER, PROTECTION CONTROL APPARATUS, AND BIT STREAM STORAGE UNIT

CROSS-REFERENCE TO RELATED APPLICATIONS

This application is a Continuation Application of PCT Application No. PCT/JP2011/055818, filed Mar. 11, 2011 and based upon and claiming the benefit of priority from Japanese Patent Application No. 2010-055376, filed Mar. 12, 2010, the entire contents of all of which are incorporated herein by reference.

FIELD

Embodiments described herein relate generally to a control system for controlling an electric power system by converting an analog electric quantity of an electric power system into a digital quantity and performing a predetermined operation, and also relate to a transformer, a protection control apparatus, and a bit stream storage unit provided in the control system.

BACKGROUND

A digital-type protection control apparatus, an NCT (Network Computing Terminal), an electric power quality measurement apparatus, and the like are known as examples of control systems. In general, protection control of an electric power system is done by a digital-type protection control apparatus. The digital-type protection control apparatus receives a state quantity of an electric power system which changes every moment, and performs stabilization control and system protection control by finding changes in state of multiple pieces of equipment constituting the electric power system and abnormal situations such as an accident occurring in the multiple pieces of equipment. In particular, in recent years, digital-type protection control apparatuses having high-performance electronic devices such as a high-speed processing microprocessor and a large-capacity memory are employed, and their functions are improved.

As a digital-type protection control apparatus, various kinds of apparatuses have been developed in accordance with the contents of protection control mainly for electric power systems, and the various kinds of apparatuses are employed at required portions of the electric power systems. More specifically, a digital relay is also installed to protect an electric power system by separating a portion where an accident has occurred from the electric power system by detecting an accident (system accident) that has occurred in each piece of equipment (an electrical power transmission line, a transformer and the like) of the electric power system, and a monitoring control apparatus is also installed to control the connection configuration of the system.

Any one of these digital-type protection control apparatuses receives analog state quantities of currents and voltages of the electric power system, and performs various kinds of digital operational processing based on digital values converted by analog/digital conversion (hereinafter referred to as A/D conversion). In addition to the above, systems for performing various kinds of operations upon receiving the analog input quantities are as follows: various kinds of apparatuses such as a malfunctioning point locating apparatus (fault locator) for accurately locating a position of an accident point (malfunctioning point) on an electrical power transmission line, a system analyzing apparatus (oscillograph apparatus) for recording an oscillograph at a time of occurrence of an accident, and a measurement apparatus relating to electric power qualities such as harmonics and voltage sag (instantaneous drop of voltage) are installed.

Hereinafter, a digital-type protection control apparatus will be explained using an example of a digital relay for performing a protecting relay operation on an electric power system. FIG. 55 is a configuration diagram illustrating a basic configuration of a conventional digital relay for multiple inputs, which is an example of a conventional digital-type protection control apparatus. According to FIG. 55, a digital relay 1 includes an analog/digital conversion unit 2 for retrieving many analog state quantities (electric quantities) A-1 to A-n such as currents and voltages from an electric power system, which is a target of protection control, and converting the analog state quantities A-1 to A-n into digital data, a digital operation processing unit 3 for performing protection control operation based on state data digitalized by this analog/digital conversion unit 2, an input/output interface unit (I/O) 4 for performing interface processing related to data input/output to/from electric power system protection control apparatuses (protection control apparatuses) such as a circuit breaker and a protection relay, and a display device 14 such as an LED for displaying operation of the protection control apparatuses and the electric quantity data.

All constituent elements of this digital relay 1 (the analog/digital conversion unit 2, the digital operation processing unit 3, the input/output interface unit 4, and the display device 14) are connected to each other via a bus 5 in such a manner that they can transmit and receive data between each other.

The analog/digital conversion unit 2 includes n analog filters 6-1 to 6-$n$, for unnecessary frequency component removal, which are as many as the number of input electric quantities (A-1 to A-n), sampling hold circuits 7-1 to 7-$n$, for sampling, which correspond to the analog filters 6-1 to 6-$n$, respectively, a multiplexer 8 for selection output, and an A/D conversion device 9 for A/D conversion.

On the other hand, the digital operation processing unit 3 is constituted by a computer circuit. More specifically, the digital operation processing unit 3 includes a CPU 10 for execution of protection control operation processing, a random access memory (RAM) 11 for temporarily saving the electric quantity data and data generated during processing performed by the CPU 10, a read-only memory (ROM) 12 for saving a processing procedure (program) of protection control, and a nonvolatile memory (EEPROM) 13 for storing set points in a rewritable manner. The display device 14 is constituted by an LED and the like, and displays operations of the protection control apparatuses such as the circuit breaker and the electric quantity data saved in the RAM 11 by the processing of the CPU 10.

According to the digital relay 1 thus configured, each of the unnecessary frequency components (such as harmonic components other than the fundamental wave and direct current component) are removed by means of the analog filters 6-1 to 6-$n$ from the n electric quantities A-1 to A-n retrieved in parallel from the electric power system, and thereafter, the n electric quantities A-1 to A-n are transmitted to the sampling hold circuits 7-1 to 7-$n$, where each of them are sampled as state values (instantaneous values) with a time interval (cycle) defined in advance.

The instantaneous values respectively sampled by the sampling hold circuits 7-1 to 7-$n$ are sequentially and selectively output from a single output end via the multiplexer 8, and are transmitted to the A/D conversion device 9. Then, the instantaneous values transmitted to the A/D conversion device 9 are converted into digitalized electric quantity data by the A/D conversion device 9, and thereafter, the instantaneous values are sequentially output to the digital operation processing unit 3 via the bus 5. The electric quantity data which are sequentially output to the digital operation processing unit 3 are transferred to the RAM 11 in order and temporarily stored therein according to reading processing performed by the CPU 10 based on a protection control program stored in the ROM 12.

Then, based on the electric quantity data stored in the RAM 11, the set points of the protecting relay operation stored in the EEPROM 13, contact point information of external apparatuses such as circuit breakers retrieved via the input/output interface unit 4, and the like, the CPU 10 executes protection control operation processing (for example, digital filtering processing, amplitude value operation processing, effective value operation processing, phase difference operation processing, operation determining processing based on set points and the like) in accordance with a protection control program stored in the ROM 12.

The result obtained from the protection control operation processing performed by the CPU 10 as described above is output, by the processing performed by the CPU 10, to a protection control apparatus such as a circuit breaker via the input/output interface unit 4 as a protection control operation instruction such as a trip instruction (trip instruction) and a turn-on instruction to the external apparatus (the protection control apparatus) such as a circuit breaker, and the electric power system protection control operation {trip operation/turn-on operation (contact point open/close operation) and the like} is executed.

The electric quantity data stored in the RAM 11 are displayed as electric quantities by means of the display device 14 by display processing performed by the CPU 10. It should be noted that not only the digital relay but also other digital-type protection control apparatuses having protection control functions have substantially the same configuration as the digital relay 1 as explained above, although those digital-type protection control apparatuses are different in the protection control operation processing and the contents of protection control, and those digital-type protection control apparatuses are configured to perform similar operation processing.

In recent years, as the demand for electric power increases, apparatuses of an electric power system are distributed over a wider area, and accordingly, there are a larger number of control stations such as electric power stations and digital-type protection control apparatuses provided in these control stations for controlling equipment of such electric power system distributed over a wide area.

On the other hand, FIG. 56 is a configuration diagram when a digital protection control apparatus (digital relay) is arranged for equipment such as an electrical power transmission line and a bus wire of an electric power system. In FIG. 2, an electric power system is represented in a single-line diagram. As illustrated in FIG. 56, electrical power transmission lines 16A, 16B of an electric power system 15 are respectively provided with electrical power transmission line protection relays 1A, 1B which receive state quantities (electric power quantity such as currents and voltages) flowing in these electrical power transmission lines 16A, 16B and a bus wire 17 using transformers such as a measurement transformer 18A and a measurement transformer 18B and protect the electrical power transmission lines 16A, 16B by activating circuit breakers 19A, 19B for protection by performing the above protection control processing based on the received state quantities.

Likewise, a bus wire protection relay 10 is provided to protect the bus wire 17 by activating circuit breakers 19A to 19C to separate the bus wire 17 of the electric power system 15 from the electrical power transmission lines 16A to 16C, and further, a transformer protection relay 1D is provided to protect a transformer 20 by receiving state quantities flowing upstream side and downstream side of the transformer 20 of the electric power system 15 using measurement transformers 18A, 18A and activating circuit breaker 19C, 19D for protection based on the received state quantities.

FIG. 57 is a configuration diagram illustrating an example of an input unit of electric quantities (such as voltages and currents) of the electric power system to each of the digital-type protection control apparatuses. As illustrated in FIG. 57, for example, a voltage which is an electric quantity of the electric power system is detected by the measurement transformer 18B, and the electric quantity at the same portion of the electric power system detected by this single, common measurement transformer 18B is respectively input to multiple digital-type protection control apparatuses 101. The digital-type protection control apparatuses 101 include not only a protection relay but also a monitoring control apparatus, a malfunctioning point locating apparatus, a harmonics measurement apparatus, and the like, and each of the digital-type protection control apparatuses 101 inputs the electric quantity detected by the measurement transformer 18B with the analog/digital conversion unit 2, and the digital operation processing unit 3 performs a relay operation, monitoring control operation, malfunctioning point evaluation operation, high frequency measuring operation, and the like.

The monitoring control apparatus, the malfunctioning point locating apparatus, and the system analyzing apparatus record waveforms of voltages and currents of the system when, e.g., an accident occurs in the electric power system, and uses them for, e.g., consideration of protection relay methods by detailed analysis on the accident phenomenon. Recently, with GPS synchronization, information synchronously measured at many points over a wide region is collected, and phenomena ranging over wide range of the system are measured. It should be noted that FIG. 57 illustrates an example where a voltage of the electric power system is input, but information about a current is also input.

As described above, the reason why a dedicated analog/digital conversion unit 2 is provided for each digital-type protection control apparatus is that each digital-type protection control apparatus is different in the range of analog information (input full scale, frequency band, and the like) and the operation speed required for operation at the protection control target (purpose) of each digital-type protection control apparatus, and it is necessary to optimally design the A/D conversion device 9, the analog filter 6, and the like constituting the analog/digital conversion unit 2.

In this case, there is a harmonics measurement apparatus which is a measurement apparatus relating to the quality of electric power, wherein harmonics are measured by performing A/D conversion on currents and voltages which are input from a CT (current transformer) and a PT (potential transformer) of an electric power system, and an analog filter provided at a stage prior the A/D conversion has frequency characteristics for allowing target harmonic regions to pass through (for example, Jpn. Pat. Appln. KOKAI Publication No. 2002-345172).

However, in the conventional digital-type protection control apparatus, the electric quantity at the same portion of the electric power system is individually input to each digital-type protection control apparatus, and the dedicated analog/digital conversion unit 2 of them each performs input processing, and therefore, when a new digital-type protection control apparatus is applied, it is necessary to develop and install a new analog/digital conversion unit 2 on every such occasion. For this reason, there is a limitation in terms of application, and the economical effectiveness is also deteriorated. Moreover, there is also a limitation in the performance of the analog/digital conversion unit 2 installed individually, and this causes limitations in terms of application.

According to the protection control target (each purpose) of each digital-type protection control apparatus, the performance required by the analog/digital conversion unit 2 is, for example, as follows.

(1) protection relay: large full scale, high speed, stable response (2) monitoring control: high measuring accuracy at a range close to rating (3) accident waveform record: high-speed sampling, large full sale (4) harmonics measurement and voltage sag: high-speed sampling In other words, in the protection relay, it is necessary to determine an accident by measuring a current and a voltage in a short time from an instance of occurrence of a system accident and give an instruction to a circuit breaker, and in order to measure the current and the voltage at the time when the accident occurs, a large signal full scale (several hundred A or more at the input of the protection control apparatus) is required. In general, as the A/D conversion of the protection relay, a successive approximation type A/D conversion device is used, the sampling frequency of which is around several hundred to several kHz and the resolution of which is around 12 to 14 bits. For example, in general, in order to reduce an error of an operation value of a relay to 5% or less, 40 digits or more are required for relay detection sensitivity. In a case of a 12-bit A/D conversion device, 1 LSB is ½₀₄₈ of a full scale, and in this case, for example, in order to achieve a detection sensitivity of 100 A, the full scale value needs to be about 5000 A. Currently, an A/D conversion device of 16-bit resolution is used in a latest protection relay protecting a trunk transmission power system, but the usable resolution including noise and the like is about 14 bits.

As described above, the protection relay needs to have a design by which the required accuracy can be obtained from the usable resolution of the A/D conversion device. The analog filter 6 requires sufficient attenuation of the sampling frequency in order to prevent an aliasing error of the A/D conversion, and when the sampling frequency is low, particularly steep attenuation characteristics are required. In addition, it is also necessary to have a design that allows for a transient response. In order to obtain stable characteristics, highly accurate devices are required to be used as resistors, capacitors, and the like.

Subsequently, the monitoring control apparatus is required to measure the current and the voltage close to a normal rating (5 A or 1 A) with a high degree of accuracy, and the target measurement error is within 0.1%. Therefore, in general, the monitoring control apparatus uses dedicated full scale input, which is different from the protection relay. In some cases, the malfunctioning point locating system (fault locator) is attached to the protection relay, and uses the same analog input as the protection relay.

The system analyzing system records malfunction phenomena of a system, and is used for, e.g., consideration of a new protection relay method and system operation. The system analyzing system may be incorporated in the protection relay, but in order to observe the details including high frequency, it is necessary to install a dedicated system analyzing system in order. On the other hand, in order to understand phenomena of the electric power system, it is desirable to install them at many locations over a wide range. The harmonics measurement apparatus, which is an apparatus related to the electric power quality, is required to measure high frequency, and is required to measure the 40th or higher harmonic (a frequency 40 times higher than the fundamental wave). Moreover, a high sampling frequency is also needed to detect instantaneous interruption, and the harmonics measurement apparatus uses a sampling frequency of several ten kHz or more, which is higher than that of the protection relay.

As described above, in the electric power system, the analog/digital conversion units 2 specialized in various kinds of digital-type protection control apparatuses are installed. Therefore, when a new digital-type protection control apparatus is applied, it is necessary to develop and install a new analog/digital conversion unit 2 on every such occasion. For this reason, there is a limitation in terms of application, and the economical effectiveness is also deteriorated. Moreover, there is also a limitation in the performance of the analog/digital conversion unit 2 installed individually, and this causes limitations in terms of system application.

Because of such reasons, it is desired to present a technique capable of easily and accurately obtaining A/D conversion data which can be applied to various kinds of digital operation processing.

BRIEF DESCRIPTION OF THE DRAWINGS

FIG. 2 is a configuration diagram illustrating an example of a bit stream storage unit according to the first embodiment of the present invention.

FIG. 4A is a configuration diagram illustrating an example of a ΔΣ modulating device according to the embodiments of the present invention.

FIG. 4B is a configuration diagram illustrating an example of a ΔΣ modulating device according to the embodiments of the present invention.

FIG. 6 is a waveform diagram illustrating an example of a frequency spectrum of output data of the ΔΣ modulating device according to the embodiments of the present invention.

FIG. 7 is a waveform diagram illustrating an example of a frequency spectrum of output data of a successive approximation type A/D conversion device conventionally used for the purpose of protection control.

FIG. 14 is a waveform diagram of the digital filter 23 of example 1 as illustrated in FIG. 13.

FIG. 21 is a waveform diagram of a digital filter of example 4 as illustrated in FIG. 19.

FIG. 22 is a configuration diagram illustrating example 5 of a digital filter.

FIG. 23 is a configuration diagram illustrating a second embodiment of a digital-type protection control apparatus according to the embodiments of the present invention.

FIG. 27 is a configuration diagram illustrating a fifth embodiment of a digital-type protection control apparatus according to the embodiments of the present invention.

FIG. 31 is a configuration diagram illustrating a recovering processing unit for recovering a bit stream from the ΔΣ modulating device at the reception side according to the fifth embodiment of the present invention.

FIG. 32 is a configuration diagram illustrating an analog/digital conversion unit in a sixth embodiment of a digital-type protection control apparatus according to the embodiments of the present invention.

FIG. 34 is a configuration diagram illustrating an example of a data combining unit according to the seventh embodiment of the present invention.

FIG. 35 is an explanatory diagram illustrating a transmission frame generated from bit streams from multiple ΔΣ modulating devices according to the seventh embodiment of the present invention.

FIG. 39 is a configuration diagram illustrating an example where a differential relay is formed using digital operation processing units and analog/digital conversion units according to the embodiments of the present invention.

FIG. 40 is an explanatory diagram of a differential protection relay method for an electrical power transmission line accident between transformer substations when an analog/digital conversion unit according to the embodiments of the present invention is used.

FIG. 44 is a configuration diagram illustrating a ΔΣ modulating device where a feedback loop of the ΔΣ modulating device does not pass through a transmission path, according to the embodiments of the present invention.

FIG. 48 is a configuration diagram illustrating an eleventh embodiment of a digital-type protection control apparatus according to the embodiments of the present invention.

FIG. 51A is a waveform diagram illustrating original data of an output signal So of a digital filter and an input signal Si of a ΔΣ modulating device 22 in the eleventh embodiment of the present invention.

FIG. 51B is a waveform diagram illustrating an output signal So of the digital filter and an input signal Si of the ΔΣ modulating device 22 when some of data of a bit stream of the ΔΣ modulating device are changed in the eleventh embodiment of the present invention.

FIG. 51C is a waveform diagram illustrating the output signal So of the digital filter and the input signal Si of the ΔΣ modulating device 22 when some of data of a bit stream of the ΔΣ modulating device are changed in the eleventh embodiment of the present invention.

FIG. 57 is a configuration diagram illustrating an example of an input unit of electric quantities (such as a voltage and a current) of an electric power system to each digital-type protection control apparatus.

DETAILED DESCRIPTION

Embodiments will be described with reference to the drawings.

In general, according to one embodiment, there is provided a control system comprising: an analog/digital conversion unit which introduces an analog electric quantity provided from an electric power system and converts the analog electric quantity into a digital quantity; and a digital operation processing unit which performs protection control operation regarding a state of the electric power system using the digital quantity, wherein the analog/digital conversion unit includes a ΔΣ modulating device which samples the analog electric quantity provided by the electric power system with a predetermined modulation frequency and outputs a bit stream changing over time of single bit obtained by performing ΔΣ modulation, and the digital operation processing unit includes one or more digital filters which inputs the bit stream from the ΔΣ modulating device and of which frequency characteristics differ according to a type of protection control operation, and one or more operation processing elements which are connected to each digital filter and which perform different kinds of protection control operation processing regarding protection control, based on the bit stream provided by the digital filter.

In embodiments described below, a "digital-type protection control apparatus" (digital relay and the like performing protecting a relay operation on an electric power system) for performing protection control of an electric power system will be shown as an example of a control system, but the present invention is not limited to this "digital-type protection control apparatus". The present invention can also be applied to other kinds of control systems such as "an NCT" and an "electric power quality measurement apparatus".

Figure 1:
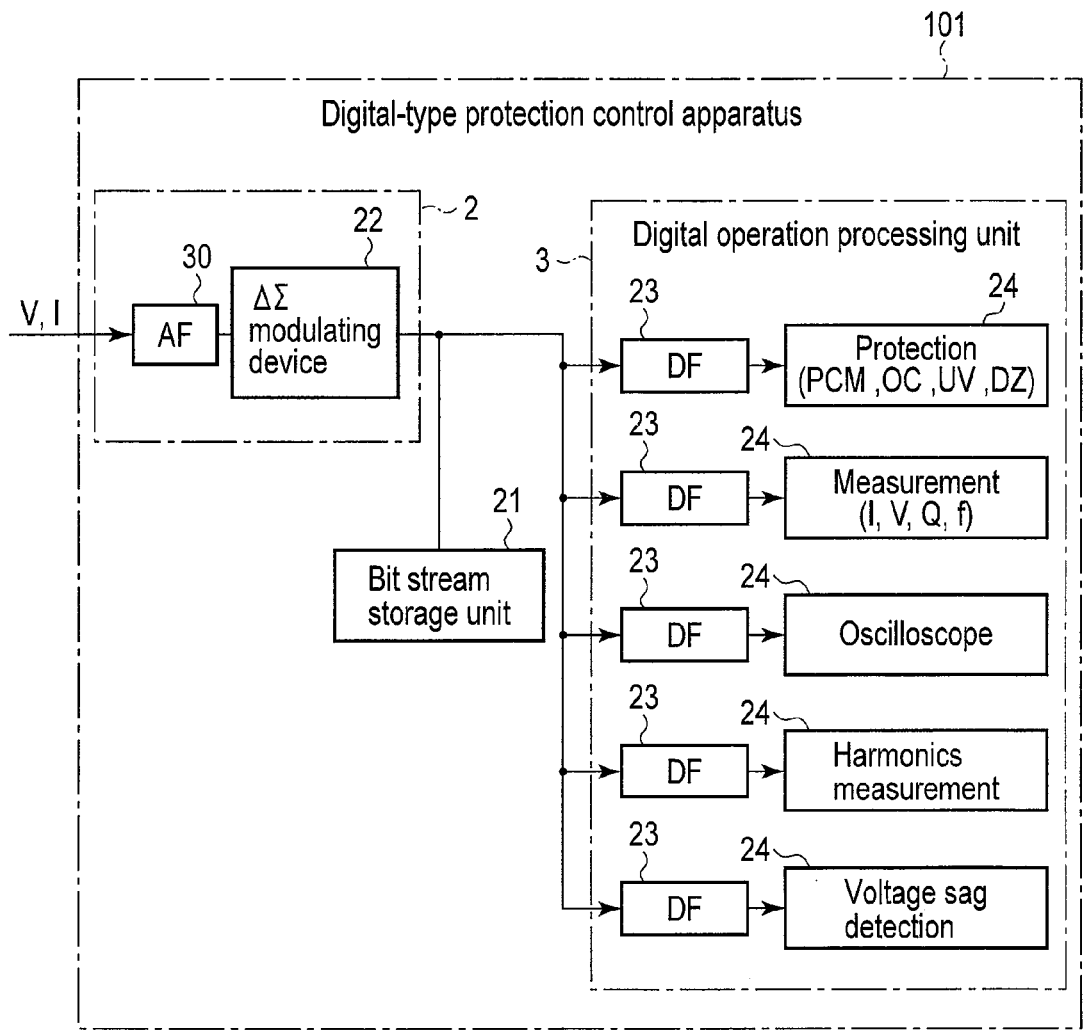
FIG. 1 is a configuration diagram illustrating a first embodiment of a digital-type protection control apparatus according to the embodiments of the present invention.

Hereinafter, the embodiments of the present invention will be explained. FIG. 1 is a configuration diagram illustrating a first embodiment of a digital-type protection control apparatus according to the embodiments of the present invention. A digital-type protection control apparatus 101 includes an analog/digital conversion unit 2, a digital operation processing unit 3, and a bit stream storage unit 21.

It should be noted that the analog/digital conversion unit 2 may be achieved as a "transformer" (such as CT, PT) having the analog/digital conversion unit 2. The digital operation processing unit 3 may be achieved as a "protection control apparatus" having the digital operation processing unit 3.

The analog/digital conversion unit 2 includes an analog filter 30 and a ΔΣ modulating device 22. The ΔΣ modulating device 22 receives analog electric quantities such as a voltage V and a current I from an electric power system which are detected by a transformer, not shown, via an analog filter 30, and samples the analog electric quantities with a predetermined modulating frequency, and outputs a single-bit stream, changing over time, of single bit obtained by performing ΔΣ modulation.

The digital operation processing unit 3 includes one or more digital filters 23 and one or more operation processing elements 24, and each digital filter 23 receives single-bit stream from the ΔΣ modulating device 22, and outputs single-bit stream having different frequency characteristics according to the types of protection control operations to the operation processing element 24. In FIG. 1, the digital operation processing unit 3 includes multiple digital filters 23 and multiple operation processing elements 24, and shows a case where one operation processing element 24 is provided for one digital filter 23. The operation processing element 24 performs different kinds of protection control operation processing for protection control, based on single-bit stream from each digital filter 23. FIG. 1 shows an example where the operation processing element 24, which is each application, is used for protection, measurement, oscilloscope, harmonics measurement, voltage sag detection, and the like.

On the other hand, the bit stream storage unit 21 includes a hard disk or a flash memory. When a predetermined condition is satisfied, for example, when it is a time set in advance, or when the digital operation processing unit 3 detected occurrence of an accident of the electric power system, the bit stream storage unit 21 stores single-bit stream from the ΔΣ modulating device 22.

FIG. 2 is a configuration diagram illustrating an example of the bit stream storage unit 21. The bit stream from the ΔΣ modulating device 22 is once recorded to a ring buffer 44, and the bit stream recorded to the ring buffer 44 is recorded to a hard disk 45. The bit stream is recorded according to a condition given from the outside. For example, when an accident of the electric power system occurs, recording of the bit stream is started, and when it is a time set in advance, recording of the bit stream is started. The CPU 46 constantly monitors whether a recording condition of the bit stream is satisfied or not, and when the recording condition of the bit stream is satisfied, a start signal is transmitted to a control unit 47.

The bit stream is constantly recorded and updated from the ΔΣ modulating device 22 to the ring buffer 44, and a bit stream for a certain period of time in the past is always stored.

When the control unit 47 receives the start signal, the control unit 47 thereafter starts recording of the bit stream indicating the number of bit streams to be recorded to the ring buffer 44 from the ΔΣ modulating device 22, and thereafter sets a count setting value of a bit stream, to be counted, to a counter 48. The counter 48 counts the number of bit streams recorded from the ΔΣ modulating device 22 to the ring buffer 44, and when the number of bit streams attains the count setting value, and an information to that effect is notified to the control unit 47. When the number of bit streams recorded from the ΔΣ modulating device 22 to the ring buffer 44 attains the count setting value set in the counter 48, the control unit 47 stops recording to the ring buffer 44. When the count setting value is set at a value less than the number of bit streams that can be recorded by the ring buffer 44, bit streams before reception of the start signal can also be recorded and held.

The bit stream recorded to the ring buffer 44 is recorded to the hard disk 45 according to the instruction given from the CPU 46. In addition, a communication interface 49 receives an instruction of a recording condition from the outside, and transmits the bit streams recorded in the hard disk 45 to an unillustrated network. The communication interface 49 is controlled by the CPU 46. In the above explanation, the use of the hard disk 45 has been explained. Alternatively, instead of the hard disk 45, a flash memory may be used, or both of the hard disk 45 and the flash memory may be used.

The bit stream saved in the hard disk or the flash memory of the bit stream storage unit 21 is transmitted to a terminal apparatus connected to the network via the network by means of the communication interface 49. Accordingly, using a program on the terminal apparatus, this enables off-line protection control operation such as malfunctioning point evaluation operation, accident waveform display operation, harmonics measurement operation, instantaneous interruption detection, and the like.

Figure 3:
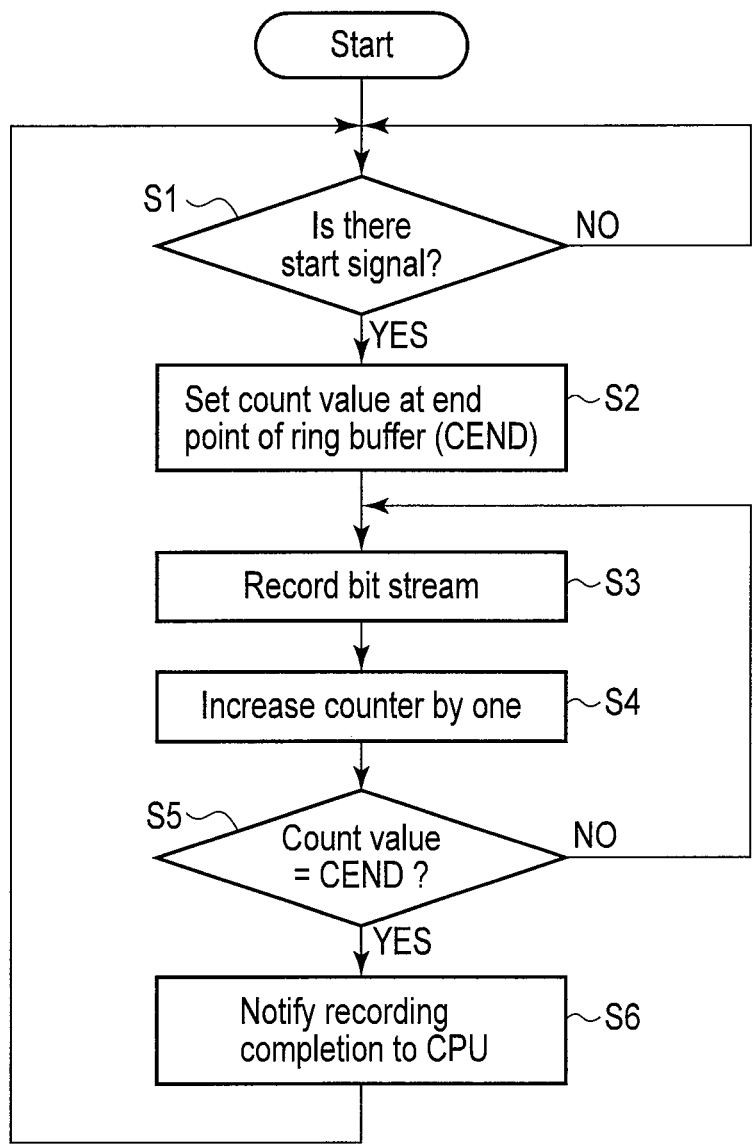
FIG. 3 is a flowchart illustrating an example of processing content of recording processing of a bit stream according to the first embodiment of the present invention.

FIG. 3 is a flowchart illustrating an example of processing content of recording processing of a bit stream. The CPU 46 constantly monitors whether a recording condition is satisfied or not, and when the recording condition is satisfied, a start signal is transmitted to the control unit 47. The control unit 47 determines whether there is a start signal (S1), and when there is a start signal, a count setting value at an end point of the ring buffer 44 is set to the counter 48 (S2), and the bit stream is recorded to the ring buffer 44 (S3), and 1 is added to a count number (S4). Then, a determination is made as to whether the count number attains a count setting value (S5), and when the count number is determined not to be the count setting value, the CPU 46 returns to step S3. On the other hand, when the count number attains the count setting value, a recording completion is notified to the CPU 46 (S6), and the CPU 46 returns to step S1.

Accordingly, the state of the electric power system can be saved without degrading original information obtained by performing sampling process with the highest speed and resolution, and this can be made use of by off-line analysis performed later. It should be noted that, when it is not necessary to perform off-line analysis later, it is not necessary to provide the bit stream storage unit 21. The bit stream storage unit 21 may be installed independently, or may be provided within the analog/digital conversion unit 2 or within the digital operation processing unit 3.

Subsequently, the present invention serves as the method for the analog/digital conversion unit 2, in which information from the ΔΣ modulating device 2 capable of obtaining highly accurate and wide band information can be transmitted without losing it, and the operation processing element 24, i.e., an application side, extracts necessary information, which enables effective acquisition of information, so that the analog/digital conversion unit 2 can be commonly used. In other words, system electric quantity (such as a voltage V and a current I) from the electric power system are introduced to the ΔΣ modulating device 2, and with a predetermined operation frequency (modulation frequency or oversampling frequency), ΔΣ modulation is performed from an analog quantity into a single-bit digital quantity. Thereafter, this single-bit digital quantity is referred to as single-bit stream.

Subsequently, this single-bit stream is subjected to removal of high-frequency components by the digital filter 23 of the digital operation processing unit 3, and converted into multi-bit data. Then, the data are decimated (or thinned out) at a predetermined frequency, and are output as multi-bit A/D conversion data of a sampling frequency required for operation performed by the operation processing element 24 of the digital operation processing unit 3 (a frequency lower than the modulation frequency, which is referred to as an ultimate sampling frequency). The digital filter 23 at this occasion is called a decimation filter. The operation processing element 24 of the digital operation processing unit 3 performs, based on the multi-bit A/D conversion data, operation relating to the state of the electric power system (calculation of voltages and currents flowing in the system, determination of whether a system accident occurs or not, and the like).

The actions and effects of the above configuration are as follows. The bit stream including information obtained from sampling performed by the ΔΣ modulating device having a high S/N and capable of wide band A/D conversion is transmitted, as the original information, to various kinds of digital operation processing units, so that various kinds of applications can extract data of necessary sampling speed and resolution.

Among existing A/D changing methods, the ΔΣ modulation is a method with which information can be obtained with the highest accuracy. As the band becomes wider, some have modulation frequencies of the GHz level or higher. In the conventional A/D conversion method, a successive approximation type A/D conversion widely used in this field can perform relatively high-speed A/D conversion, but due to manufacturing errors of an internal capacitor array, there is a limitation of accuracy even if averaging is used. Therefore, it is preferable to use the ΔΣ modulation in order to obtain highly-accurate, wide-band A/D conversion data.

In the ΔΣ modulation, single-bit modulation output modulated with pulse density modulation can be obtained (there may be multi-bit output, but in this case, single-bit output is used). In general, in the ΔΣ modulation which is a ΔΣ type A/D conversion device, single-bit modulation output is converted into multi-bit by the decimation filter, and then decimated using low-speed sampling and then output. On the other hand, the original, non-decimated single-bit modulation output includes original information over a wide band, and is considered to be used for various kinds of purposes. An A/D conversion device applying a generally-available decimation filter discards information in a high band, and it is impossible to recover data in a band once discarded.

Subsequently, basic operation of the ΔΣ modulating device 22 will be explained. FIGS. 4A and 4B are configuration diagrams illustrating an example of a ΔΣ modulating device 22. FIG. 4A illustrates a first-order ΔΣ modulating device, and FIG. 4B illustrates a second-order ΔΣ modulating device. In FIG. 4A, an analog signal which is input to the first-order ΔΣ modulating device is calculated as follows. The analog signal is subjected to operation by an adding device 26 based on a difference from a feedback signal provided by a single-bit D/A conversion device 25 based on the previous comparing result, and the signal is then passes through a multiplying device 27, and is compared in a comparing device 28, and then, a single-bit digital signal is output. The output bit stream is delayed by a delaying device 29, and is thereafter converted into an analog quantity by a single-bit D/A conversion device 25. The adding device 26 obtains a difference between the analog input again, and the difference is input into the multiplying device 27. In FIG. 4B, in the second-order ΔΣ modulating device, an adding device 26a and a multiplying device 27a are additionally provided at a stage prior to the first-order ΔΣ modulating device as illustrated in FIG. 4A. Further, the adding device 26 and the multiplying device 27 may be added to a stage prior thereto, which makes, e.g., a configuration of an n-th order ΔΣ modulating device of an n-th order.

Figure 5:
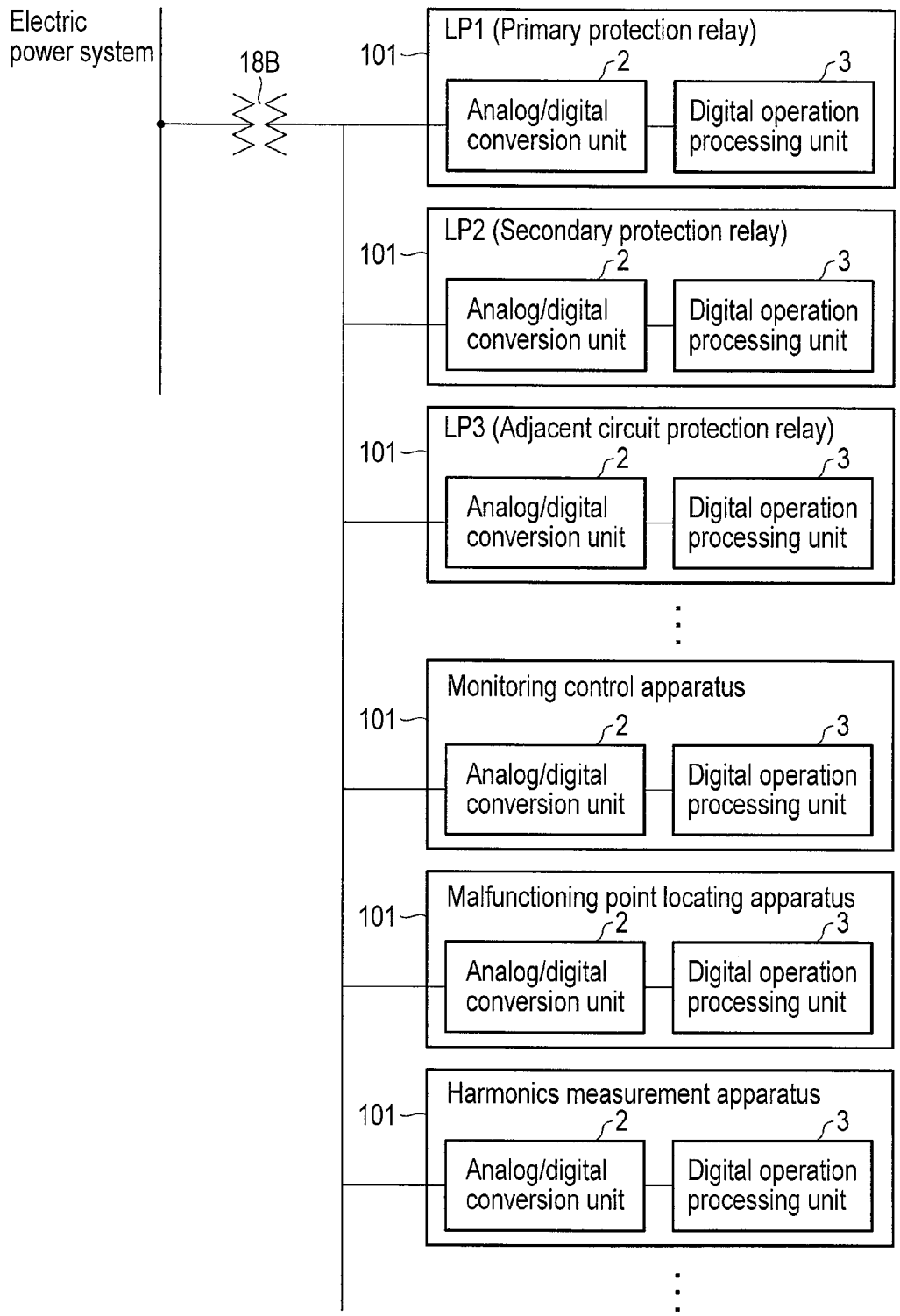
FIG. 5 is a waveform diagram illustrating an example of an operation waveform of the ΔΣ modulating device according to the embodiments of the present invention.

FIG. 5 is a waveform diagram illustrating an example of operation waveform of the ΔΣ modulating device 22. In the single-bit ΔΣ modulating device 22, output data changes to High and Low according to the operation frequency of the ΔΣ modulating device 22, and can be represented as a single-bit digital quantity having two values. When the input signal is large, the output of the ΔΣ modulating device 22 is at High for a longer period of time, and when the input signal is small, the output of the ΔΣ modulating device 22 is at Low for a longer period of time. FIG. 5 illustrates an output of the ΔΣ modulating device 22 when a sine wave signal is input.

FIG. 6 is a waveform diagram illustrating an example of a frequency spectrum of output data of the ΔΣ modulating device 22. In FIG. 6, fos denotes an operation frequency (over sampling frequency) of the ΔΣ modulating device 22, and is equal to the cycle of the output data. Therefore, the spectrum becomes symmetrical with respect to fos/2 (Nyquist frequency). Accordingly, FIG. 6 illustrates only a spectrum including frequencies lower than fos/2.

On the other hand, FIG. 7 is a waveform diagram illustrating an example of a frequency spectrum of output data of a successive approximation type A/D conversion device conventionally used for the purpose of protection control. In FIG. 7, fs denotes a sampling frequency of the A/D conversion device, and the spectrum becomes symmetrical with respect to fs/2 (Nyquist frequency). Accordingly, FIG. 7 illustrates only a spectrum including frequencies lower than fs/2.

As illustrated in FIGS. 6 and 7, the over sampling frequency fos of the ΔΣ modulating device 22 can be a frequency higher than the sampling frequency fs of the successive approximation type A/D conversion device. In the ΔΣ modulation, currently, it is possible to obtain information which is sampled with a frequency of several hundred MHz or higher. Therefore, it is possible to obtain wide-band data that can be applied to all kinds of purposes of protection control. Examples of purposes requiring wide-band data include finding harmonics existing in an electric power system and protection relay and accident point locating based on a surge waveform occurring during a system accident.

FIGS. 6 and 7 illustrate spectrums of a signal S and a noise N. In this case, the noise N is quantization noise generated by the A/D conversion. In the case of ΔΣ modulation of FIG. 6, due to the noise shaping effect, the quantization noise decreases at the low frequency side around the signal, and the quantization noise increases at the high frequency side. Therefore, by removing the quantization noise at the high frequency side using the digital filter 23, a low frequency signal can be detected with a high S/N. As the digital filter 23, the resolution and sampling rate of the output data can be freely changed by appropriately changing the decimation filter for decimating (or thinning out) the output data at a predetermined frequency.

Figure 8:
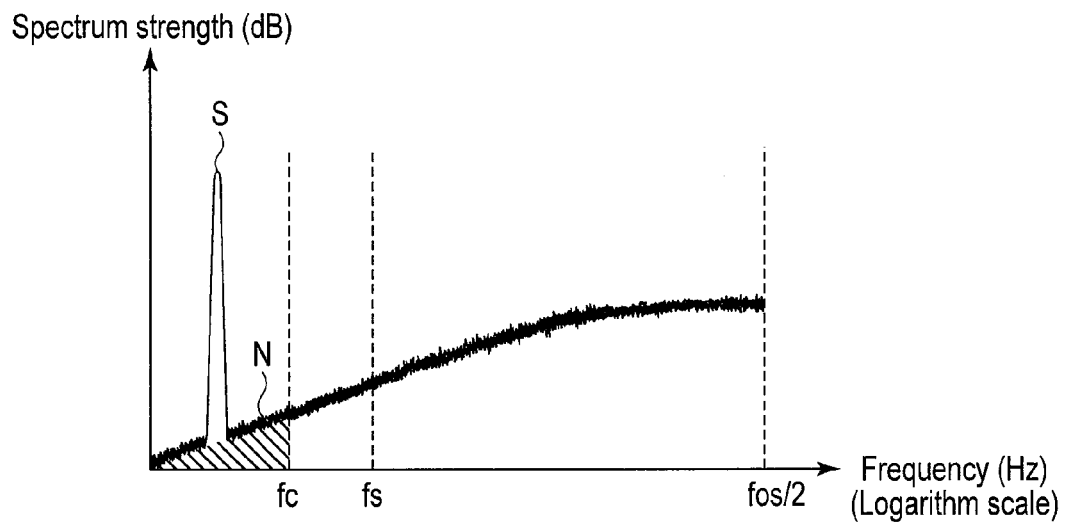
FIG. 8 is a waveform diagram illustrating an example of a waveform where a decimation filter is used as a digital filter according to the embodiments of the present invention, where a cutoff frequency of the decimation filter is denoted as fc.
Figure 9:
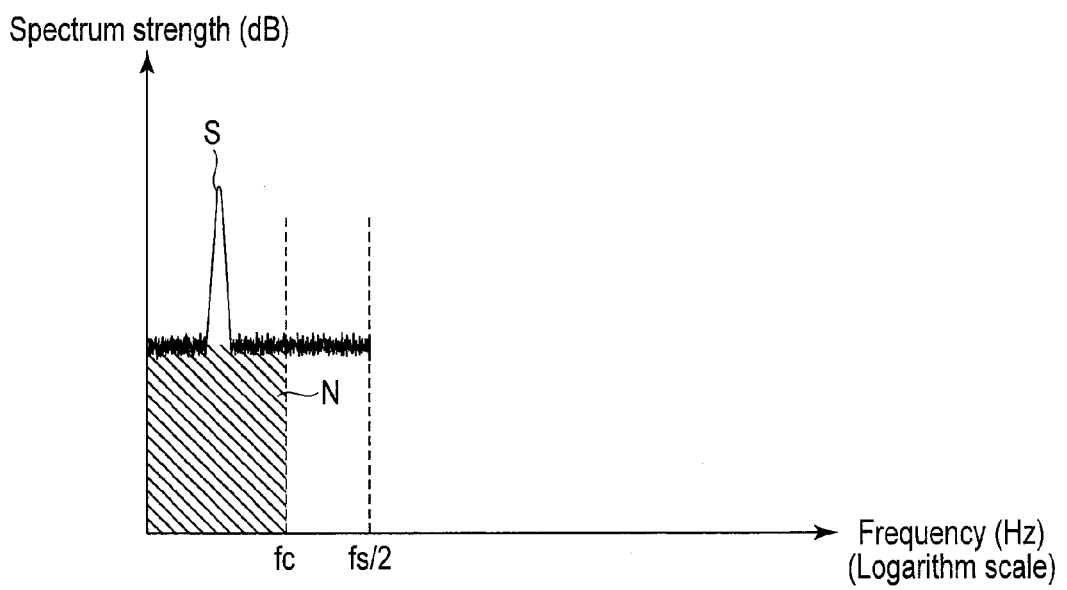
FIG. 9 is an explanatory diagram illustrating noise of output data of a conventional successive approximation type A/D conversion device.

FIG. 8 is waveform diagram illustrating an example of a waveform, where, with regard to the over sampling frequency fos, the decimated sampling frequency is denoted as fs, and the cutoff frequency of the decimation filter is denoted as fc. As illustrated in FIG. 8, in contrast to the over sampling frequency fos, the cutoff frequency fc is greatly small, and the quantization noise N of the output data of the ΔΣ modulating device 22 is concentrated in a high frequency region, and therefore, the noise in the band can be greatly reduced, and the signal can be extracted with a high S/N. With the ΔΣ modulation, data can be obtained with a resolution of 20 bits or more due to the high S/N, and data can be obtained with a resolution that can be applied to all kinds of protection control purposes. On the other hand, FIG. 9 illustrates a case of a successive approximation type. In this case, a certain level of noise exists in a low band that is equal to or less than the sampling frequency, and the noise increases around the signal, which reduces the limit of the S/N ratio as compared with the case of the ΔΣ modulation.

In the past, for the purpose requiring high-speed sampling and for the purpose requiring high resolution, it is necessary to use another A/D conversion device, but in the present invention, the output data from the same ΔΣ modulating device 22 can be decimated, by an appropriate method, in accordance with a request of each operation processing element 24 of the digital operation processing unit 3, whereby data can be obtained with the necessary sampling speed and resolution.

Figure 10:
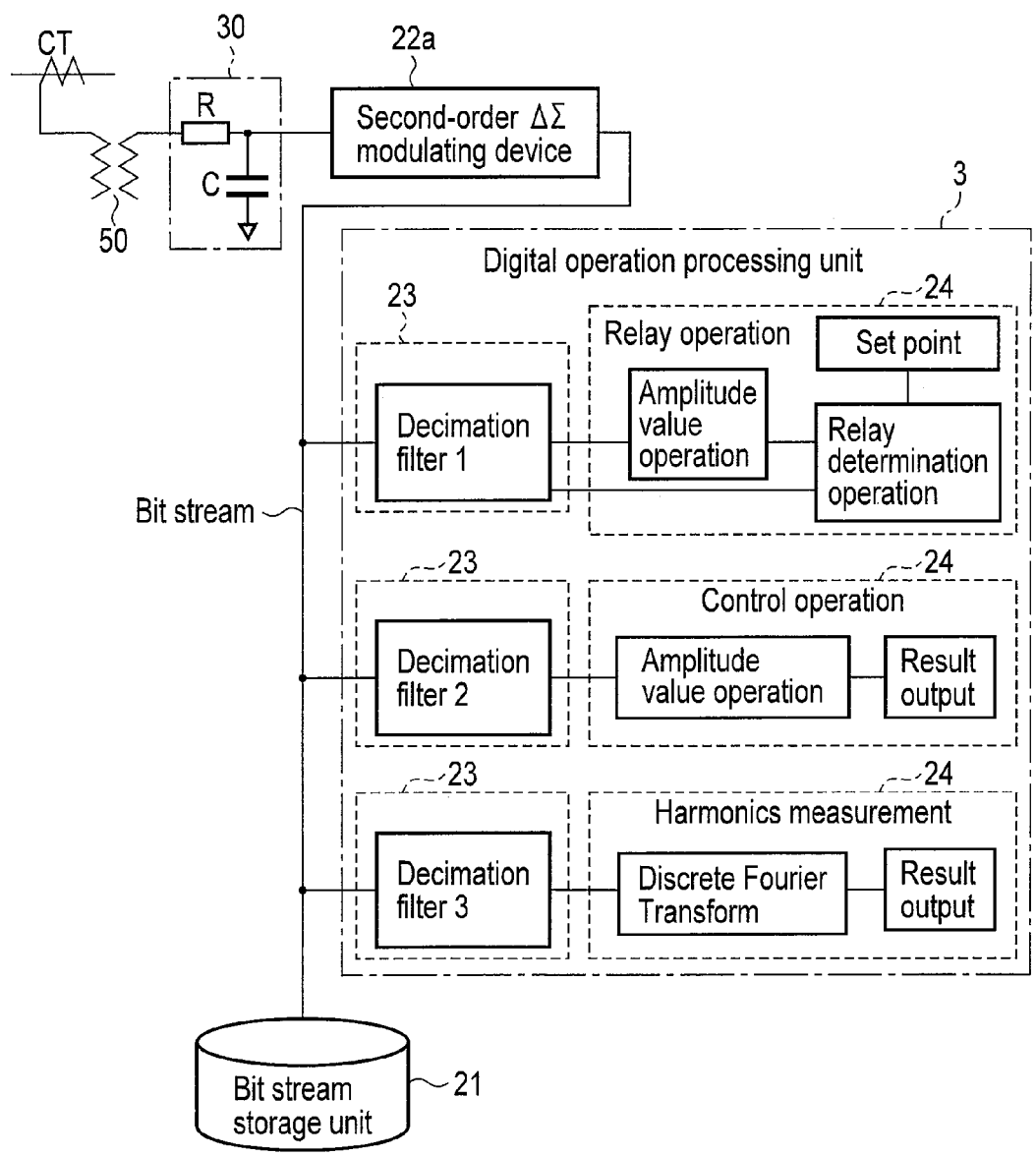
FIG. 10 is a configuration diagram where a digital-type protection control apparatus according to the embodiments of the present invention is applied to an electrical power transmission line.

Subsequently, a case will be explained where a digital-type protection control apparatus according to the embodiments of the present invention is applied to an electrical power transmission line. As illustrated in FIG. 10, a transformer CT detects the current of the electrical power transmission line, and the current detected by the transformer CT is input to a second-order ΔΣ modulating device 22a via an auxiliary CT 50 and an analog filter 30. In other words, the analog/digital conversion unit 2 includes an input conversion device (transformer CT, auxiliary CT 50), the analog filter 30, and the second-order ΔΣ modulating device 22a. Now, it is assumed that the frequency of the electrical power transmission line is 60 Hz, and the digital operation processing unit 3 performs a relay operation, control operation, and harmonics measurement. The specification of the analog/digital conversion unit 2 is configured according to the specification as illustrated in Table 1.

TABLE 1

| | Item | Specification |
|---|---|---|
| Input transformer | Primary side full scale | 163.84 A |
| | Primary side rated current | 5 A |
| Analog filter | Type | Primary RC passive LPF |
| | Cutoff frequency | 3000 Hz |
| ΔΣ modulator | Order | Second-order |
| | Sampling frequency | System frequency multiplied 12288 times when the system is 60 Hz, 737280 Hz |

In many cases, 5 A and 1 A are used as a rated current of the input transformer apparatus, but in this case, a 5 A rating will be considered. The full scale is assumed to be 163.84 A, which is mainly used in a distance relay for an electrical power transmission line (the values of the currents are all effective values). A first-order low pass filter including a resistor R and a capacitor C is used as the analog filter 30. In order to detect a signal of the 40th-order in the harmonics measurement (2400 Hz if the system is 60 Hz), the cutoff frequency is set at 3000 Hz. The second-order ΔΣ modulating device 22a is used as the ΔΣ modulating device 22. The sampling frequency (modulation frequency) is set at 737280 Hz (12288 times the system frequency). The attenuation of the analog filter at the sampling frequency is about 40 dB or more. This is a value generally used in a digital relay.

As an action in this kind of configuration, an S/N ratio of the A/D conversion for the signal band of each purpose will be considered. In a case of the second-order ΔΣ modulating device 22a, the S/N is expressed by the following expression.

$$S/N = -11.1 + 50 \log 10(fs/2fb) [\text{dB}]$$

The above expression represents the S/N ratio between noise and signal within a bandwidth fb where the sampling frequency is denoted as fs.

Where the A/D conversion sampling frequency 720 Hz of relay operation and control operation is assumed to be the band fb, the S/N is 124 dB. The measurement can be performed with an accuracy of 0.1% which can sufficiently become a target even with the rated current with respect to the full sale. On the other hand, when the bandwidth is the 40th-order harmonic, i.e., 2400 Hz, in the harmonics measurement, the S/N is 98 dB. Although the detection accuracy of the harmonic is not particularly defined by any specification, this enables measurement with sufficient accuracy. According to the above configuration, a protection relay, a control apparatus, and a harmonic analyzing apparatus can be structured using data from the ΔΣ modulating device 22.

Subsequently, a configuration and actions of the digital filter 23 of the digital operation processing unit 3 will be explained. In this case, a protection relay is considered as the digital protection control apparatus 101, and for a signal around a fundamental wave required for protection relay operation, an optimum filter configuration for reducing out-of-band noise and quantization noise will be considered.

Figure 11:
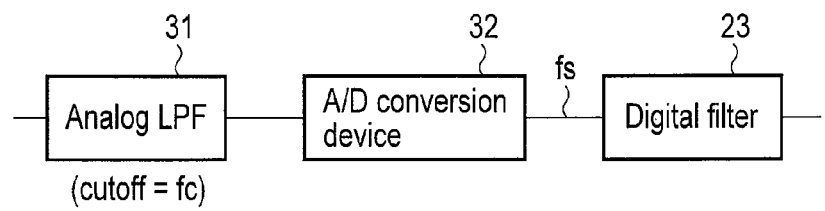
FIG. 11 is a configuration diagram illustrating a conventional analog/digital conversion unit and a digital filter.

FIG. 11 is an example of a configuration in a conventional technique. The analog/digital conversion unit 2 includes an analog LPF 31 and an A/D conversion device 32, and the digital filter 23 is connected to a stage subsequent thereto.

Figure 12:
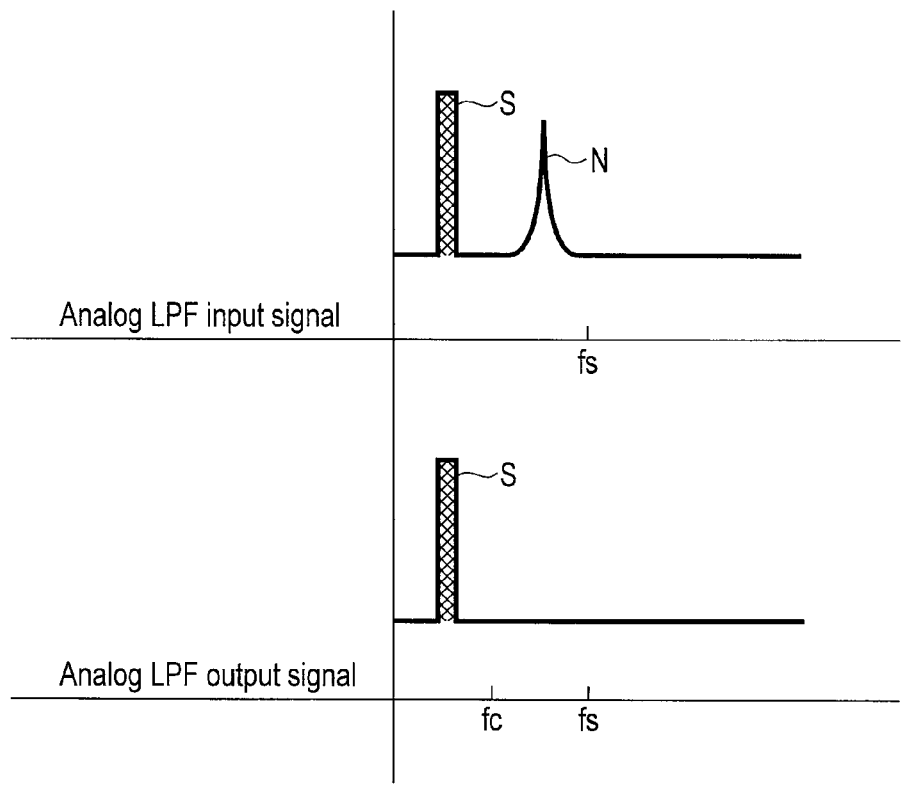
FIG. 12 is a signal spectrum diagram illustrating an input output signal of an analog LPF of a conventional analog/digital conversion unit as illustrated in FIG. 11.

FIG. 12 is a signal spectrum diagram illustrating an input output signal of the analog LPF 31. In this case, fs denotes the sampling frequency of the A/D conversion device 32. The signal spectrum at the input unit of the analog LPF includes the signal S as well as the out-of-band noise N. On the other hand, in the signal spectrum at the output unit of the analog LPF, the out-of-band noise N is attenuated. The analog LPF 31 of FIG. 11 is provided to attenuate the out-of-band noise N. The analog LPF 31 of FIG. 11 is required to attenuate frequencies equal to or more than fs/2 in order to prevent the aliasing error into the band during the A/D conversion, and requires a filter of steep attenuation characteristics.

Figure 13:
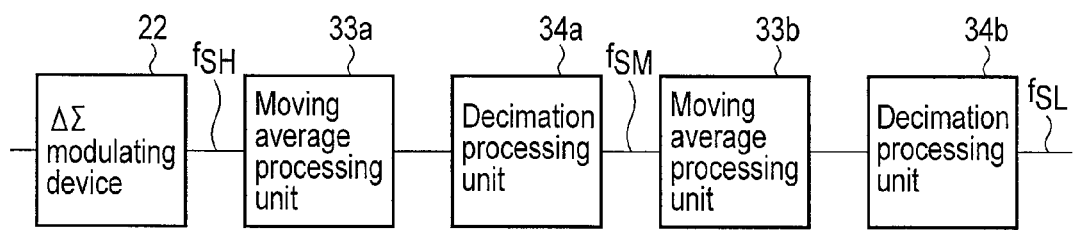
FIG. 13 is a configuration diagram as illustrated in example 2 of a digital filter 23.

FIG. 13 is a configuration diagram illustrating example 1 of the digital filter 23. The digital filter 23 of FIG. 13 includes first stage moving average processing unit 33a and stage decimation processing unit 34a, and subsequently arranged second stage moving average processing unit 33b and stage decimation processing unit 34b which performs processing into the ultimate sampling cycle. The output signal of the ΔΣ modulating device 22 which is input to the digital filter 23 has a modulation frequency fSH, and after the first stage moving average processing unit 33a, the decimation processing unit 34a interpolates the signal at an intermediate frequency fSM, and further, after the moving average processing unit 33b obtains a moving average, the signal is decimated at the ultimate frequency fSL.

FIG. 14 is a waveform diagram of the digital filter 23 of example 1 as illustrated in FIG. 13. As illustrated in FIG. 14, the output signal of the ΔΣ modulating device 22 indicates the frequency spectrum of the bit stream, and includes a low in-band signal S, out-of-band noises N11, N12, and a quantization noise N2 that is further noise-shaped by the ΔΣ modulation. In the configuration of this example 1, the analog filter is set as a wide band in accordance with the sampling frequency, and accordingly, the out-of-band noises N11, N12 are not removed and appear as they are as illustrated in FIG. 14.

The output signal of the first stage moving average processing unit 33a has frequency characteristics in which the intermediate frequency fSM is a notch, but since the attenuation is gentle, the out-of-band noises N11, N12 still remain. In addition, a significant quantization noise N2 remains.

The output signal of the second stage moving average processing unit 33b is decimated at the ultimate frequency, but since the difference between the ultimate frequency fSL and the intermediate frequency fSM is small and there is low number of taps, the amount of attenuation by the moving average is small, and the in-band noise and the quantization noise still remain. Moreover, the signal is folded in the signal band as a result of the ultimate decimation, and therefore, the detection accuracy of the signal is deteriorated.

Figure 15:
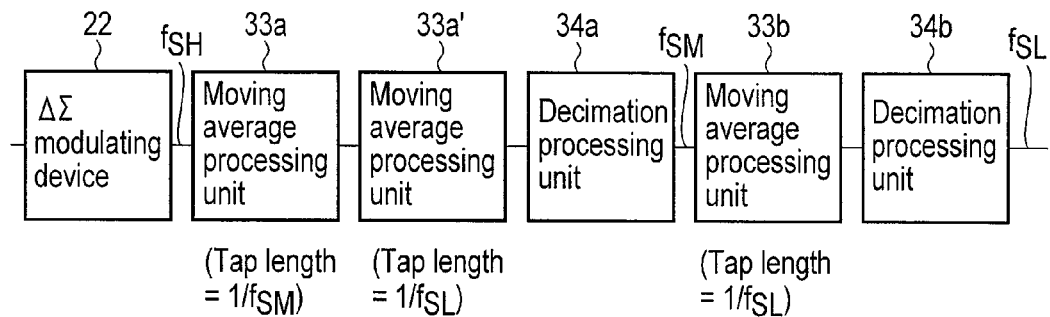
FIG. 15 is a configuration diagram illustrating example 2 of a digital filter.

FIG. 15 is a configuration diagram illustrating example 2 of the digital filter 2. In contrast to example 1 as illustrated in FIG. 13, the digital filter 23 of this example 2 is configured such that the first stage moving average processing unit 33a of FIG. 13 is made of a combination of moving average processing units 33a, 33a' of two different types of tap lengths. The first stage moving average processing unit 33a is a tap length (1/fSM), and a tap length of the moving average processing unit 33a' is (1/fSL) which is longer than (1/fSM). Then, this is configured such that, at a stage subsequent thereto, the decimation processing unit 34a performs decimation process into the intermediate frequency fSM, and thereafter, the moving average processing unit 34a of which tap length is 1/fSL performs moving average processing, and then the decimation processing unit 34b performs decimation at the ultimate frequency fSL.

In this case, the amount of attenuation of noise at a frequency higher than fSL is more than that of the case of FIG. 13, and this can suppress the reduction of accuracy caused by the aliasing error of the quantization noise. As described above, better characteristics can be obtained by performing a filtering process at a stage where the frequency is higher. However, the attenuation of fSL/2 to fSL is gentle, and therefore, when there is out-of-band noise in this portion, there is a problem in that folding remains in the signal band.

Figure 16:
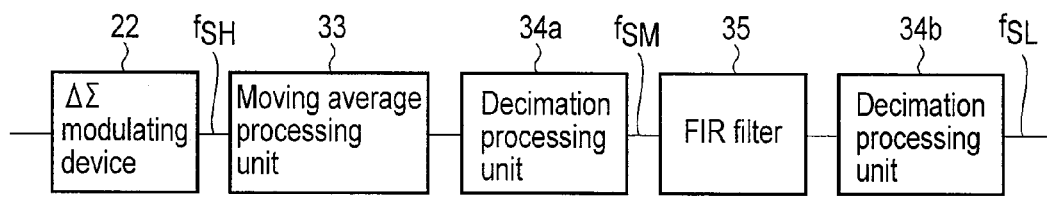
FIG. 16 is a configuration diagram illustrating example 3 of a digital filter.

FIG. 16 is a configuration diagram illustrating example 3 of the digital filter 23. In the digital filter 23 of this example 3, an FIR filter 35 is provided instead of the second stage moving average processing unit 33b of the digital filter 23 of example 1 as illustrated in FIG. 13. In other words, the moving average processing unit 33 and the FIR filter 35 are combined.

Figure 17:
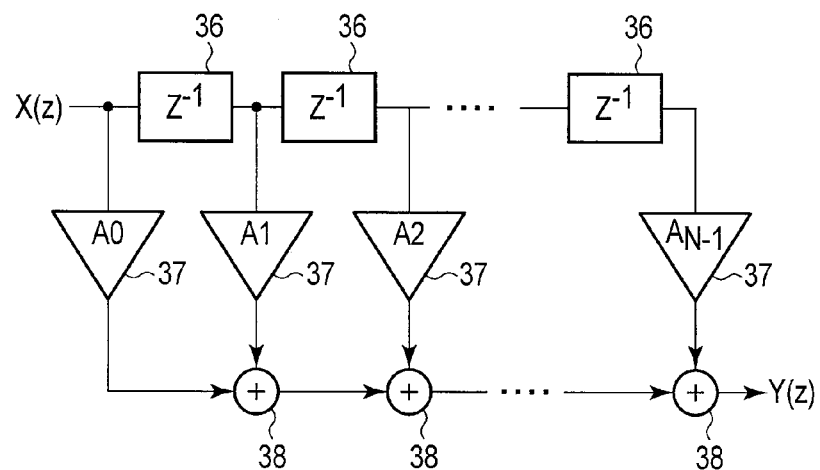
FIG. 17 is a block diagram illustrating an example of an FIR filter.

FIG. 17 is a block diagram illustrating an example of the FIR filter 35. The FIR filter 35 includes a delaying device 36, a coefficient device 37, and an adding device 38. In the FIR filter 35, a value of the past obtained by the delaying device 36 from the input signal X(z) is multiplied by a coefficient of the coefficient device 37, and the multiplied value is added by the adding device 38, so that this is obtained as an output signal Y(z). The number of samples used in this calculation is called the number of taps.

Figure 18:
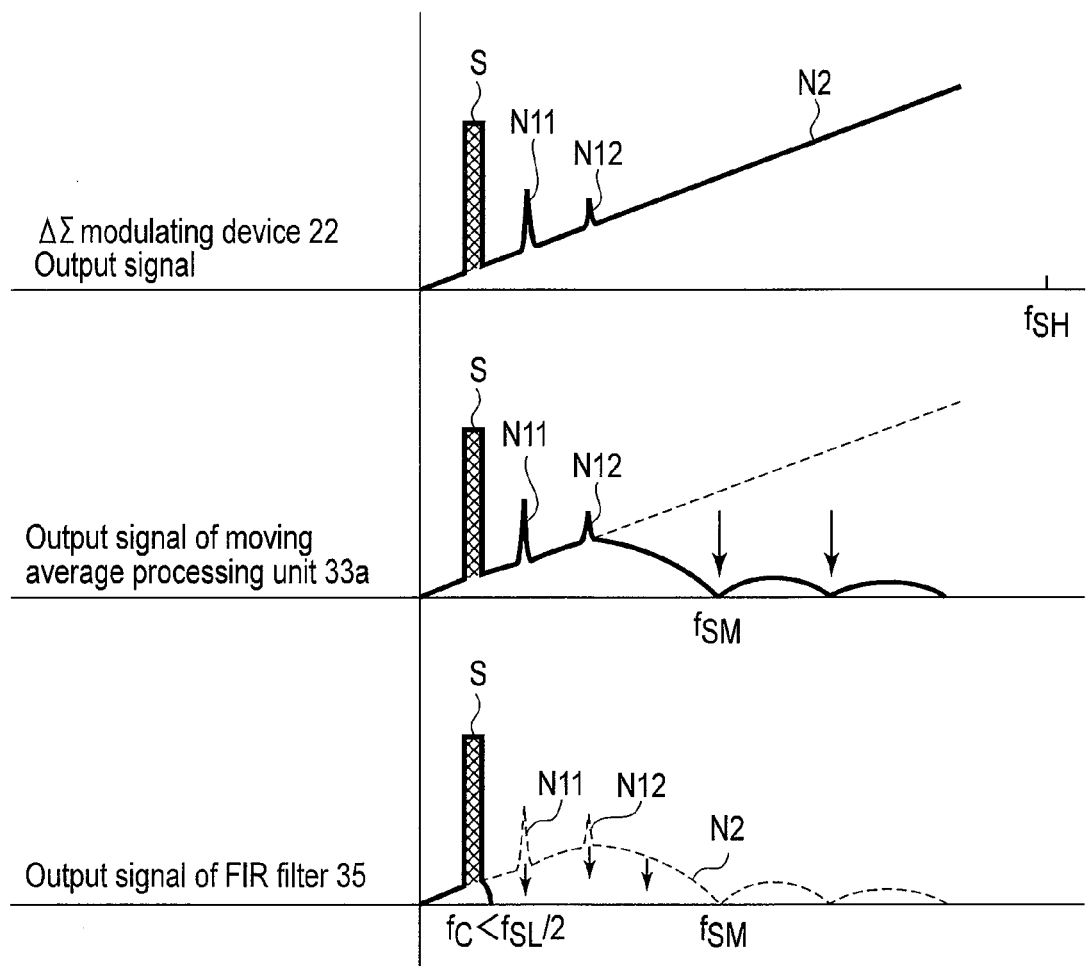
FIG. 18 is a waveform diagram of the digital filter 23 of example 3 as illustrated in FIG. 16.

FIG. 18 is a waveform diagram of the digital filter 23 of example 3 as illustrated in FIG. 16. The output signal of the ΔΣ modulating device 22 indicates the frequency spectrum of the bit stream. This is the same as the output signal of the ΔΣ modulating device 22 of FIG. 14. The output signal of the first stage moving average processing unit 33 is the same as the output signal of the first stage moving average processing unit 33a of FIG. 14.

As illustrated in FIG. 18, the output signal of the FIR filter 35 may have ideal frequency characteristics, but the input frequency fSM of the FIR filter 35 needs to be sufficiently higher than fSL, and in order to ensure the S/N ratio, it is necessary to increase the original sampling frequency as well. In addition, in order to obtain preferable frequency characteristics with the FIR filter 35, the tap length needs to be long, and accordingly, it takes a longer time from input to output than other methods.

If an FIR operation or an FFT operation is directly performed based on the bit stream recorded by the bit stream storage unit 21, it is possible to perform analysis up to high frequency. In such case, for the purpose of off-line process, there is no limitation on the amount of operation and the time of calculation, and therefore, it is possible to achieve this.

Figure 19:
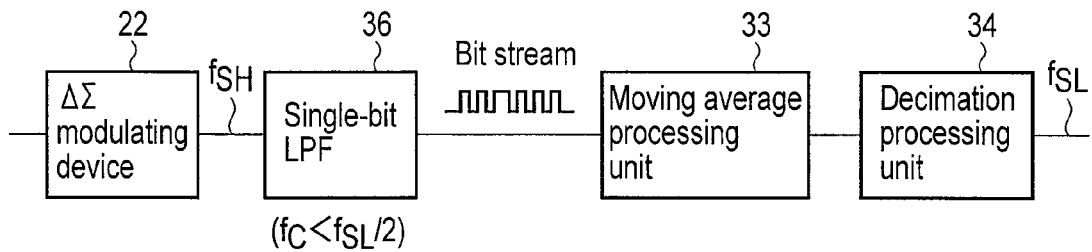
FIG. 19 is a configuration diagram illustrating example 4 of a digital filter.

FIG. 19 is a configuration diagram illustrating example 4 of the digital filter 23. In contrast to the digital filter 23 of example 1 as illustrated in FIG. 13, the digital filter 23 of this example 4 is provided with a single-bit LPF 36 instead of the first stage moving average processing unit 33a and the decimation processing unit 34a. In other words, the single-bit LPF 36 using single-bit bit stream for both of input and output is used for the digital filter 23. This single-bit LPF 36 is a bit stream digital filter.

Figure 20:
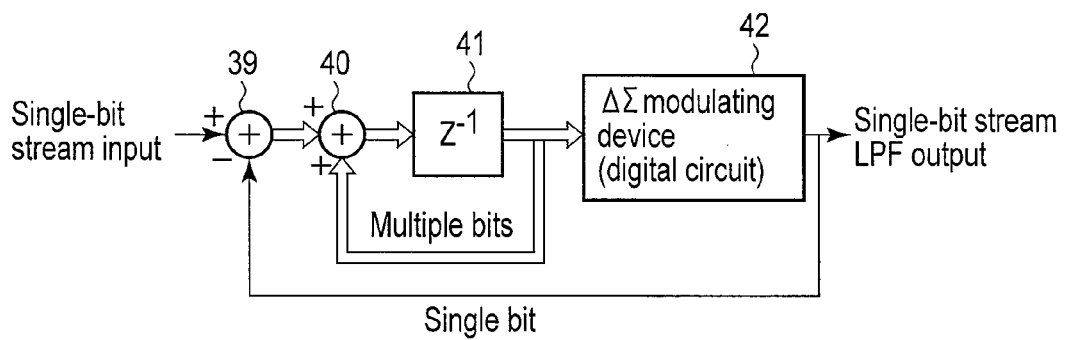
FIG. 20 is a configuration diagram illustrating an example of a bit stream digital filter.

FIG. 20 is a configuration diagram illustrating an example of a bit stream digital filter.

Single-bit stream is input to an adding device 39, and a difference from single-bit stream LPF output, i.e., output from the bit stream digital filter, is calculated. The difference thereof is input to an adding device 40, and is added to multiple bits, i.e., output from a delaying device 41. Then, the ΔΣ modulating device (digital circuit) 42 outputs a single-bit stream LPF output signal. This bit stream digital filter is described in literature such as "Pulsed Neural Networks Based on ΔΣ Modulation and Their Hardware Implementation", Japanese Neural Network Society Journal, Vol. 15, No. 1 (2008), 39-47.

As described above, in the first stage of the digital filter 23, the single-bit digital filter is used, in which a ΔΣ modulating device 42 is provided as the filter output unit, and both of input and output are bit stream type signals, so that the signal pass band fc of the single-bit digital filter is ½ of the ultimate output frequency fSL of the digital filter (fc<fSL/2). In other words, it is smaller than the Nyquist frequency, and the moving average processing is used at the stage subsequent to the single-bit digital filter, so that it decimates (or thins out) and outputs the signal as multi-bit digital data with the moving average process.

FIG. 21 is a waveform diagram of the digital filter of example 4 as illustrated in FIG. 19. The output signal of the ΔΣ modulating device 22 indicates the frequency spectrum of the bit stream. This is the same as the output signal of the ΔΣ modulating device 22 of FIG. 14. The output signal of the single-bit LPF 36 is subjected to the digital filter by the single-bit LPF 36 still in an over sampling state, and accordingly, the out-of-band noises N11, N12 are removed. Although the quantization noise N2 of the ΔΣ modulation is included, it can be removed by the moving average process.

The output signal of the moving average processing unit 33 has ideal frequency characteristics. Since the out-of-band noises N11, N12 are already removed, this does not cause the problem of the noise folded in the signal band by the decimation process. In addition, since the number of bits processed is small, there is an advantage in that the amount of operation is small, and it is possible to prevent an increase in hardware scale and increase in the operation time.

The cycle of the data which are output by the digital filter 23 according to the example 1 to 4 explained above differs according to the processing of the operation processing element 24 in the later stage, and various kinds of cycles are considered. For example, in many cases, data which are output with an electrical angle of 30 degrees or 15 degrees (an electrical angle of 360 degrees corresponds to a period of one cycle of an alternating current) are often used as the cycle of output data for obtaining value information about amplitudes of currents and voltages. In processing for distinguishing the shapes of the current waveforms, electrical angles of 7.5 degrees and 3.75 degrees may be used. Accordingly, the output cycle of the digital filter 23 is either one of electrical angles of 30 degrees, 15 degrees, 7.5 degrees, and 3.75 degrees.

Subsequently, FIG. 22 is a configuration diagram illustrating example 5 of the digital filter 23. The digital filter 23 of this example 5 is constituted by a programmable logic device such as an FPGA (Field Programmable Gate Array) or a CPLD (Complex Programmable Logic Device). In other words, the FPGA or the CPLD is used to constitute the filter unit 43 and the decimation processing unit 34 with programs. Accordingly, the digital filter 23 suitable for various kinds of operation elements 24 can be achieved.

FIG. 23 is a configuration diagram illustrating a second embodiment of a digital-type protection control apparatus according to the embodiments of the present invention. In this second embodiment, the analog/digital conversion unit 2 and the digital operation processing unit 3 are provided within the same apparatus.

An opposing end digital-type protection control apparatus 101A is installed at an electric power station at an opposing end of an electrical power transmission line 51 of the electric power station in which the digital-type protection control apparatus 101 is installed. The electrical power transmission line 51 is connected to a bus wire 53 of the electric power station via a circuit breaker 52. A transformer CT detects a current of the electrical power transmission line 51, and the detected current is input to a ΔΣ modulating device 22 via an auxiliary CT 50 and an analog filter 30 of the analog/digital conversion unit 2a. Likewise, a transformer PT detects a voltage of the electrical power transmission line 51, and the detected voltage is input to a ΔΣ modulating device 22 via an auxiliary CT 50 and an analog filter 30 of the analog/digital conversion unit 22b. In other words, the analog/digital conversion unit 2a converts the current into a digital quantity and outputs it as a bit stream, and the analog/digital conversion unit 2b converts the voltage into a digital quantity and outputs it as a bit stream. The bit streams from these ΔΣ modulating devices 22 are output to the digital operation processing unit 3 and the bit stream storage unit 21 as an electrical signal or an optical signal.

In a digital operation processing unit 3, digital filters 23 receive the bit streams, and the signals having been subjected to a filter process by the digital filters 23 are output to the operation processing elements 24, in which various kinds of protection operation processing are performed. In FIG. 23, the operation processing element 24 performing a protection relay operation performs operation processing of a current differential relay, a distance relay, an insufficient voltage relay, and an excessive voltage relay, and based on the operation result, a sequence processing unit 54 outputs a trip instruction to a circuit breaker 52. The processing result of the sequence processing unit 54 is transmitted via a transmission path 55 to the opposing end digital protection control apparatus 101A. On the other hand, other individual operation processing elements 24 perform operation processing of system monitoring control operation means, malfunctioning point evaluation operation means, accident waveform analyzing means, and harmonic measuring means. Further, the bit stream recorded in the bit stream storage unit 21 is transmitted, as necessary, by a communication interface 49 via a network 56 to another electric power station 57 and another digital protection control apparatus 101.

As described above, both of the analog/digital conversion unit 2 and the digital operation processing unit 3 are provided in the same apparatus of the digital-type protection control apparatus 101 installed in the electric power station, and therefore, the signal transmission distance between the analog/digital conversion unit 2 and the digital operation processing unit 3 can be short. In addition, since the bit stream recorded in the bit stream storage unit 21 is transmitted, as necessary, via the network 56 to another electric power station 57 and another digital protection control apparatus 101, this can be effectively used in the system analyzing process performed later.

Figure 24:
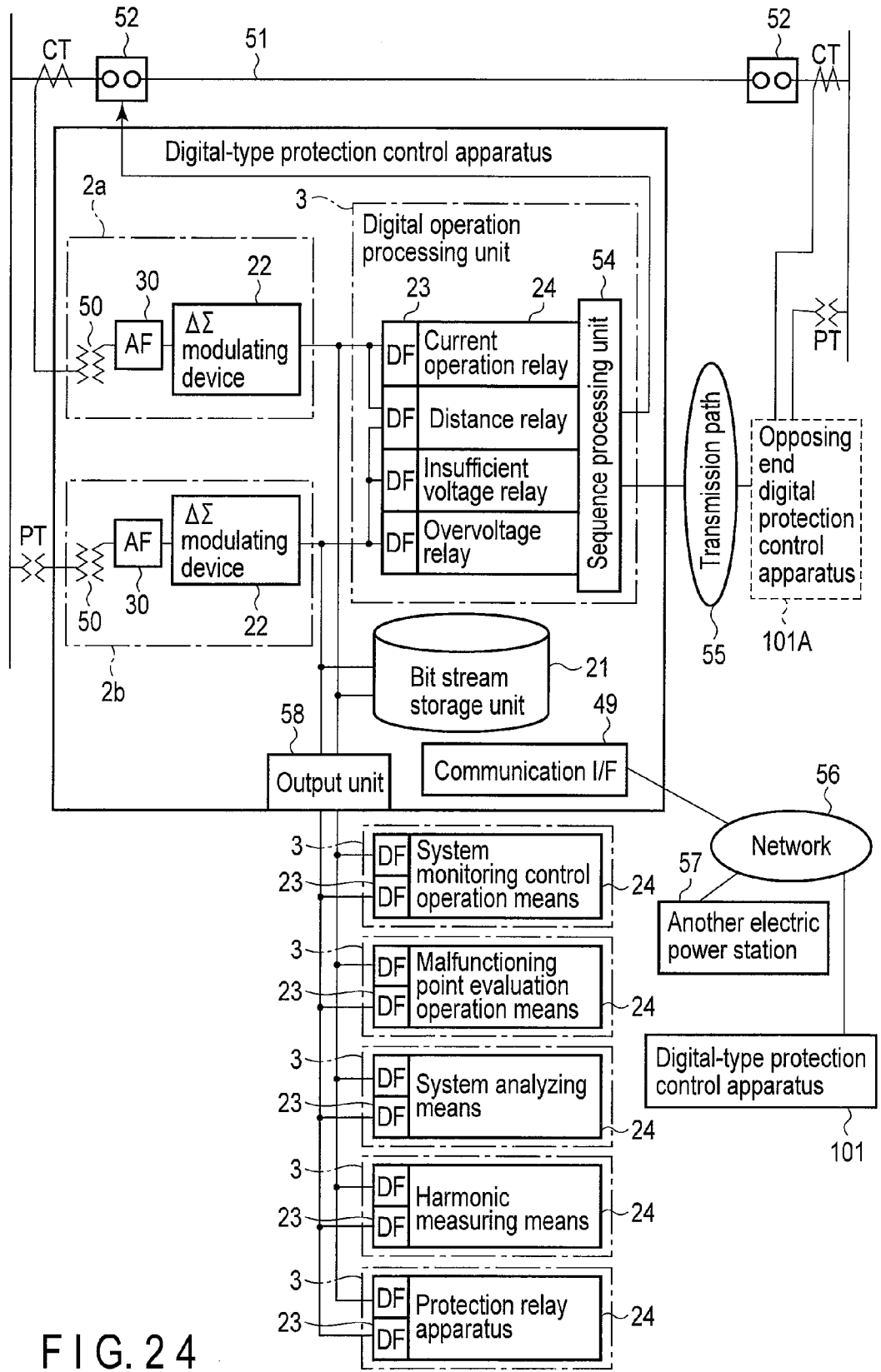
FIG. 24 is a configuration diagram illustrating a third embodiment of a digital-type protection control apparatus according to the embodiments of the present invention.

Subsequently, FIG. 24 is a configuration diagram illustrating a third embodiment of a digital-type protection control apparatus according to the embodiments of the present invention. In contrast to the second embodiment as illustrated in FIG. 23, this third embodiment is configured such that one of the digital operation processing units 3 and the analog/digital conversion unit 2 of the digital-type protection control apparatus 101 are provided in the same apparatus, and the remaining portion of the digital operation processing units 3 are provided outside of the apparatus. FIG. 24 illustrates a case where an operation processing element 24 for performing protection relay operation is provided in the same apparatus as the analog/digital conversion unit 2. The same elements as those of FIG. 23 are denoted with the same reference numerals, and a repeated explanation thereof is omitted.

The digital operation processing units 3 provided outside of the same apparatus are digital operation processing units for performing protection control operations of a system monitoring control operation means, malfunctioning point evaluation operation means, a system analyzing apparatus, harmonic measuring means, and a protection relay apparatus. The bit streams obtained from the ΔΣ modulating devices 22 of the analog/digital conversion units 2a, 2b are provided via the output unit 58 to these digital operation processing units 3 provided outside of the same apparatus.

Figure 25:
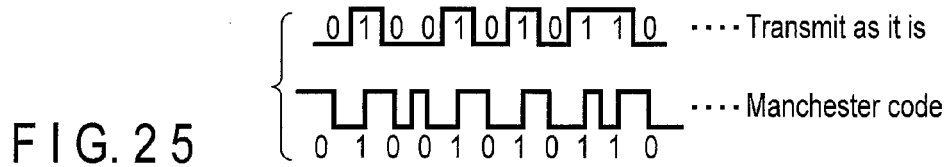
FIG. 25 is an explanatory diagram illustrating a transmission signal in a digital-type protection control apparatus according the third embodiment of the present invention.

The bit streams from the ΔΣ modulating devices 22 of the analog/digital conversion units 2a, 2b to the external digital operation processing units 3 are considered to be transmitted as follows. The output unit 58 converts the bit streams from the ΔΣ modulating device 22 into electrical or optical transmission signals, and transmits the signals according to various kinds of transmitting methods such as normal transmission in units of bits and transmission using Manchester code as illustrated in FIG. 25. In a method for transmitting an optical signal, transmission can be performed with a high degree of resistance to noise in a transformer substation where there is a harsh noise environment.

Accordingly, even when some of the digital operation processing units 3 are provided outside of the apparatus in which the analog/digital conversion units 2a, 2b are provided, the bit streams obtained from the ΔΣ modulating devices 22 of the analog/digital conversion units 2a, 2b can be provided to the digital operation processing unit 3 via the output unit 58, and therefore, digital operation processing units 3 which are added later can be arranged outside of the apparatus in which the analog/digital conversion units 2a, 2b are provided.

Figure 26:
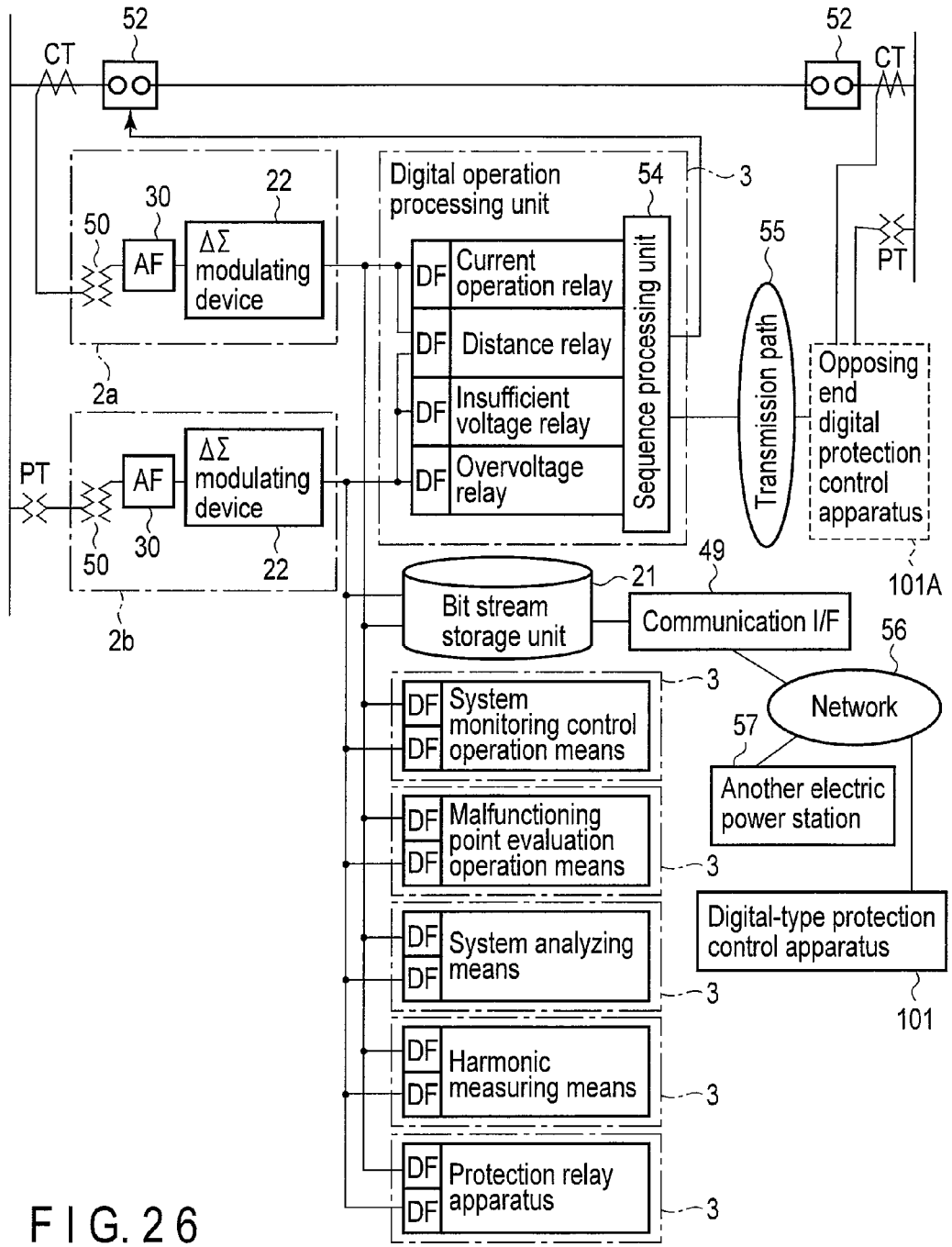
FIG. 26 is a configuration diagram illustrating a fourth embodiment of a digital-type protection control apparatus according to the embodiments of the present invention.

Subsequently, FIG. 26 is a configuration diagram illustrating a fourth embodiment of a digital-type protection control apparatus according to the embodiments of the present invention. In contrast to the third embodiment as illustrated in FIG. 24, this fourth embodiment is configured such that an analog/digital conversion unit 2 and all digital operation processing units 3 are provided in separate apparatuses. The same elements as those of FIG. 24 are denoted with the same reference numerals, and a repeated explanation thereof is omitted.

As illustrated in FIG. 26, analog/digital conversion units 2a, 2b and the digital operation processing units 3 are provided as separate apparatuses. Bit streams from the analog/digital conversion units 2a, 2b are distributed via dedicated cables to a bit stream storage unit 21 and the respective digital operation processing units 3. Therefore, since the bit streams are distributed via the dedicated cables, collision does not occur in transmission, and the bit streams can be transmitted easily.

FIG. 27 is a configuration diagram illustrating a fifth embodiment of a digital-type protection control apparatus according to the embodiments of the present invention. In the fifth embodiment, analog/digital conversion units 2 and digital operation processing units 3 are configured as separate apparatuses, and bit streams are transmitted from ΔΣ modulating devices of analog/digital conversion units 2 to digital operation processing units 3 via a network 59. In addition, a bit stream storage unit 21 is configured as an apparatus separate from the analog/digital conversion unit 2 and the digital operation processing unit 3. The same elements as those of FIG. 26 are denoted with the same reference numerals, and a repeated explanation thereof is omitted.

The analog/digital conversion unit 2 having the ΔΣ modulating device Δ is provided at each predetermined portion of an electric power system, and the bit streams from the Σ modulating devices of the analog/digital conversion units 2 are transmitted to the general-purpose network 59.

Accordingly, the data obtained from the ΔΣ modulating devices 22 can be shared with multiple digital operation processing units 3, and the digital operation processing units 3 can obtain information about all the electric quantities within the electric power station, and can perform operations with regard to occurrence of an accident and the state of currents and voltages inside and outside of the electric power station. When single-bit data are transmitted, sampled information can be used without losing any information, and the information can be used for the digital operation processing units 3 requiring either a high resolution or wide band.

Figure 28:
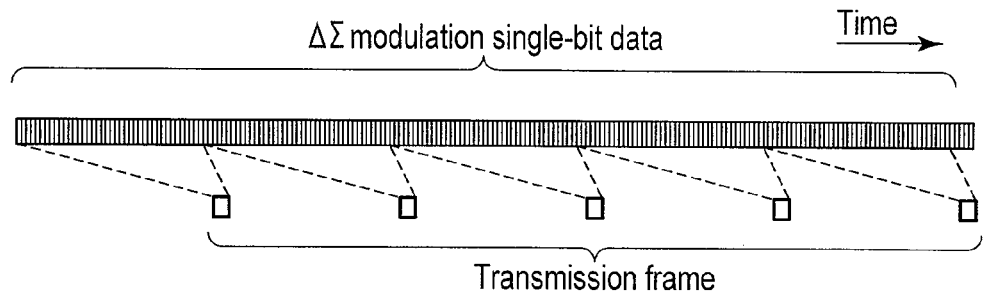
FIG. 28 is an explanatory diagram for arranging breaks when transmitting a bit stream from a ΔΣ modulating device according to the fifth embodiment of the present invention.

FIG. 28 is an explanatory diagram for arranging breaks when transmitting a bit stream from a ΔΣ modulating device. As illustrated in FIG. 28, the bit stream from the ΔΣ modulating device is continuous in time. On the other hand, for example, when transmitting via a general-purpose Ethernet (registered trademark), transmission is made in units of frames. Therefore, as illustrated in FIG. 28, the bit streams are broken into pieces and transmitted.

Figure 29:
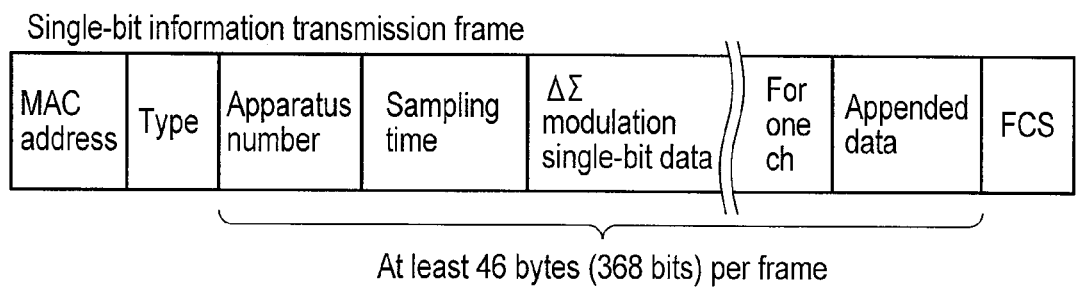
FIG. 29 is an explanatory diagram illustrating a transmission format of a bit stream from the ΔΣ modulating device according to the fifth embodiment of the present invention.

FIG. 29 is an explanatory diagram illustrating a transmission format of a bit stream from the ΔΣ modulating device. After the bit stream from the ΔΣ modulating device is broken into pieces, a device number for indicating from which ΔΣ modulating device the data are transmitted, a time of sampling, and appended data are added thereto, and it is transmitted as a transmission frame as illustrated in FIG. 29. In the specification of Ethernet (registered trademark), the minimum data length per frame is 46 bytes (368 bits), and in a channel in which the bit stream is transmitted during that time, the transmission path is occupied.

In the example as illustrated in FIG. 29, the transmission format includes a device number, a sampling time, a bit stream, and appended data in this order, but this order can be changed in various ways. As the appended data, it is necessary to have information such as the length of the bit stream included in the frame and the frequency of the bit stream. In addition, it is also possible to transmit, as other preliminary information, for example, check codes such as a CRC and a parity, error-correcting code, and other signals of input specifications at the side of ΔΣ modulating device (signal full sale, the order of the modulating device, and the like).

Figure 30:
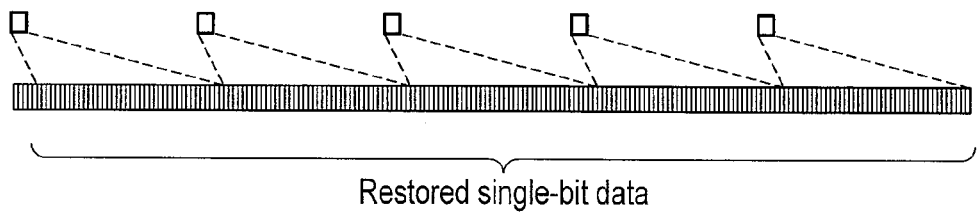
FIG. 30 is an explanatory diagram of a reception frame at a reception side of a bit stream from the ΔΣ modulating device according to the fifth embodiment of the present invention.

FIG. 30 is an explanatory diagram of a reception frame at a reception side of a bit stream from the ΔΣ modulating device. As illustrated in FIG. 30, at the reception side, data from the reception frames are combined, whereby a bit stream is recovered.

FIG. 31 is a configuration diagram illustrating a recovering processing unit for recovering a bit stream from the ΔΣ modulating device at the reception side. As illustrated in FIG. 31, first, a frame receiving unit 60 receives a frame, and a data extracting unit 61 extracts a ΔΣ modulated bit stream, and saves the bit stream to a FIFO (first-in first-out) memory 62. The data saved in the FIFO memory 62 can be continuously read, and a reading processing unit 63 reads the data. The data are processed with a decimation filter of the digital filter 23, and are input to an operation processing element 24.

As described above, the bit stream from the ΔΣ modulating device of the analog/digital conversion unit 2 can be transmitted to multiple digital operation processing units 3 as they are, and even when the analog/digital conversion unit 2 is provided for each digital operation processing unit 3, it is possible to use A/D conversion data of the required sampling frequency and resolution.

FIG. 32 is a configuration diagram illustrating an analog/digital conversion unit in a sixth embodiment of a digital-type protection control apparatus according to the embodiments of the present invention. In contrast to the fifth embodiment as illustrated in FIG. 27, this sixth embodiment is configured such that a bit stream storage unit 21 is provided within an analog/digital conversion unit 2.

The analog/digital conversion units 2 and digital operation processing units 3 are arranged at separate locations, and bit stream data from the ΔΣ modulating device of the analog/digital conversion unit 2 are transmitted via a network 59 to the network 59. The bit data recording unit 21 is provided within the analog/digital conversion unit 2. Therefore, the bit stream recorded in the bit data recording unit 21 is transmitted to the digital operation processing unit 3 by a communication I/F 49 upon request of the digital operation processing unit 3.

The recording and the transmission of the bit stream are not started at all times. The recording and the transmission of the bit stream are started only when necessary, for example, only when there is a request from the side of the digital operation processing unit 3. Examples of conditions for recording the bit stream are as follows. When an accident occurs in an electric power system, recording is started, or when it is a predetermined time set in advance, recording is started. On the other hand, examples of conditions for transmitting the recorded bit stream are as follows. When recording of the bit stream is completed, the bit stream is transmitted. Alternatively, in view of the vacancy state of the transmission path, the bit stream is transmitted.

Figure 33:
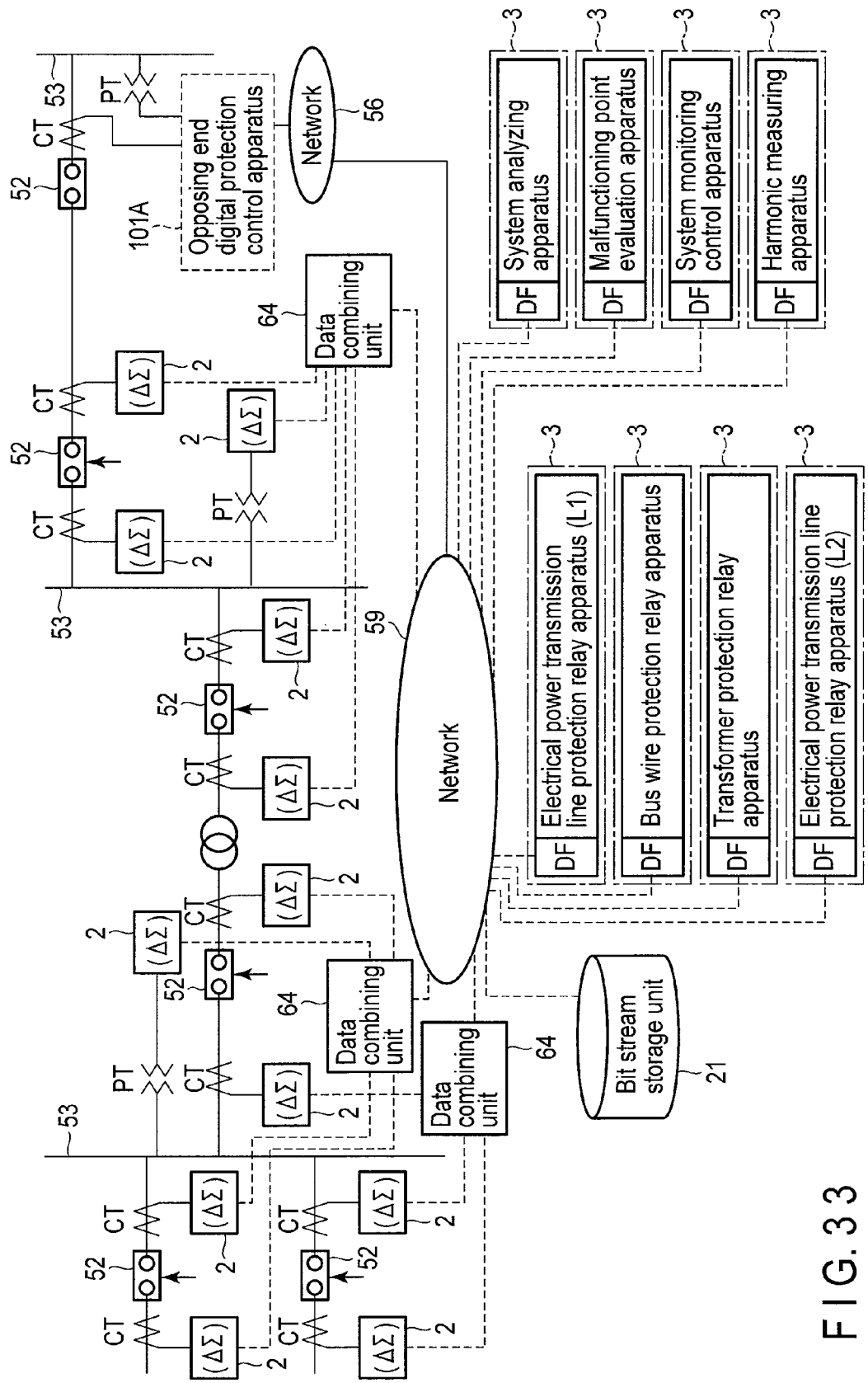
FIG. 33 is a configuration diagram illustrating a seventh embodiment of a digital-type protection control apparatus according to the embodiments of the present invention.

FIG. 33 is a configuration diagram illustrating a seventh embodiment of a digital-type protection control apparatus according to the embodiments of the present invention. In contrast to the fifth embodiment as illustrated in FIG. 27, this seventh embodiment is provided with a data combining unit 64 for combining bit streams from ΔΣ modulations of multiple analog/digital conversion units 2, thereby making transmission frames in units of bytes and transmitting the transmission frames to a network 59. The same elements as those of FIG. 27 are denoted with the same reference numerals, and a repeated explanation thereof is omitted.

As illustrated in FIG. 33, the analog/digital conversion devices 2 having the ΔΣ modulating devices and digital operation processing units 3 are installed at separate locations. Accordingly, the bit streams are transmitted via the network 59. At this occasion, the data combining unit 64 combines the bit streams from the ΔΣ modulating devices of the multiple analog/digital conversion devices 2, and generates and transmits the transmission frames in units of bytes.

FIG. 34 is a configuration diagram illustrating an example of the data combining unit 64. FIG. 34 illustrates a case where bit streams are input from eight ΔΣ modulating devices 22. As illustrated in FIG. 34, the data combining unit 64 inputs the bit streams provided by the multiple ΔΣ modulating devices 22 into bit stream recording means 65 and frame generating means 66 in parallel. The bit stream recording means 65 records the bit streams provided by the multiple ΔΣ modulating devices 22 in parallel. In other words, the bit streams provided by the multiple ΔΣ modulating devices 22 are individually recorded. On the other hand, the frame generating means 66 divides the bit streams provided by the multiple ΔΣ modulating devices 22 into predetermined pieces and combines them, thereby making transmission frames in units of bytes.

Figure 36:
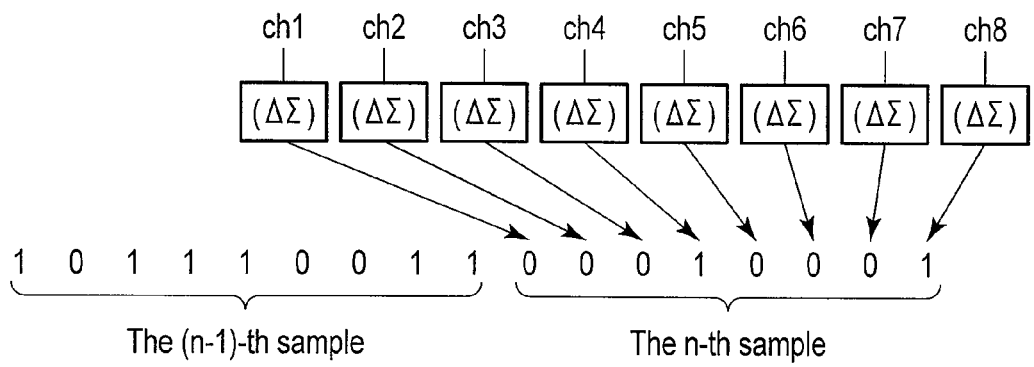
FIG. 36 is an explanatory diagram illustrating an example of a method for combining bit streams from multiple ΔΣ modulating devices according to the seventh embodiment of the present invention.

FIG. 35 is an explanatory diagram illustrating a transmission frame generated from bit streams from the multiple ΔΣ modulating devices. As illustrated in FIG. 35, the bit streams provided by the multiple ΔΣ modulating devices 22 are divided into predetermined pieces, which are combined, whereby transmission frames are generated in units of bytes. FIG. 36 is an explanatory diagram illustrating an example of a method for combining bit streams from the eight ΔΣ modulating devices 22. As illustrated in FIG. 36, eight bit streams are combined into one for every n samples, and made into one byte. Then, bytes are further combined to make a transmission frame of a predetermined length. The data transmitting means 67 transmits transmission frames generated by the frame generating means 66 to the digital operation processing units 3 and the bit stream storage unit 21 via the network 59 which is a communication path. In addition, as necessary, the bit streams recorded in the bit stream storage unit 65 are transmitted via the network 59 to the digital operation processing units 3 and the bit stream storage unit 21.

Therefore, one ΔΣ modulating device 22 does not continuously transmit data by occupying the transmission path, so that the response time of the system can be improved. The generating function of the transmission frames with which the bit streams are transmitted to the network 59, i.e., the communication path, is provided in the data combining unit 64, and therefore, it is not necessary for the ΔΣ modulating device 22 to have the generating function of the transmission frames, so that the configuration of the ΔΣ modulating device 22 becomes simple.

Figure 37:
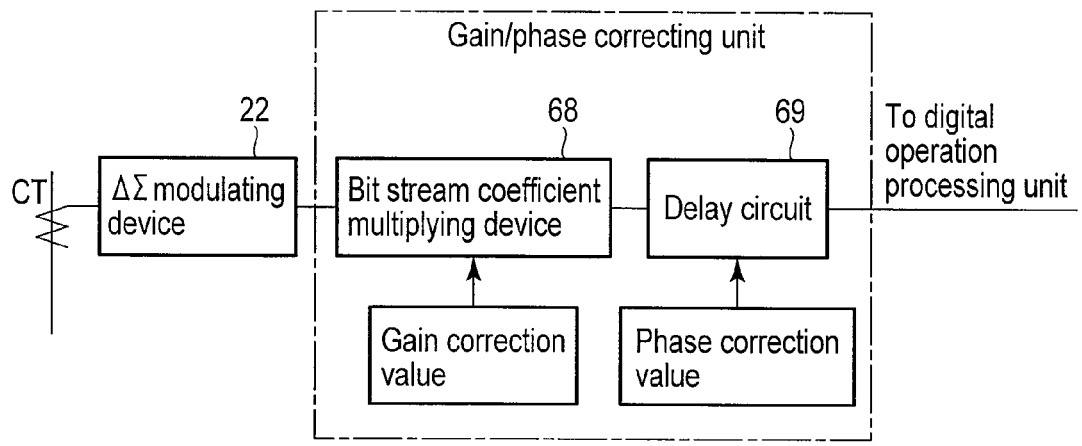
FIG. 37 is a configuration diagram illustrating a gain/phase correcting unit of an eighth embodiment of a digital-type protection control apparatus according to the embodiments of the present invention.

FIG. 37 is a configuration diagram illustrating a gain/phase correcting unit of an eighth embodiment of a digital-type protection control apparatus according to the embodiments of the present invention. An auxiliary CT 50 and an analog filter 30 of an analog/digital conversion unit 2 involve displacement of gain and phase, and therefore, it is necessary to correct them.

Figure 38:
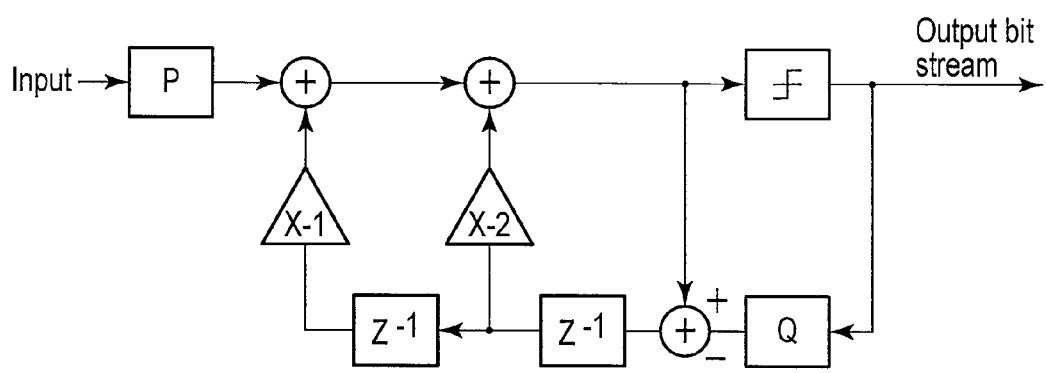
FIG. 38 is a circuit diagram illustrating an example of a bit stream coefficient multiplying device of FIG. 37.

Therefore, in order to correct the gain, a bit stream coefficient multiplying device 68 is used. FIG. 38 is a circuit diagram illustrating an example of the bit stream coefficient multiplying device 68. This bit stream coefficient multiplying device outputs, as an output bit stream, a signal obtained by multiplying an input bit stream by P/Q. For example, when it is necessary to perform gain correction of +1%, operation is performed with the following condition, e.g., P=101, Q=100. This is described, for example, in a document "Single-bit digital Signal Processing for Current Control of Brushless DC Motor" (Kurosawa et al.).

On the other hand, the phase correction is achieved by causing a delay circuit 69 to delay the output of the bit streams. For example, in a case of 737280 Hz in a system of 60 Hz, each clock is 0.03 degrees, and in order to correct for 1 degree (advancement), this can be corrected by a delay of 34 clocks.

Subsequently explained is a case where the analog/digital conversion units 2 and the digital operation processing units 3 are used as protection apparatuses for the electric power system. Multiple analog/digital conversion units 2 and multiple digital operation processing units 3 are installed within an electric power station (for example, transformer substation) of an electric power system, and the analog/digital conversion units 2 and the digital operation processing units are connected via a transmission path. A dedicated circuit, Ethernet (registered trademark), a wireless communication, and the like are used as transmission paths. Data obtained from the ΔΣ modulating devices of the analog/digital conversion units 2 are transmitted to the digital operation processing units 3 via the transmission path. Therefore, the digital operation processing unit 3 can obtain information about all the electric quantities within the electric power station, and is capable of performing operation with regard to the state of currents and voltages and occurrence of an accident within and outside of the electric power station. For example, this enables electrical power transmission line protection, bus wire protection, apparatus protection, and the like.

In other words, an electrical power transmission line can be protected by making a distance relay that receives the voltages and the currents of the electrical power transmission line, obtains an impedance to the point where the accident occurs, and operates when the impedance is within a predetermined range. A bus wire can be protected by making a differential relay that receives the current of each circuit connected to the bus wire of a transformer substation, calculates a summation thereof, and operates when the summation is more than a predetermined magnitude. A transformer can also be protected by making a differential relay that receives currents of both sides of the transformer. In addition, protection of apparatuses such as generators and reactors can be achieved.

In this case, when transmission is performed with the bit streams from the ΔΣ modulating devices of the analog/digital conversion units 2, the sampled information can be used without losing any information, and this can be used for applications requiring either a high resolution or a wide band.

When there are many detection portions of electric quantities in an electric power station, it is necessary to pay attention to the data capacity in a transmission path. Depending on the size of the electric power station, there are 100 or more detection portions of electric quantities, but when it is assumed that there are 100 portions and the transmission path is Gigabit Ethernet (registered trademark) (1 Gbps), the quantity of data that can be transmitted per portion is 10 Mbps or less, and the possible sampling frequency with the bit stream is 10 MHz or less. Therefore, in this case, the sampling frequency is set at 10 MHz or less.

FIG. 39 is a configuration diagram illustrating an example where a differential relay is formed using digital operation processing units 2 and analog/digital conversion units 3. As illustrated in FIG. 39, the ΔΣ modulating devices 22 of the analog/digital conversion units 2 and the digital operation processing units 3 are installed in multiple electric power stations 70 in different electric power systems. The bit streams obtained from the ΔΣ modulating devices 22 of the analog/digital conversion units 2 are transmitted to other transformer substations 70 via a transmission path 71, and the digital filter (decimation filter) 23 of the digital operation processing unit 3 converts the bit streams into multi-bit data, which are input to the operation processing element 24 of the digital operation processing unit 3.

Therefore, the operation processing element 24 of the digital operation processing unit 3 can obtain information about the electric quantities of the different electric power stations 7, and is capable of protection relay operation (differential protection operation) for the electrical power transmission lines among the electric power stations 70. It should be noted that a dedicated circuit, Ethernet (registered trademark), a wireless communication, and the like are used as the transmission path.

FIG. 40 is an explanatory diagram of a differential protection relay method for an electrical power transmission line accident among transformer substations. In normal circumstances, an electrical power transmission line current IA at a transformer substation A is equal to an electrical power transmission line current IB at a transformer substation B. On the other hand, when a ground fault accident occurs in an electrical power transmission line between the transformer substation A and the transformer substation B, the electrical power transmission line current IA at the transformer substation A becomes unequal to the electrical power transmission line current IB at the transformer substation B. A ground fault accident of the electrical power transmission line between the transformer substation A and the transformer substation B can be determined using current data of both of the transformer substation A and the transformer substation B.

Figure 41:
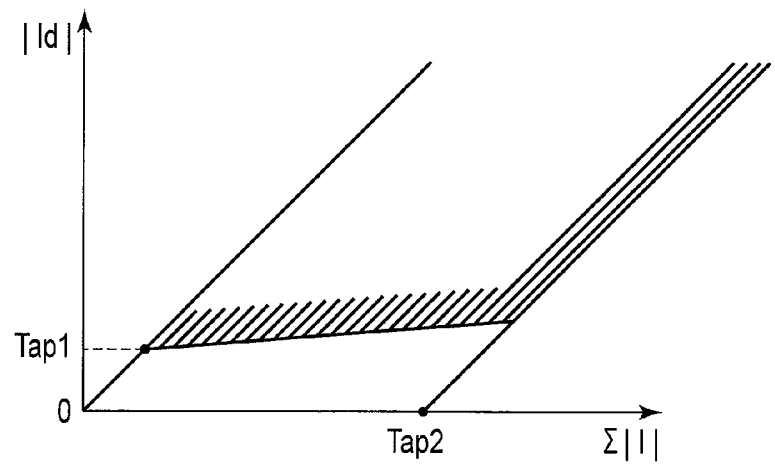
FIG. 41 is a characteristic diagram illustrating operation characteristics of a differential protection relay method.

FIG. 41 is a characteristic diagram illustrating operation characteristics of a differential protection relay method. When a current difference Id (=IA−IB) increases, this is determined to be a ground fault accident, but in order to prevent malfunctions due to an error of the analog/digital conversion unit 2, the threshold value of the current difference Id at which the ground fault accident is determined is increased as the total current ΣId (the amount of suppression) increases. When the bit stream type analog/digital conversion is used, currently, the data are transmitted as A/D conversion data with 12-bit resolution because of the limitation of the transmission path between the transformer substations, but with the use of the bit stream type analog/digital conversion, there is an advantage in that the data can be transmitted with a higher degree of resolution. Therefore, the accuracy of operation can be improved as the protection relay device.

Figure 42:
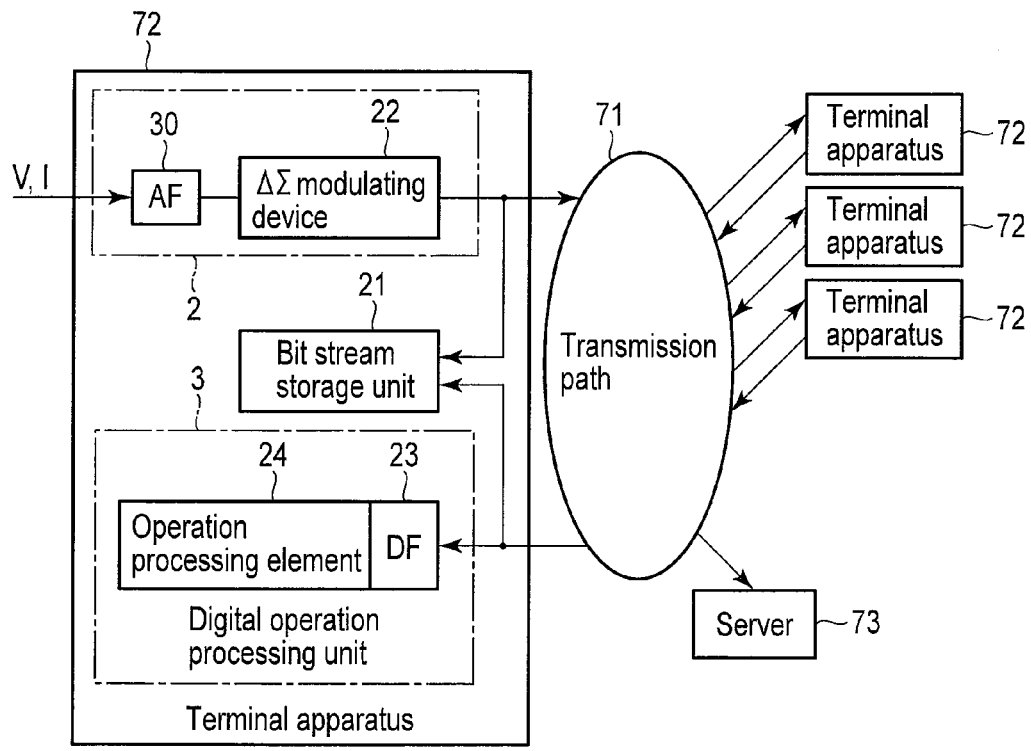
FIG. 42 is a configuration diagram illustrating a ninth embodiment of a digital-type protection control apparatus according to the embodiments of the present invention.

FIG. 42 is a configuration diagram illustrating a ninth embodiment of a digital-type protection control apparatus according to the embodiments of the present invention. In the ninth embodiment, a terminal apparatus 72 including an analog/digital conversion unit 2 and a digital operation processing unit 3 is connected to a server 73 via a transmission path, and the server 73 uses bit streams provided by a ΔΣ modulating device 22 of the analog/digital conversion unit 2 to perform protection control operation and system phenomenon analysis over a wide region of the electric power system.

The terminal apparatus 72 includes the analog/digital conversion unit 2, the digital operation processing unit 3, and the bit stream storage unit 21, and is installed at each location of the electric power system and is connected to the transmission path 71. The server 73 is also connected to the transmission path 71. A dedicated circuit, Ethernet (registered trademark), a wireless communication, and the like are used as the transmission path 71.

Each of the terminal apparatuses 72 performs predetermined protection control with the digital operation processing unit 3. On the other hand, the server 73 receives the bit stream from the ΔΣ modulating device 22 of the analog/digital conversion unit 2 of each of the terminal apparatuses 72, and performs protection control operation and system phenomenon analysis over a wide region of the electric power system.

Since the server 73 receives the bit streams from the ΔΣ modulating device 22 of the analog/digital conversion unit 2 of each of the terminal apparatuses 72, the server 73 can obtain information about the electric quantities from the terminal apparatus 72 at each location of the electric power system. The server 73 has a higher performance than that of the digital operation processing unit 3 of an ordinary terminal apparatus 72, and the software thereof can be added to or changed. Therefore, the server 73 can perform various kinds of highly sophisticated protection control operation processing. Therefore, the server 73 can perform, e.g., protection control operation and system phenomenon analysis over a wide region of the electric power system.

Figure 43:
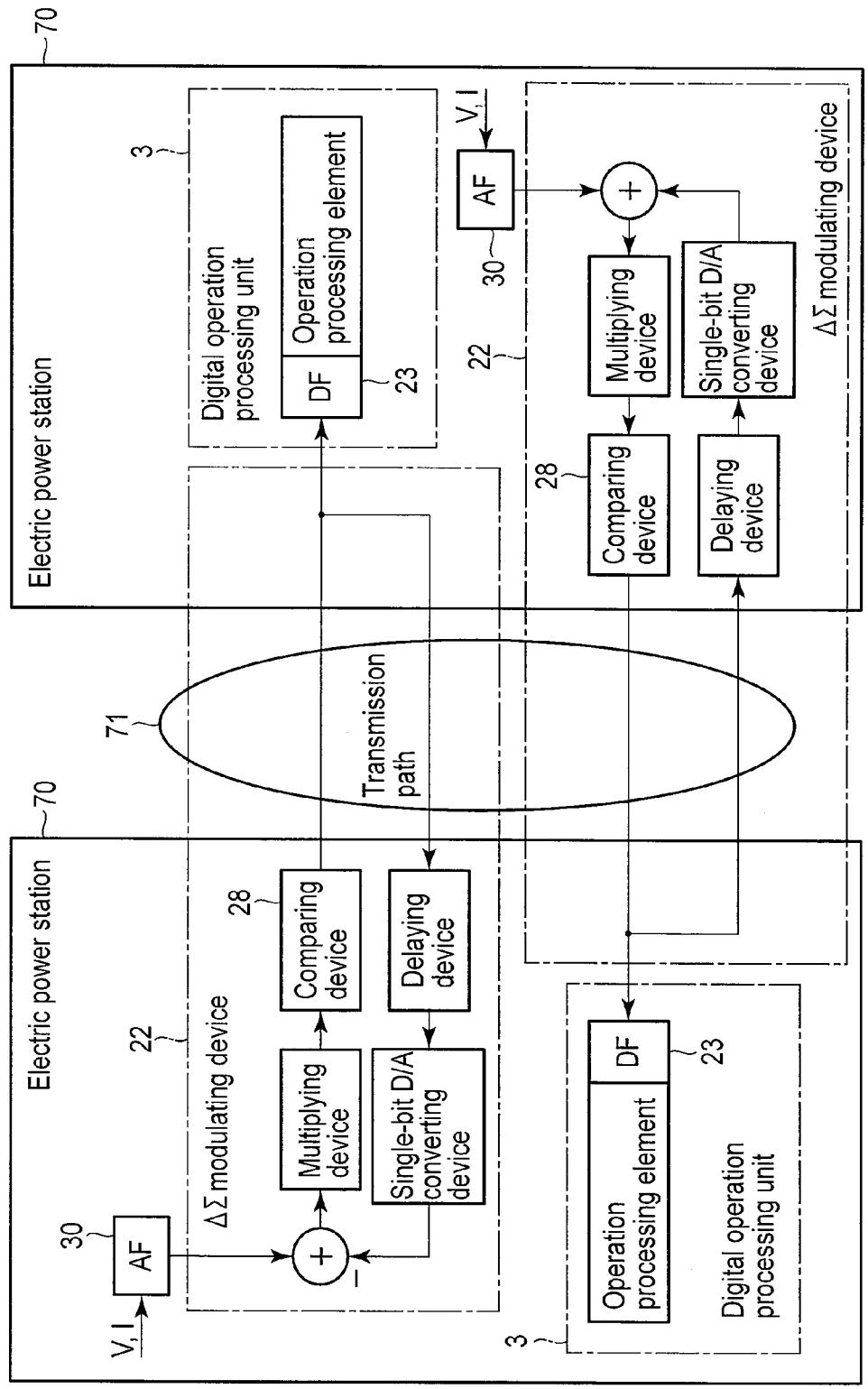
FIG. 43 is a configuration diagram illustrating a tenth embodiment of a digital-type protection control apparatus according to the embodiments of the present invention.

FIG. 43 is a configuration diagram illustrating a tenth embodiment of a digital-type protection control apparatus according to the embodiments of the present invention. In the tenth embodiment, a feedback loop of a ΔΣ modulating device 22 of an analog/digital conversion unit 2 is configured to include a transmission path connecting both-end transformer substations of an electrical power transmission line.

As illustrated in FIGS. 4A and 4B, the ΔΣ modulating device 22 includes a comparing device 28 at an output unit. Accordingly, as illustrated in FIG. 43, the output of the comparing device 28 of the ΔΣ modulating device 22 is transmitted to the digital operation processing unit 3 of the opposing-end electric power station 70 and is connected back, so that the feedback loop of the ΔΣ modulating device 22 is made over the transmission path 71.

In this configuration, first, the bit stream transmitted from the comparing device 28 of the ΔΣ modulating device 22 passes through the transmission path 71 and returns back as feedback. A determination can be made as to whether there is a transmission error by checking whether this returned bit stream is the same as what has been transmitted. Moreover, even if no transmission error is detected, the following advantage can be obtained: when data are garbled in the transmission path, the influence caused by this change can be cancelled.

Figure 45:
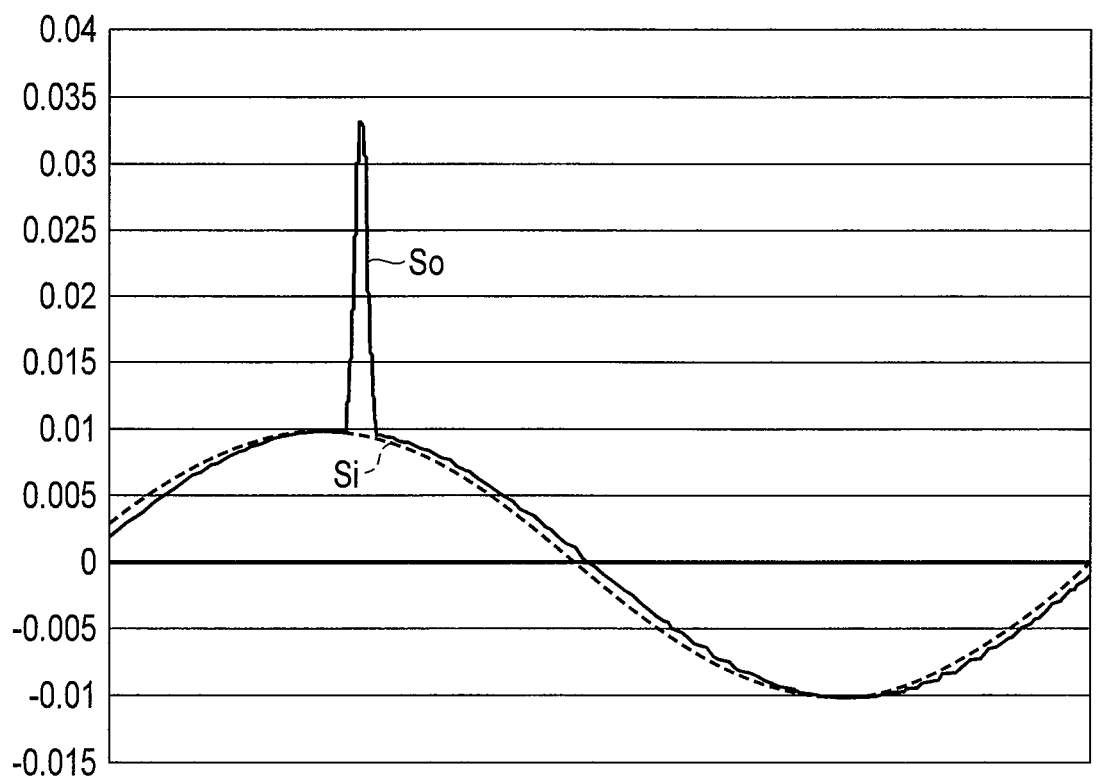
FIG. 45 is a waveform diagram of an output So of a digital filter and an input signal Si of the ΔΣ modulating device where the feedback loop of the ΔΣ modulating device does not pass through the transmission path, according to the embodiments of the present invention.

FIG. 44 is a configuration diagram illustrating a ΔΣ modulating device 22 where a feedback loop of the ΔΣ modulating device 22 does not pass through a transmission path 71. When a garbled bit 74 occurs in the transmission path 71 where the feedback loop of the ΔΣ modulating device 22 does not pass through the transmission path 71, the feedback is not given via the transmission path 71. As illustrated in FIG. 45, an influence caused by the garbled bit 74 appears in an output So of a digital filter (decimation filter) 23 with respect to an input signal Si of the ΔΣ modulating device 22.

Figure 46:
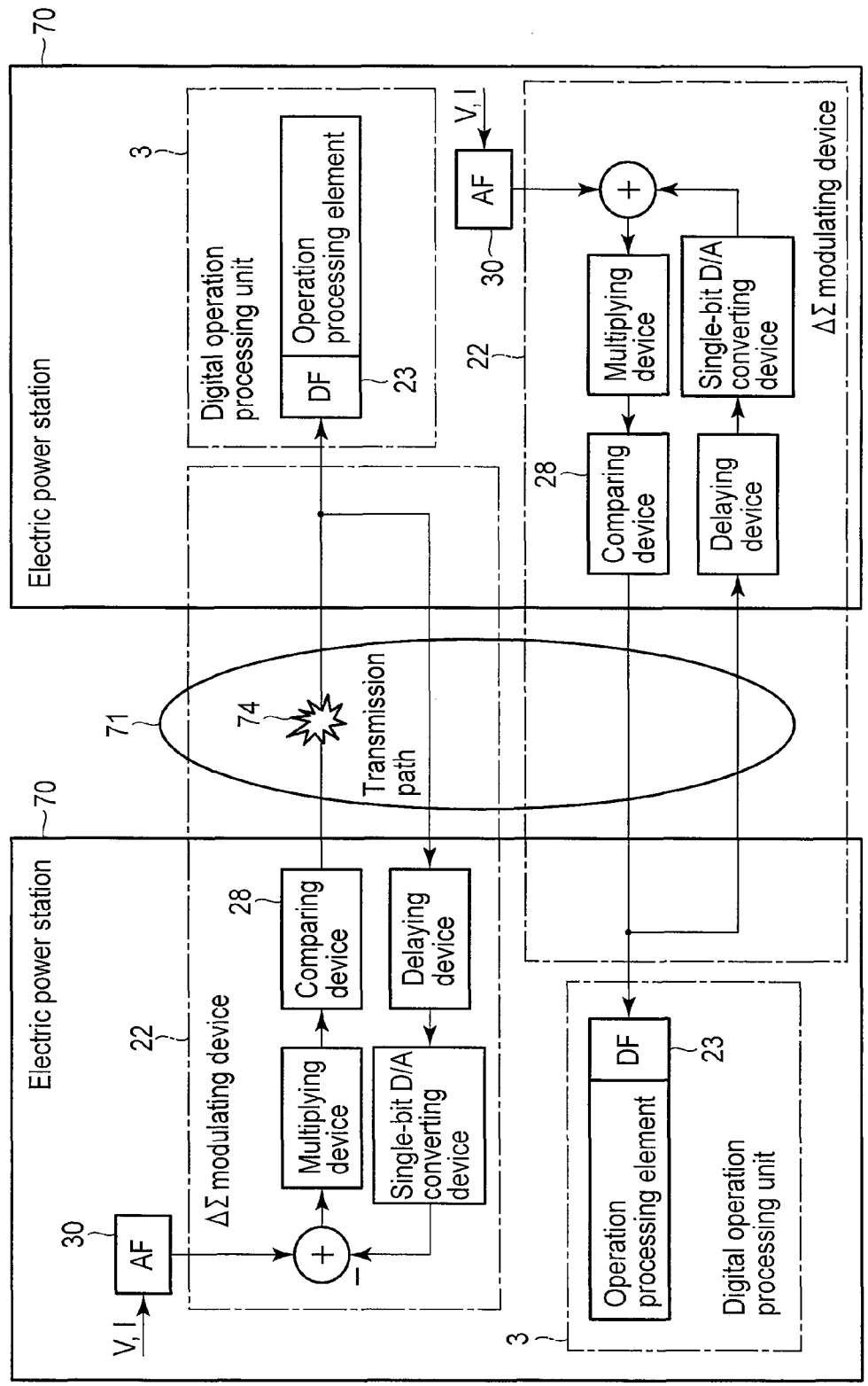
FIG. 46 is a configuration diagram illustrating a ΔΣ modulating device where the feedback loop of the ΔΣ modulating device passes through the transmission path, according to the embodiments of the present invention.
Figure 47:
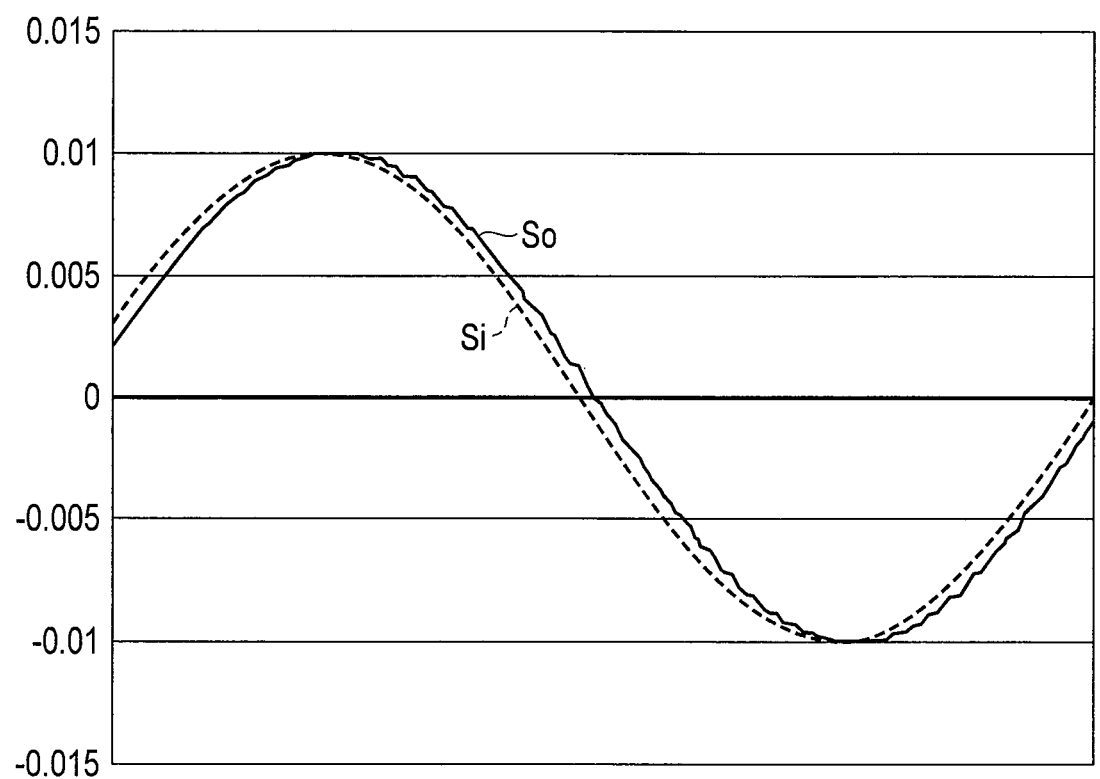
FIG. 47 is a waveform diagram of an output So of a digital filter and an input signal Si of the ΔΣ modulating device where the feedback loop of the ΔΣ modulating device passes through the transmission path, according to the embodiments of the present invention.

On the other hand, as illustrated in FIG. 46, when a garbled bit 74 occurs in the transmission path 71 where the feedback loop of the ΔΣ modulating device 22 passes through the transmission path 71, the digital filter 23 of the other electric power station 70 receives what has been changed from transmitted data by single bit, but this change is given as a negative feedback, which the ΔΣ modulating device 22 acts on to cancel this change. Therefore, as illustrated in FIG. 47, an influence caused by the garbled bit 74 does not appear in an output So of the digital filter 23 with respect to an input signal Si of the ΔΣ modulating device 22. It should be noted that FIGS. 45 and 47 are simulation results obtained by actually performing simulation.

As described above, when the feedback is not given through the transmission path 71 as illustrated in FIG. 44, it is understood that the influence caused by the garbled bit appears in the output as illustrated in FIG. 45. On the other hand, when the feedback is given through the transmission path 71 as illustrated in FIG. 46, no change of the output can be seen in the graph as illustrated in FIG. 47 even if the garbled bit 74 occurs in the transmission path 71. It should be noted that when data are garbled in a reception path of the transmission path 71, this effect cannot be expected.

In the tenth embodiment, the feedback loop of the ΔΣ modulating device 22 is configured to pass through the transmission path 71, and therefore, the transmission of the feedback signal is delayed. This transmission delay can be used as a function of the delaying device 28 of the ΔΣ modulating device 22. Therefore, it is not necessary to provide the delaying device 28, and the delaying device 28 can be eliminated. When there is a delay of two clocks or more in this case, the state of the ΔΣ modulating device 22 becomes unstable, and therefore, the delay is suppressed so that the delay is within one clock.

FIG. 48 is a configuration diagram illustrating an eleventh embodiment of a digital-type protection control apparatus according to the embodiments of the present invention. In contrast to the tenth embodiment as illustrated in FIG. 43, the eleventh embodiment is additionally provided with time adding means 75 that adds, to bit streams, information about a time at which a ΔΣ modulating device 22 of an analog/digital conversion unit 2 sampled an analog quantity.

As stated in the tenth embodiment, even if a partial garbled bit 74 occurs when a bit stream is transmitted from the ΔΣ modulating device 22, a transmission signal is not affected when the garbled bit 74 occurs within the feedback loop of the ΔΣ modulating device 22. Therefore, some bits can be changed to any values. In other words, this means that information, which is to be transmitted separately, can be added to the bit stream.

Accordingly, as illustrated in FIG. 48, an adding device 76 is provided within the feedback loop of the ΔΣ modulating device 22, and time information given by the time adding means 75 is added. Therefore, the time adding means 75 adds the time information, in an overlapping manner, to the bit stream which is output of the comparing device 28 of the ΔΣ modulating device 22 of the analog/digital conversion unit 2.

Figure 49:
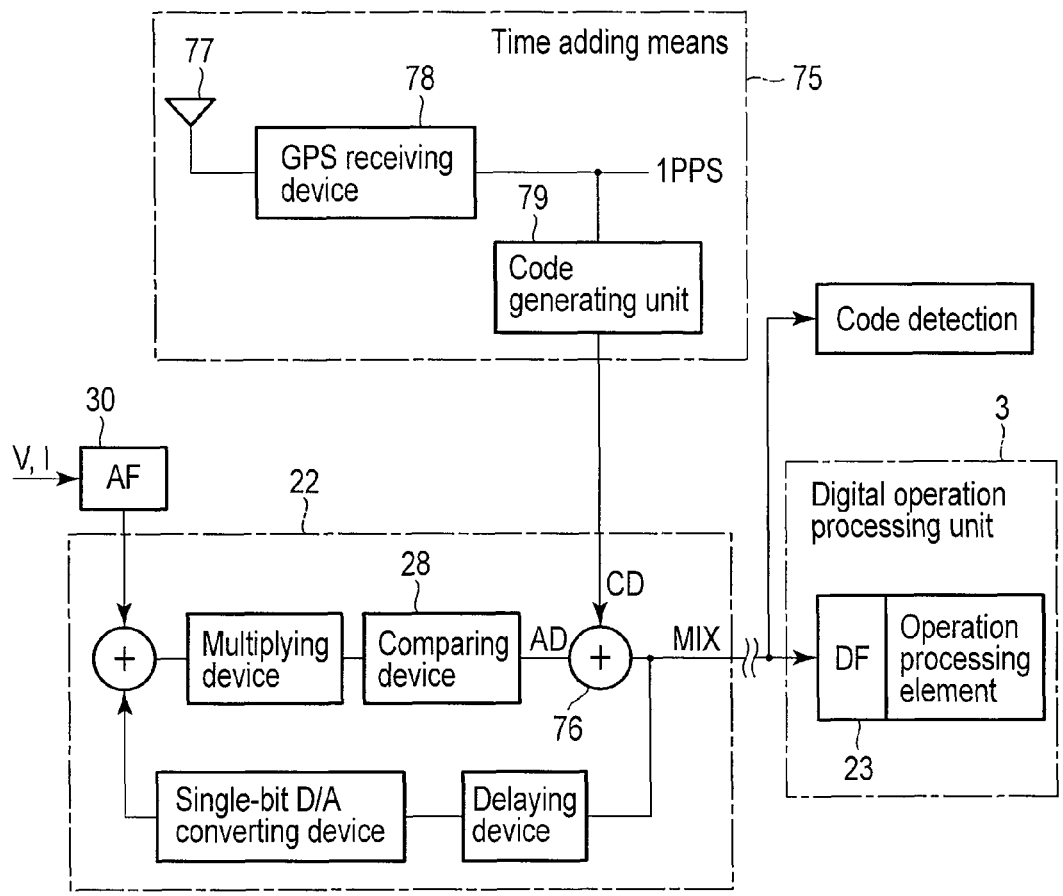
FIG. 49 is a configuration diagram illustrating time adding means of the eleventh embodiment of the present invention.
Figure 50:
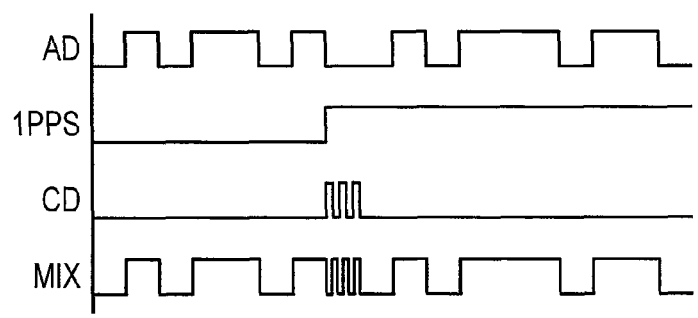
FIG. 50 is a waveform diagram illustrating a signal of each unit of a ΔΣ modulating device when a signal from time adding means in the eleventh embodiment of the present invention is input.

FIG. 49 is a configuration diagram illustrating the time adding means 75. FIG. 50 is a waveform diagram illustrating a signal of each unit of a ΔΣ modulating device 22 when a signal from time adding means 75 is input. The time adding means 75 receives a synchronization signal 1 PPS of absolute time from a GPS using a GPS receiving device 78 via an antenna, and inputs the synchronization signal 1 PPS to a code generating unit 79. The code generating unit 79 outputs a code signal CD corresponding to the synchronization signal 1 PPS of absolute time to the adding device 76. Accordingly, the code signal CD is added to a bit stream signal AD given by the comparing device 28, and a overlapped signal MIX is transmitted to the a digital operation processing unit 3. This time information is overlapped with a regular cycle, for example. In addition, the overlapped signal MIX is given to the delaying device as feedback.

FIGS. 51A to 51C are waveform diagrams illustrating original data of an output signal So of the digital filter (decimation filter) 23 and an input signal Si of the ΔΣ modulating device 22. FIGS. 51A to 51C illustrate a case where the digital filter (decimation filter) 23 performs 64-times moving average in three stages, and input is 1/100 of full scale so that change can be confirmed easily.

FIG. 51A is a waveform diagram illustrating original data of an output signal So of the digital filter 23 and an input signal Si of the ΔΣ modulating device 22. FIG. 515 is a waveform diagram illustrating an output signal So of the digital filter 23 and an input signal Si of the ΔΣ modulating device 22 when every 32 pieces of data in a bit stream are replaced with 1. When every 32 pieces of data in the bit stream are replaced with 1, no change can be seen in the output signal So of the digital filter 23. FIG. 51C is a waveform diagram illustrating the output signal So of the digital filter 23 and the input signal Si of the ΔΣ modulating device 22 when every 8 pieces of data in a bit stream are replaced with 1. When every 8 pieces of data in the bit stream are replaced with 1, a change can be seen in the output signal So of the digital filter 23, but the amplitude of the sine wave appears unaffected.

Therefore, bit stream time information can be added with an interval of 8 pieces or more. When the time information is added, it is useful for a protection relay method in which it is necessary to compare data at the same time at distant locations in the electric power system, and it is useful for finding phenomena over a wide region of an electric power system.

In this case, FIG. 45 illustrates an influence of the garbled bit 74, but in order to exaggerate a change of the signal, the value of the input signal is set at a small value. Actually, it can be said that the bit stream provided by the ΔΣ modulating device 22 is less affected by transmission errors as compared with multi-bit data. In a case of the ΔΣ modulation, information is represented by a stream of many bits.

Figures 52, 53, 54:
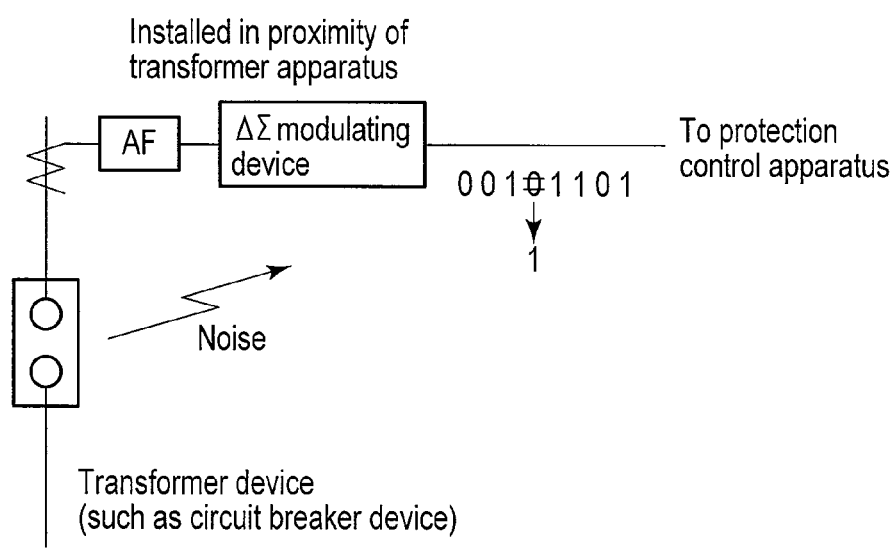
FIG. 52 is an explanatory diagram illustrating the influence of a data error when a decimation filter of 32 moving-average is used as a digital filter.
FIG. 53 is an explanatory diagram of the influence of a data error when a successive approximation A/D conversion device is used.
FIG. 54 is an explanatory diagram illustrating the influence of a data error when an analog/digital conversion unit is installed in a transformer substation according to the embodiments of the present invention.
Figure 55:
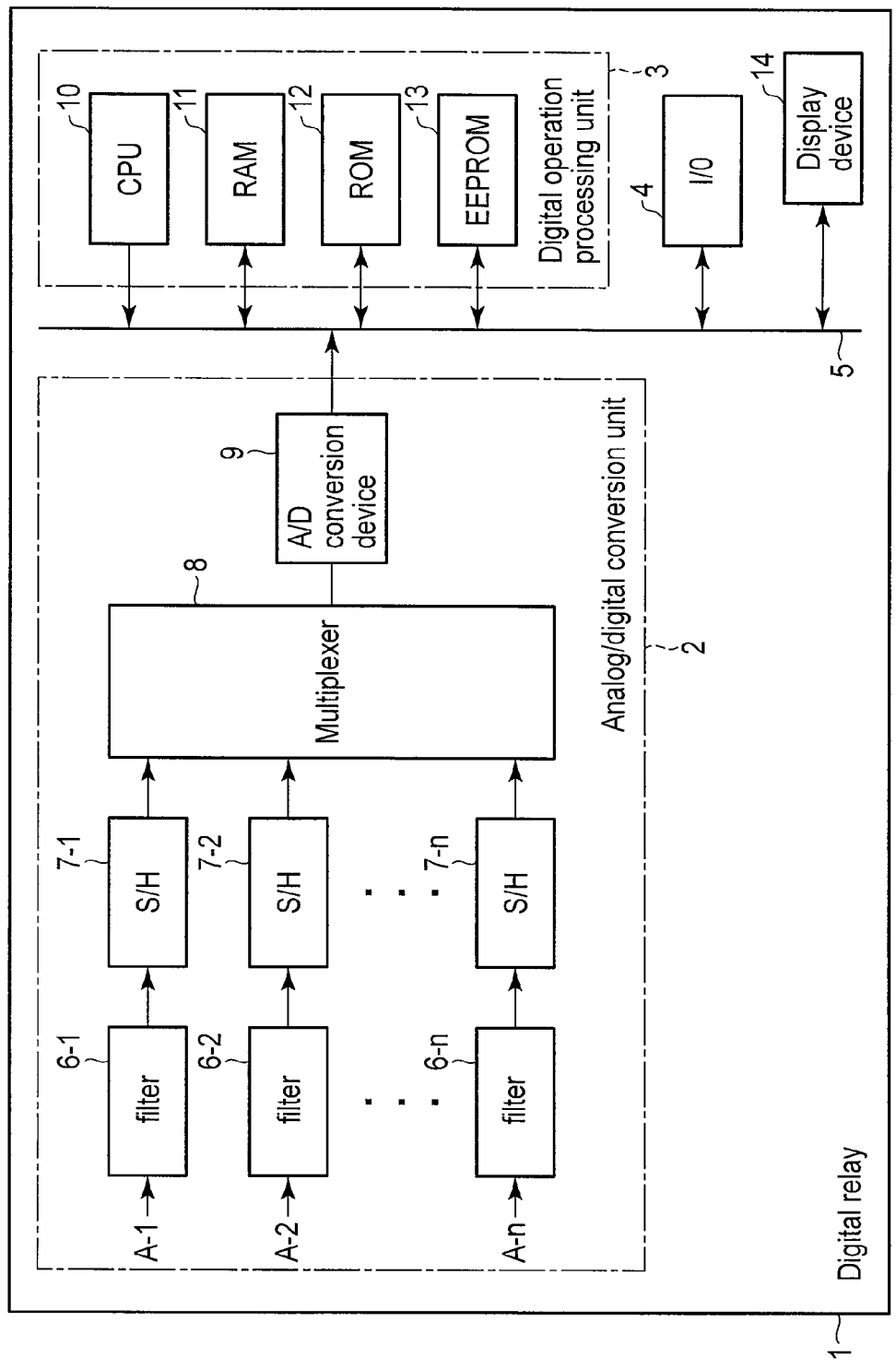
FIG. 55 is a configuration diagram illustrating an example of a digital relay which is an example of a conventional digital-type protection control apparatus.
Figure 56:
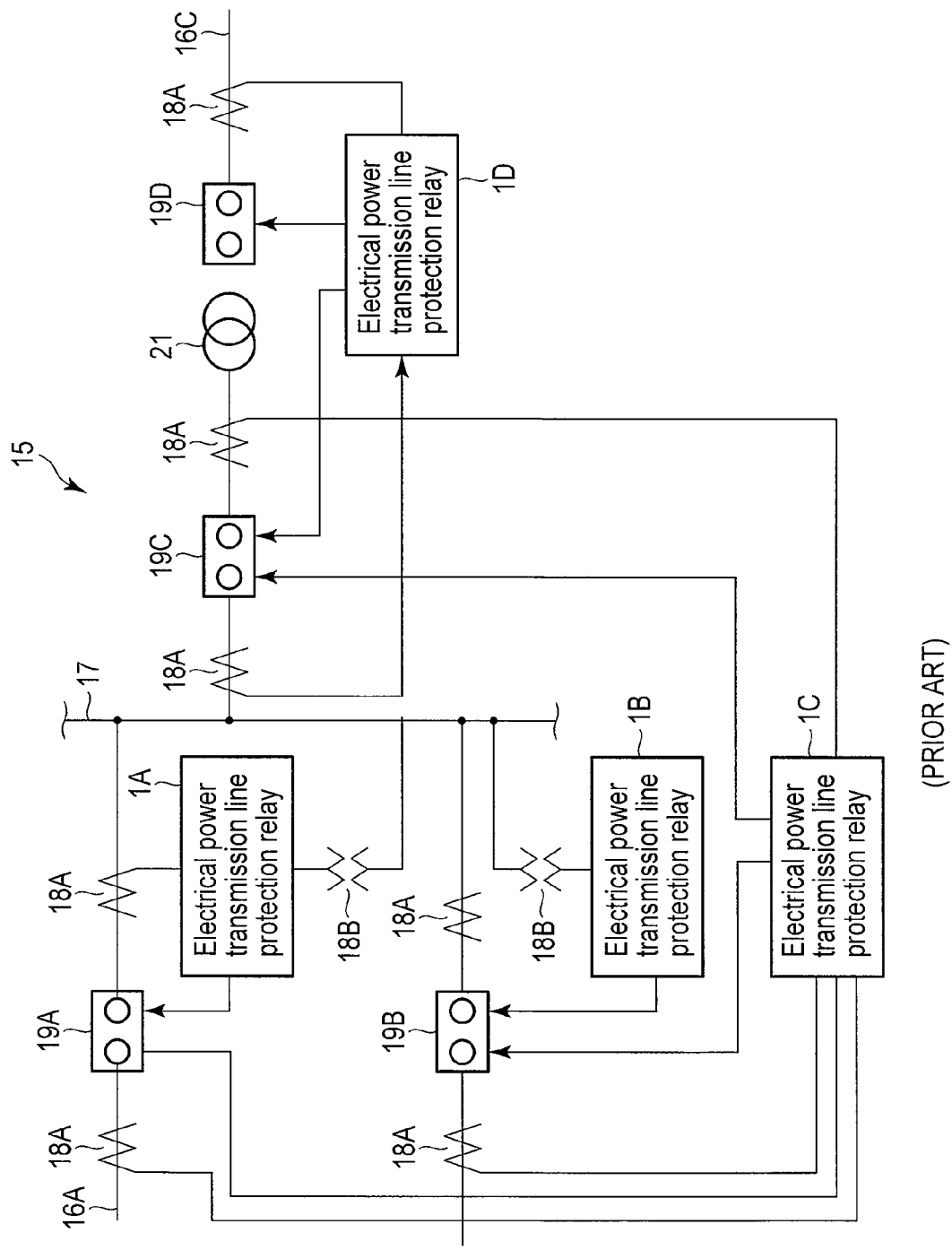
FIG. 56 is a configuration diagram when a digital protection control apparatus (digital relay) is arranged in equipment such as an electrical power transmission line and a bus wire of an electric power system.

For example, when a decimation filter of 32-times moving average is used as a digital filter for a bit stream, one garbled bit only causes a 1/32 influence as illustrated in FIG. 52. On the other hand, in a case of multi-bit data which are output from a successive approximation A/D conversion device, garbled data in the most significant as illustrated in FIG. 53 causes a great change in the data.

In a next-generation digital transformer substation system, it is assumed that an analog/digital conversion unit 2 is installed in the proximity of a transformer apparatus as illustrated in FIG. 54. In this configuration, there is less influence caused even when a bit stream transmitted from a ΔΣ modulating device 22 to a digital operation processing unit 3 is changed by noise as described above, and therefore, a highly-reliable system can be made.

As described above in detail, according to the above embodiments, the ΔΣ modulating device providing wideband information with a high degree of accuracy is used as the A/D conversion method, and the information can be output to various kinds of digital operation processing units without losing information provided by the ΔΣ modulating devices. Therefore, the A/D conversion data applicable to various kinds of digital operation processing can be easily obtained with a high degree of accuracy.

The present invention is not limited to the above embodiments as they are, and in the stage of carrying out the present invention, constituent elements can be changed and embodied without deviating from the gist of the present invention. Various kinds of invention can be formed by an appropriate combination of multiple constituent elements disclosed in the above embodiments. For example, several constituent elements may be deleted from all the constituent elements illustrated in an embodiment. Further, constituent elements in different embodiments may be combined as necessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A control system comprising:
   an analog/digital conversion unit which introduces an analog electric quantity provided from an electric power system and converts the analog electric quantity into a digital quantity; and
   a digital operation processing unit which performs protection control operation regarding a state of the electric power system using the digital quantity,
   wherein the analog/digital conversion unit includes a ΔΣ modulating device which samples the analog electric quantity provided by the electric power system with a predetermined modulation frequency and outputs a bit stream changing over time of single bit obtained by performing ΔΣ modulation, and the digital operation processing unit includes a plurality of digital filters each of which inputs the bit stream from the ΔΣ modulating device and of which frequency characteristics differ according to a type of protection control operation, and a plurality of operation processing elements each of which is connected to a respective digital filter and which perform different kinds of protection control operation processing regarding protection control, based on the bit stream provided by the respective digital filter.

2. The control system according to claim 1, wherein each digital filter of the digital operation processing unit outputs data of different sampling cycles for the protection control operation processing of the protection operation processing elements, and includes processing for performing moving average in a same period as an ultimate output data cycle of the digital filter or a period longer than the ultimate output data cycle of the digital filter.

3. The control system according to claim 2, wherein the moving average processing of the digital filter includes first stage moving average processing and decimation processing, and subsequent second stage moving average processing and decimation processing which is processing into an ultimate sampling cycle, and the first stage moving average processing includes a combination of moving averages of two different types of tap lengths, and the first stage moving average processing includes processing for performing moving average in a same period as the ultimate sampling cycle or a period longer than the ultimate sampling cycle.

4. The control system according to claim 1, wherein each digital filter of the digital operation processing unit has a multi-stage configuration, in which the first stage uses moving average processing and the second stage uses an FIR or IIR type digital filter, and moving average of 32 taps or more is used in the moving average processing.

5. The control system according to claim 1, wherein in the first stage of each digital filter of the digital operation processing unit, single-bit digital filter is used, and a signal pass band of the single-bit digital filter is less than ½ of the ultimate output frequency of the digital filter, which is a Nyquist frequency, and in the second stage of the single-bit digital filter, moving average processing is used, and with moving average, data are decimated and output as digital data having multiple bits.

6. The control system according to claim 2, wherein an output cycle of each digital filter of the digital operation processing unit is any one of electrical angles of 30 degrees, 15 degrees, 7.5 degrees, and 3.75 degrees.

7. The control system according to claim 2, wherein at least one digital filter of the digital operation processing unit is constituted using a programmable logic device made of an FPGA or a CPLD.

8. The control system according to claim 1, wherein the analog/digital conversion unit and some of the digital operation processing units are arranged in the same apparatus, and the other digital operation processing units are arranged outside of the apparatus, and an output unit is provided that outputs the bit streams from the ΔΣ modulating devices to the external digital operation processing units as an electrical signal or an optical signal.

9. The control system according to claim 1, wherein the analog/digital conversion unit and the digital operation processing unit are configured as separate apparatuses, and the bit stream is transmitted via a dedicated cable from the ΔΣ modulating device of the analog/digital conversion unit to the digital operation processing unit.

10. The control system according to claim 1, wherein the analog/digital conversion unit and the digital operation processing unit are configured as separate apparatuses, and the bit stream is transmitted via a network from the ΔΣ modulating device of the analog/digital conversion unit to the digital operation processing unit.

11. The control system according to claim 10, wherein a data combining unit is provided that combines bit streams provided by the ΔΣ modulations of the plurality of analog/digital conversion units to make the bit streams into transmission frames in units of bytes, and then transmits the transmission frames to a network.

12. The control system according to claim 8, wherein a gain correcting unit is provided that performs multiplying processing on the bit stream provided by the ΔΣ modulating device of the analog/digital conversion unit with multiplying processing of a gain correction value defined in advance with coefficient multiplying processing with single-bit digital processing, and outputs the bit stream, the gain of which has been corrected, to the digital operation processing unit.

13. The control system according to claim 8, wherein a phase correction unit is provided that performs bit stream delaying processing on the bit stream provided by the ΔΣ modulating device of the analog/digital conversion unit with a phase correction value defined in advance, and outputs the bit stream, the phase of which has been corrected, to the digital operation processing unit.

14. The control system according to claim 9, wherein the analog/digital conversion unit and the digital operation processing unit are connected via a transmission path, and the bit stream provided by the ΔΣ modulating device of the analog/digital conversion unit is distributed to the digital operation processing unit, so that electrical power transmission line protection, bus wire protection, and apparatus protection are made.

15. The control system according to claim 9, wherein the analog/digital conversion unit and the digital operation processing unit are installed at both-end transformer substations of an electrical power transmission line, and the bit streams provided by the ΔΣ modulating devices of the analog/digital conversion units installed at the both-end transformer substations of the electrical power transmission line are transmitted via a transmission path to the digital operation processing units of the other transformer substations, and differential calculation is performed, and when a current difference is more than a predetermined value, an internal accident of the electrical power transmission line is detected.

16. The control system according to claim 9, wherein a terminal apparatus comprises the analog/digital conversion unit and the digital operation processing unit is connected via a transmission path to a server performing protection control operation and system phenomenon analysis over a wide region of the electric power system using the bit stream provided by the ΔΣ modulating device of the analog/digital conversion unit.

17. The control system according to claim 15, wherein the ΔΣ modulating device of the analog/digital conversion unit constitutes a feedback loop including the transmission path connecting the both-end transformer substations of the electrical power transmission line.

18. The control system according to claim 17, wherein the ΔΣ modulating device of the analog/digital conversion unit uses, as a delaying device within the feedback loop, a transmission delay due to the transmission path connecting the both-end transformer substations of the electrical power transmission line.

19. The control system according to claim 10, wherein a time adding unit is provided that adds, to a bit stream, information about a time at which the ΔΣ modulating device of the analog/digital conversion unit sampled the analog quantity.

20. The control system according to claim 19, wherein the time adding unit adopts an absolute time obtained from a GPS as the time information.

21. The control system according to claim 19, wherein the time adding unit overlaps the time information onto the bit stream, which is an output of a comparing device of the ΔΣ modulating device of the analog/digital conversion unit, and gives it to the ΔΣ modulating device as feedback.

22. The control system according to claim 1, wherein a bit stream storage unit is provided that records the bit stream provided by the ΔΣ modulating device when a predetermined condition is satisfied.

23. The control system according to claim 22, wherein the predetermined condition for starting recording of the bit stream storage unit is a condition that it is a time which is set in advance or a condition that the digital operation processing unit detects occurrence of an accident of the electric power system.

24. The control system according to claim 22, wherein the bit stream storage unit is made with a hard disk or a flash memory.

25. The control system according to claim 22, wherein the bit stream storage unit is connected to a network, and the bit stream recorded in the bit stream storage unit is transmitted to a terminal apparatus via a network.

26. The control system according to claim 22, wherein the bit stream storage unit is provided within the analog/digital conversion unit.

* * * * *